(12) United States Patent
Ives et al.

(10) Patent No.: US 11,855,119 B2
(45) Date of Patent: Dec. 26, 2023

(54) INTEGRATED ELECTRONIC-PHOTONIC DEVICES, SYSTEMS AND METHODS OF MAKING THEREOF

(71) Applicant: California Institute of Technology, Pasadena, CA (US)

(72) Inventors: Craig E Ives, Pasadena, CA (US); Seyed Mohammadreza Fatemi, Pasadena, CA (US); Aroutin Khachaturian, Pasadena, CA (US); Seyed Ali Hajimiri, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 605 days.

(21) Appl. No.: 17/039,741

(22) Filed: Sep. 30, 2020

(65) Prior Publication Data

US 2021/0175276 A1    Jun. 10, 2021

Related U.S. Application Data

(60) Provisional application No. 62/907,969, filed on Sep. 30, 2019.

(51) Int. Cl.
*G02B 6/136* (2006.01)
*H01L 27/146* (2006.01)
(Continued)

(52) U.S. Cl.
CPC ........ *H01L 27/14685* (2013.01); *G02B 6/124* (2013.01); *G02B 6/1228* (2013.01); *G02B 6/136* (2013.01); *G02B 2006/12107* (2013.01)

(58) Field of Classification Search
CPC ................. G02B 6/136; H05K 2201/0338
See application file for complete search history.

(56) References Cited

U.S. PATENT DOCUMENTS 5,698,299 A * 12/1997 Schmidt ................. B01D 69/12
                                                              428/209
7,456,039 B1    11/2008 Kawasaki et al.
(Continued)

FOREIGN PATENT DOCUMENTS

WO    WO-2009113961 A1    9/2009

OTHER PUBLICATIONS

WIPO Application No. PCT/US2020/05632, PCT International Search Report and Written Opinion of the International Searching Authority dated Feb. 5, 2021.
(Continued)

*Primary Examiner* — Charlie Y Peng
(74) *Attorney, Agent, or Firm* — Weaver Austin Villeneuve & Sampson LLP

(57) ABSTRACT

A method of fabricating a photonic device includes in part, forming a multitude of metal and dielectric layers over a semiconductor substrate to form a structure. The metal layers form a continuous metal trace that characterize an etch channel. At least one of the metal layers extends towards an exterior surface of the structure such that when the structure is exposed to a metal etch, the metal etch removes the metal from the exterior surface of the structure and flows through the etch channel to fully etch the metal layers. The metal etch leaves behind a dielectric structure characterizing a photonic device. The photonic device may be a suspended rib waveguide, a suspended channel waveguide, a grating coupler, an interlayer coupler, a photodetector, a phase modulator, an edge coupler, and the like. A photonics system may include one or more of such devices.

20 Claims, 37 Drawing Sheets

(51) Int. Cl.
G02B 6/122 (2006.01)
G02B 6/124 (2006.01)
G02B 6/12 (2006.01)

(56) References Cited

U.S. PATENT DOCUMENTS

| | | |
|---|---|---|
| 9,941,136 B1 * | 4/2018 | Ptasinski .................. G02B 6/132 |
| 2007/0093045 A1 | 4/2007 | Yamaguchi et al. |
| 2010/0084371 A1 | 4/2010 | Walker et al. |
| 2015/0185415 A1 | 7/2015 | Zinoviev et al. |
| 2016/0211390 A1 | 7/2016 | Chen et al. |
| 2017/0068051 A1 | 3/2017 | Watanuki et al. |

OTHER PUBLICATIONS

EP Extended European Search report dated Sep. 15, 2023, in Application No. EP20870491.6.

* cited by examiner

INTEGRATED ELECTRONIC-PHOTONIC DEVICES, SYSTEMS AND METHODS OF MAKING THEREOF

CROSS REFERENCE TO RELATED APPLICATIONS

The present application claims benefit under 35 USC 119(e) of Application Ser. No. 62/907,969, filed Sep. 30, 2019, the content of which is incorporated herein by reference in its entirety.

FIELD OF THE INVENTION

The present invention relates to opto-electronic and photonic devices, and more particularly to methods for making such devices.

BACKGROUND OF THE INVENTION

Conventional silicon integrated photonic systems often use silicon-on-insulator (SOI) technology for fabrication. The SOI technology may be a dedicated photonics process, an RFSOI process adapted for photonics, or a bulk CMOS process modified to include a buried oxide layer (BOX). The BOX separates a thin crystalline silicon layer from the rest of the wafer. Waveguides and other devices are formed within the thin silicon layer since the silicon has a high index contrast with the surrounding oxide. The BOX isolates the components and prevents optical power from leaking into the silicon substrate. A need continues to exist for an improved method of fabricating photonic devices.

SUMMARY OF THE INVENTION

A method of fabricating a photonic device, in accordance with one embodiment of the present invention, includes in part, forming a multitude of metal layers, and dielectric layers over a semiconductor substrate to form a structure. The metal layers form a continuous metal trace that characterize an etch channel. At least one of the metal layers extends towards an exterior surface of the structure such that when the structure is exposed to a metal etch, the metal etch removes the metal from the exterior surface of the structure and flows through the etch channel to fully etch the metal layers. The metal etch leaves behind a dielectric that characterizes the photonic device. The photonic device may be a suspended rib waveguide, a suspended channel waveguide, a grating coupler, an interlayer coupler, a photodetector, a phase modulator, an edge coupler, and the like, or a system that includes the aforementioned devices.

In one embodiment, the dielectric includes, in part, first and second dielectric walls extending along a length of the photonic device, and a multitude of dielectric ribs each having a first width and each connecting the first dielectric wall to the second dielectric wall at a different location along the length of the photonic device. A center region of each rib has a second width that is greater than the first width.

In one embodiment, the method further includes, in part, injecting one or more materials in the openings formed as a result of the metal etch. In one embodiment, the width and the height of each ruler of the grating coupler, as well as the spacing between rulers, are selected in accordance with the wavelength of an optical signal propagating through the grating coupler, or selected in accordance with a desired angle of free space coupling. In one embodiment, the spacing between a pair of adjacent grating couplers is selected in accordance with the wavelength of an optical signal propagating through the grating couplers.

In one embodiment, the dielectric includes, in part, a first waveguide tapered along a first direction, and a second waveguide tapered along a second direction opposite the first direction. The optical signal propagating through the first waveguide couples to the second waveguide. In one embodiment, the dielectric is formed directly above a doped region of the semiconductor substrate and includes, in part, first and second waveguide. The optical signal propagating through the first waveguide is received by the doped region of the semiconductor substrate through the second waveguide.

In one embodiment, the method further includes, in part, forming a first electrode over a first portion of the dielectric, and forming a second electrode over a second portion of the dielectric. By controlling the difference between the voltages applied to the first and second electrodes the phase of the optical signal propagating through the dielectric may be shifted. In one embodiment, a portion of the dielectric defines a cleave line.

In one embodiment, the exterior surface is an upper surface. In another embodiment, the exterior surface is a side surface. In one embodiment, the metal etchant is a liquid etchant. In another embodiment, the metal etchant is a gas etchant. In yet another embodiment, the metal etchant is a plasma etchant. In one embodiment, the substrate is a silicon substrate. In one embodiment, the photonic device is disposed in a phased array. In one embodiment, the photonic device is disposed in a CMOS image sensor.

DETAILED DESCRIPTION OF THE INVENTION

In accordance with embodiments of the present invention, various methods and techniques for fabricating both single layer and/or multi-layer photonic devices and systems such as multi-layer suspended structures, multi-layer waveguides, hybrid photonic and electronic structures, power splitters, grating couplers, phase shifters, modulators, and the like, are disclosed. In accordance with one such method, metal-dielectric structures are first formed on a wafer or substrate. Thereafter, some or all of the metal or dielectric material are removed to form the desired devices and systems. In some embodiments, further fabrication steps are performed to include additional material to fill the empty spaces created as a result of the removal. In one embodiment, a CMOS process with multiple metal layers may be used to fabricate such photonic structures. Furthermore, electronic devices, such as transistors, may also be formed using the same process so as to fabricate hybrid electronic-photonic devices. Photonic and hybrid electronic-photonic devices are collectively and alternatively referred to herein as devices. A metal layer is understood to refer to an interconnect layer of an electronic or photonic chip that enables lateral connections between devices and other interconnect layers, or between various interconnect layers.

As described above, in one embodiment, a photonic or an opto-electronics device/system, is fabricated, in part, by first forming a metal/dielectric structure and subsequently removing part of the metal/dielectric structure. In some embodiments, additional material is added to the structure to form the device.

As is known, a semiconductor manufacturing process often includes multiple layers of metals and dielectrics. In accordance with embodiments of the present invention, such layers are used to form a photonic device, as described further below.

Figure 1A:
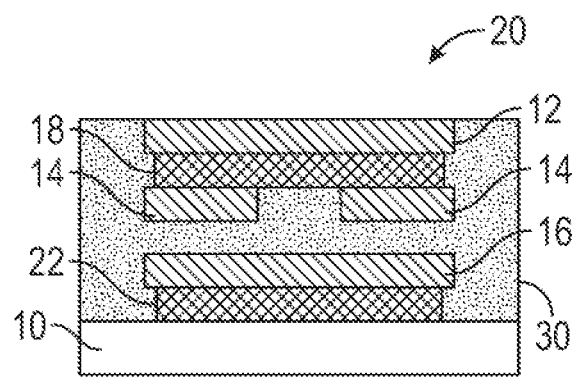
FIGS. 1A and 1B are cross-sectional views of waveguide prior to and after a metal etch, in accordance with one embodiment of the present invention.

FIG. 1A is a cross-sectional view a device structure 20 formed over semiconductor substrate 10, which may be a silicon substrate. Structure 20 is shown as including, in part, metal layers 12, 14 and 16 that are deposited and patterned using conventional metallization and patterning steps. Metal layers 12 and 14 are coupled to one another through via 18. Metal layer 16 is coupled to substrate 10 through via 22. The remaining portions of structure 20 is filled with dielectric 30 that is deposited and patterned using well known dielectric deposition and patterning techniques. It is understood that each metal layer may have one or more types of metal, and that each dielectric layer may have one or more types of dielectric. A via is understood to refer to an interconnect layer of an electronic or photonic chip that enables vertical connections between devices and other interconnect layers, or between various interconnect layers.

Figure 1B:
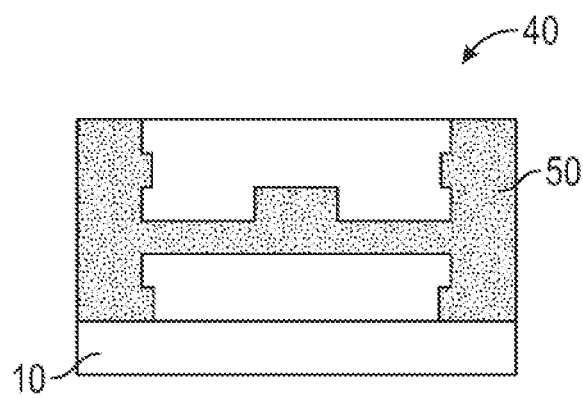
Figure 13:
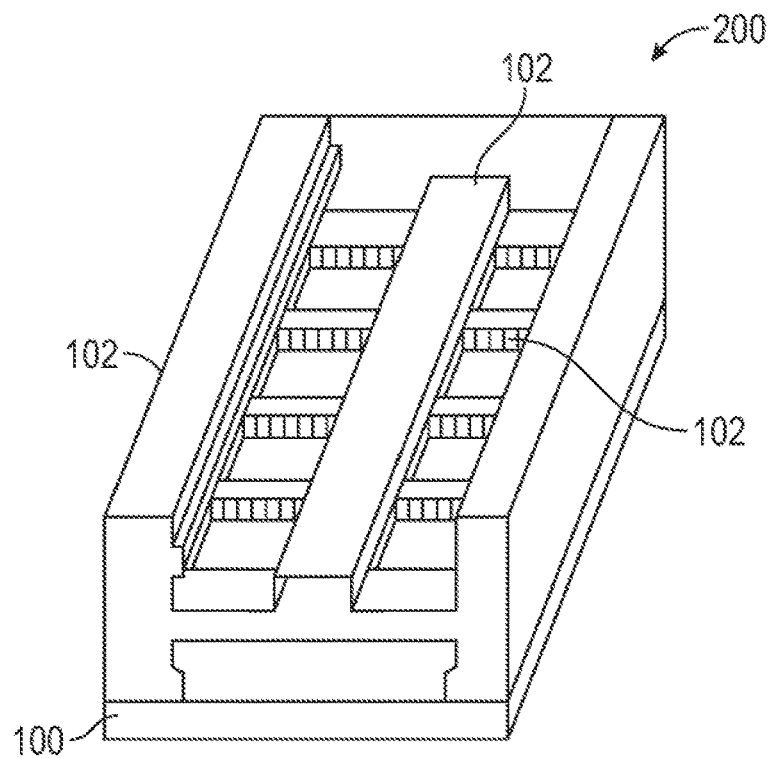
FIG. 13 is a perspective view of a channel waveguide having a cross-sectional view as shown in FIG. 12, in accordance with one embodiment of the present invention.

Next, a metal etch is used to etch away the various metal layers and vias to form the device structure 40 shown in FIG. 1B. Device structure 40 is a rib waveguide with a perspective view as shown in FIG. 13. As is seen, a pattern of metals in dielectrics or dielectrics in metals may be formed that define the photonic device. Various fabrication processes, such as deposition, growth, etching, and lift-off may be used to from the structure. The fabrication process may be a CMOS fabrication process. It is understood that any number of metals may be used, which may be etched selectively at various rates or deposited in various locations to facilitate the design and fabrication of the photonic structures. It is also understood that any number of dielectrics may be used, which may be etched selectively at various rates or deposited in various locations to facilitate the design and fabrication of photonic structures.

Figure 2A:
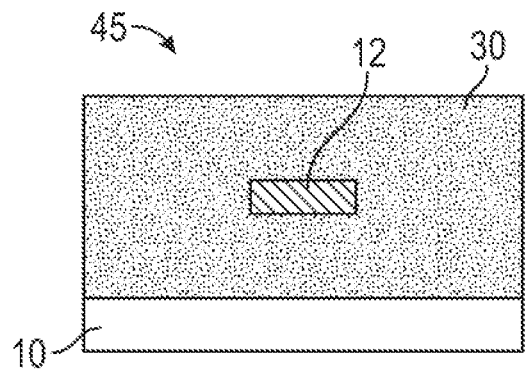
FIGS. 2A and 2B are cross-sectional views of a slot waveguide prior to and after a metal etch, in accordance with one embodiment of the present invention.
Figure 2B:
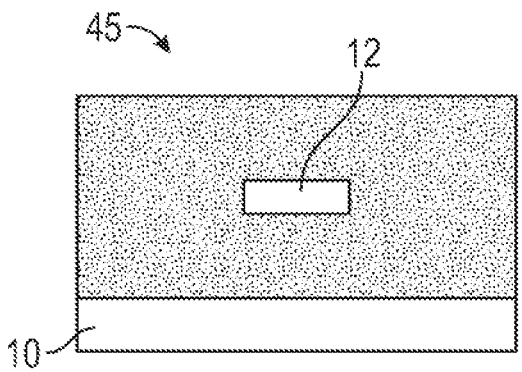

FIG. 2A is a cross-sectional view of a structure 45 formed above substrate 10, in accordance with one embodiment of the present invention. Structure 45 includes a metal layer 12 encased within dielectric 30. Structure 45 is formed using standard metal and dielectric deposition and patterning steps, described further below. Next, a metal etch is used to remove metal 12. The opening left by the removal of metal 12 may be subsequently filled with a high index dielectric to form a slot waveguide, a cross section of which is shown in FIG. 2B.

Figure 3A:
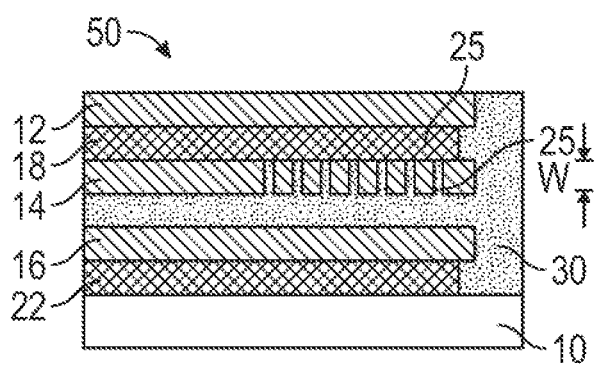
FIGS. 3A and 3B are cross-sectional views of a grating coupler prior to and after a metal etch, in accordance with one embodiment of the present invention.
Figure 3B:
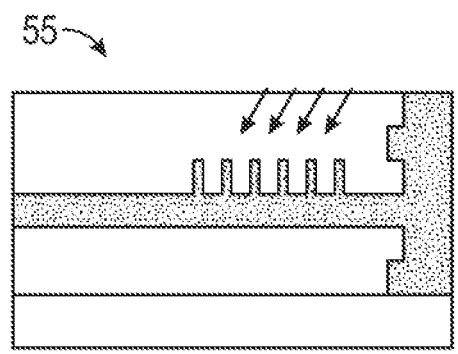

FIG. 3A is a cross-sectional view a device structure 50 formed over semiconductor substrate 10, in accordance with one embodiment of the present invention. Structure 50 is shown as including, in part, metal layers 12, 14 and 16 that are deposited and patterned. Metal layers 12 and 14 are coupled to one another through via 18. Metal layer 16 is coupled to substrate 10 through via 22. As is seen, metal layer 14 has been patterned to include a multitude of openings 25 extending through the entire width w of metal layer 14. As is seen openings 25 are filled with dielectric 30 that is deposited and patterned using standard dielectric deposition and patterning techniques. Next, a metal etch is used to etch away the various metal layers and vias to form grating coupler 55 as shown in FIG. 3B. More detailed description of the processes used to form a device, in accordance with embodiments of the present invention, is described below.

Suspended Rib Waveguide

To form a suspended rib waveguide, in accordance with one embodiment of the present invention, a dielectric material, such as silicon oxide or silicon nitride is formed above a semiconductor substrate. The following description of the embodiments of the present invention are provided with reference to a silicon substrate. It is understood however that embodiments of the present invention are not so limited and may use any other semiconductor substrate.

Figure 4A:
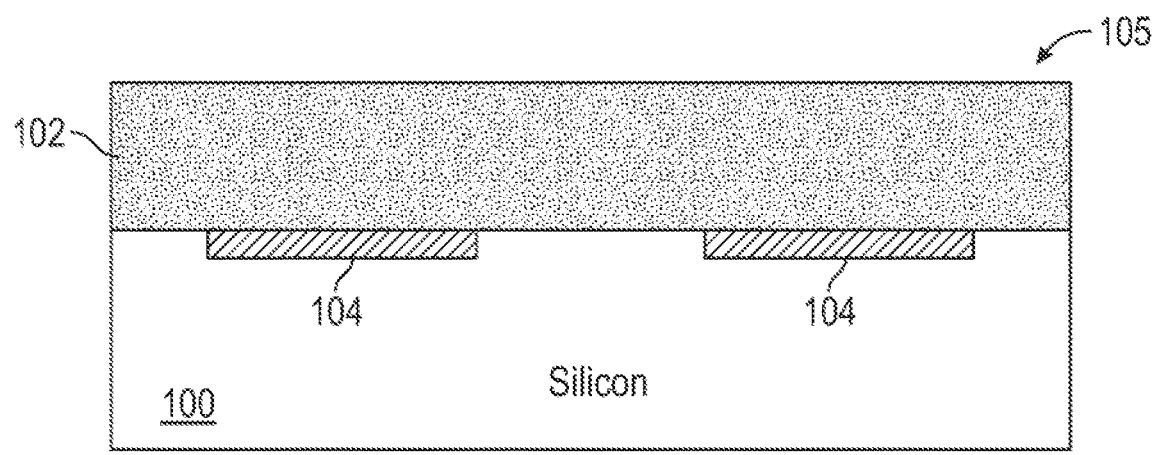
FIGS. 4A-4I are cross sectional views of a device structure after performing different fabrication processing steps.
Figure 4B:
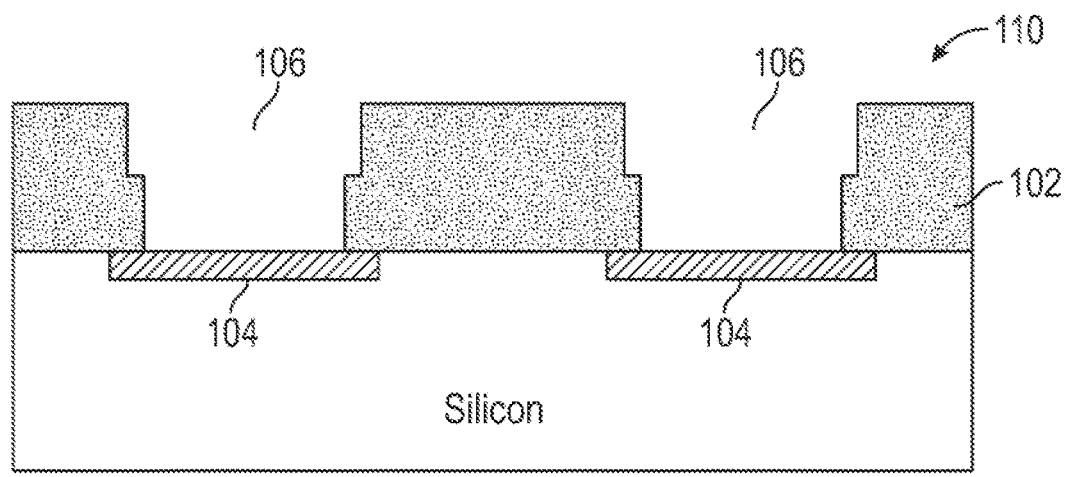
Figure 4C:
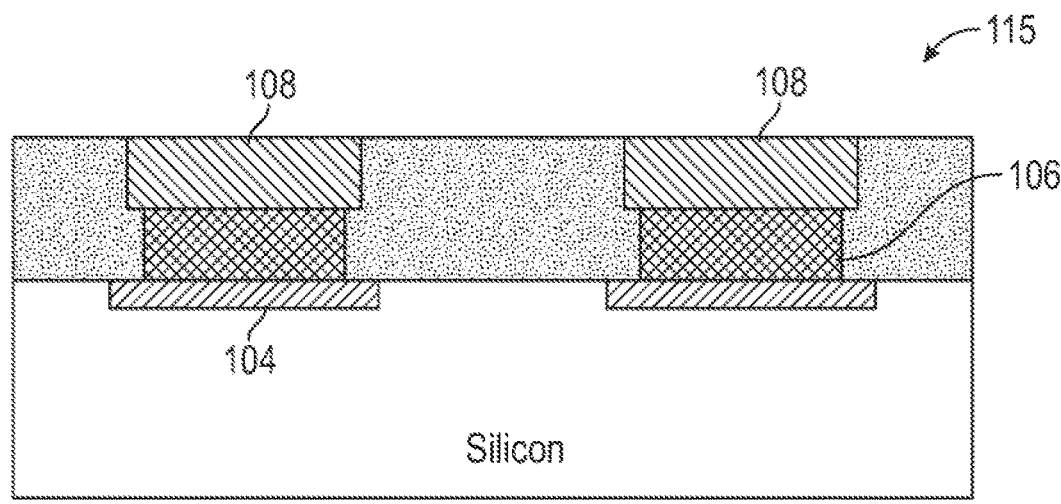

FIG. 4A shows a dielectric layer 102 formed above the surface of silicon substrate (e.g., silicon wafer) 100. Also shown in FIG. 4A are optionally doped N+ or P+ active regions to facilitate the formation of active devices, such as transistors, when so desired. Next, as shown in FIG. 4B, openings 106 are formed in dielectric 102 above active regions 104 using conventional etching steps to form device structure 110. Next, during a metallization process, such as a dual damascene process shown in FIGS. 4A-4I a layer of metal is deposited on structure 110, which layer includes both the via layers and metal layers of a standard dual damascene process, thus causing openings 106 to be filled with metal 108. Following standard planarization steps, device structure 115 is formed, as shown in FIG. 4C. For clarity, in the figures, the vias are shown with a fill pattern that is different from that used to show the metal layers. It is understood however that the vias may be filled with the same metal that overlays the vias even if not explicitly shown as such.

Figure 4D:
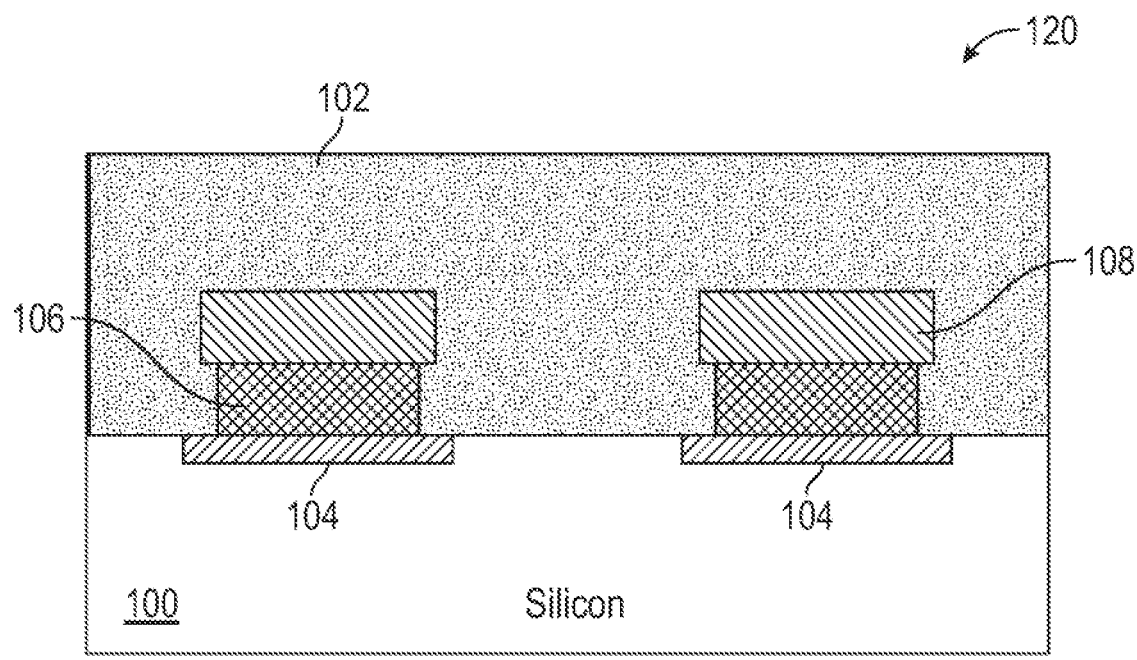
Figure 4E:
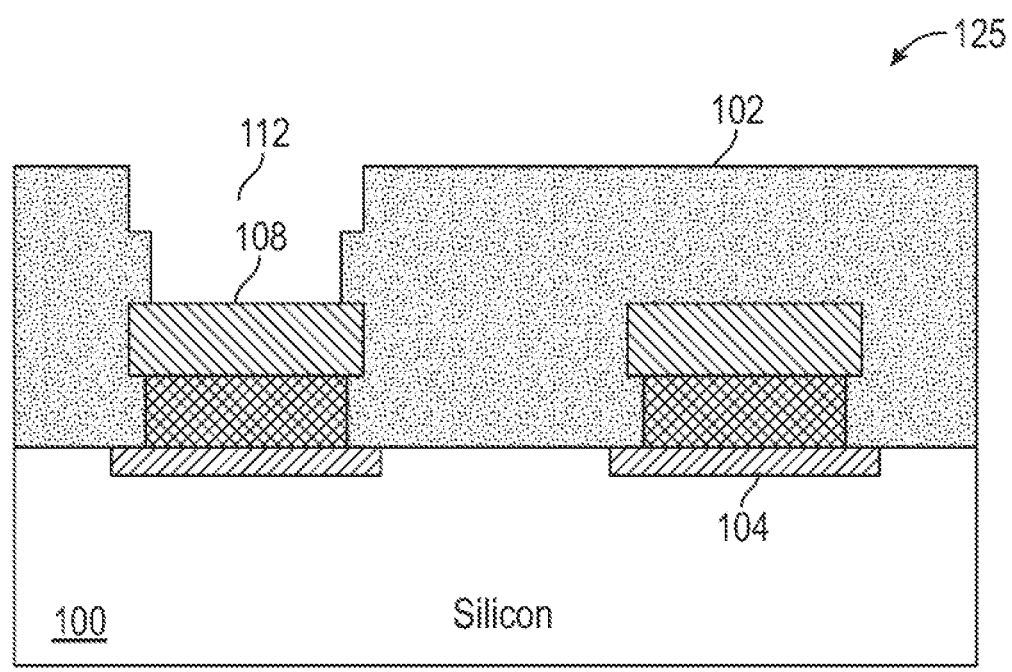
Figure 4F:
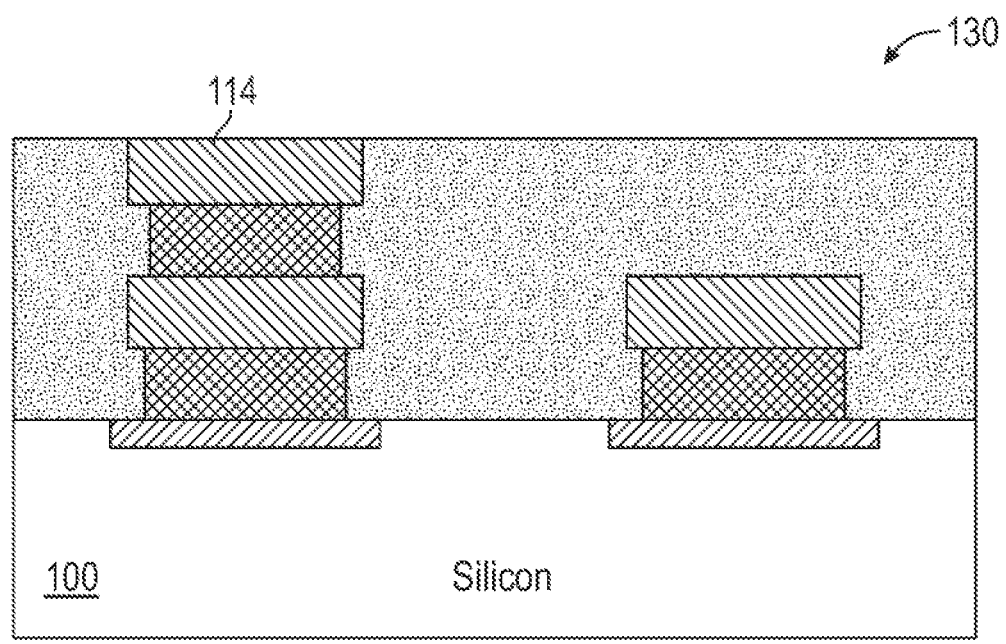
Figure 4G:
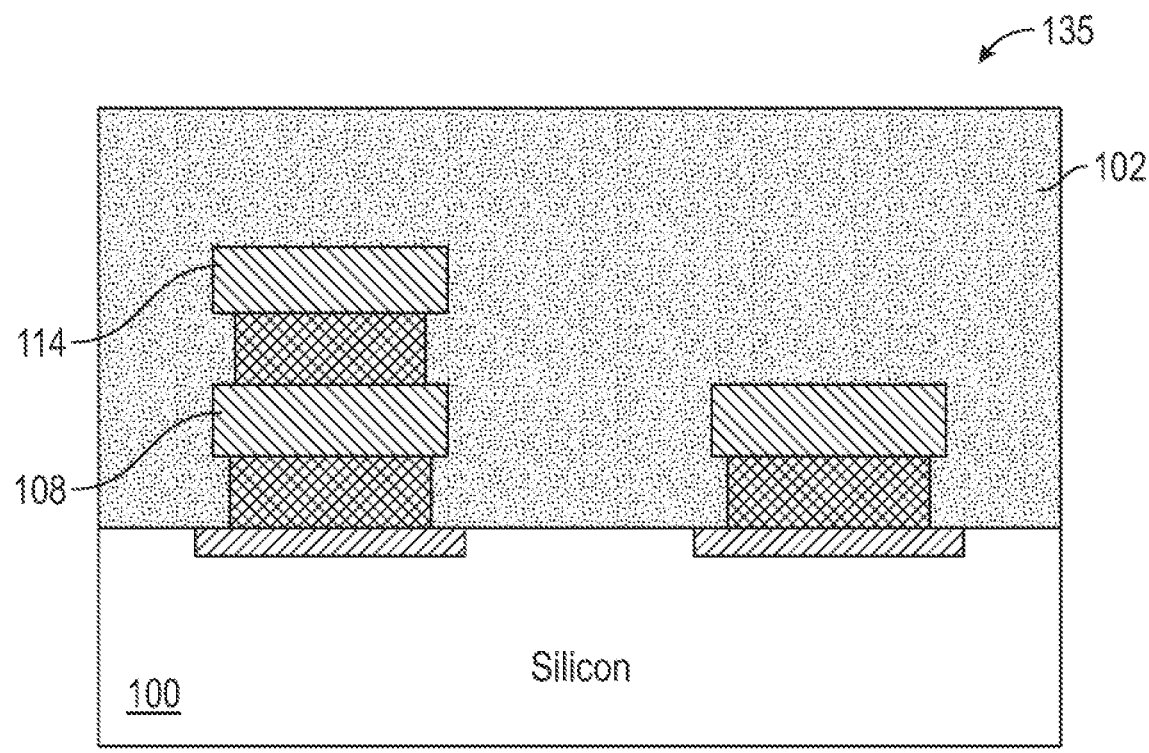

Next additional dielectric material 102 is deposited on structure 115 and planarized to form structure 120, as shown in FIG. 4D. Thereafter, opening 112 is formed in the dielectric to expose the surface of the metal trace 108 as shown, thereby to form the structure 125 shown in FIG. 4E. Next, during a metallization process, a layer of metal is deposited on structure 125 thus causing opening 112 to be filled with metal 114. Following a planarization process, structure 130 is formed, as shown in FIG. 4F. Next, additional dielectric material is deposited over structure 130 and planarized to form device structure 135 shown in FIG. 4G.

Figure 4H:
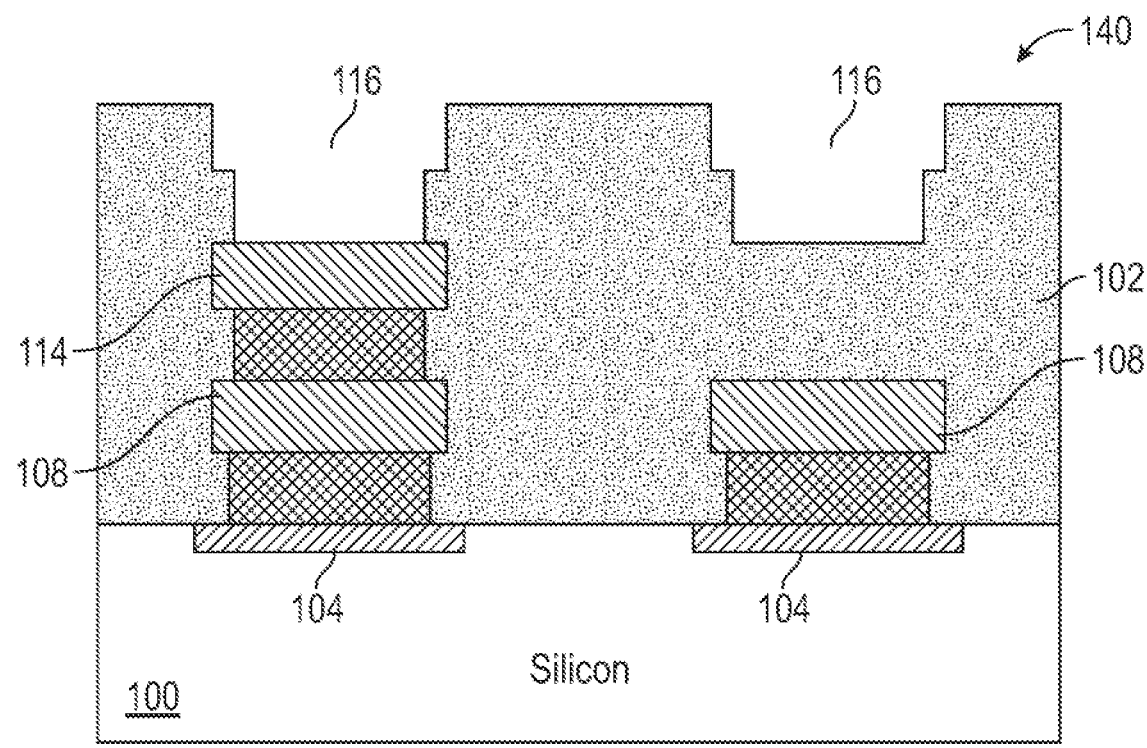
Figure 4I:
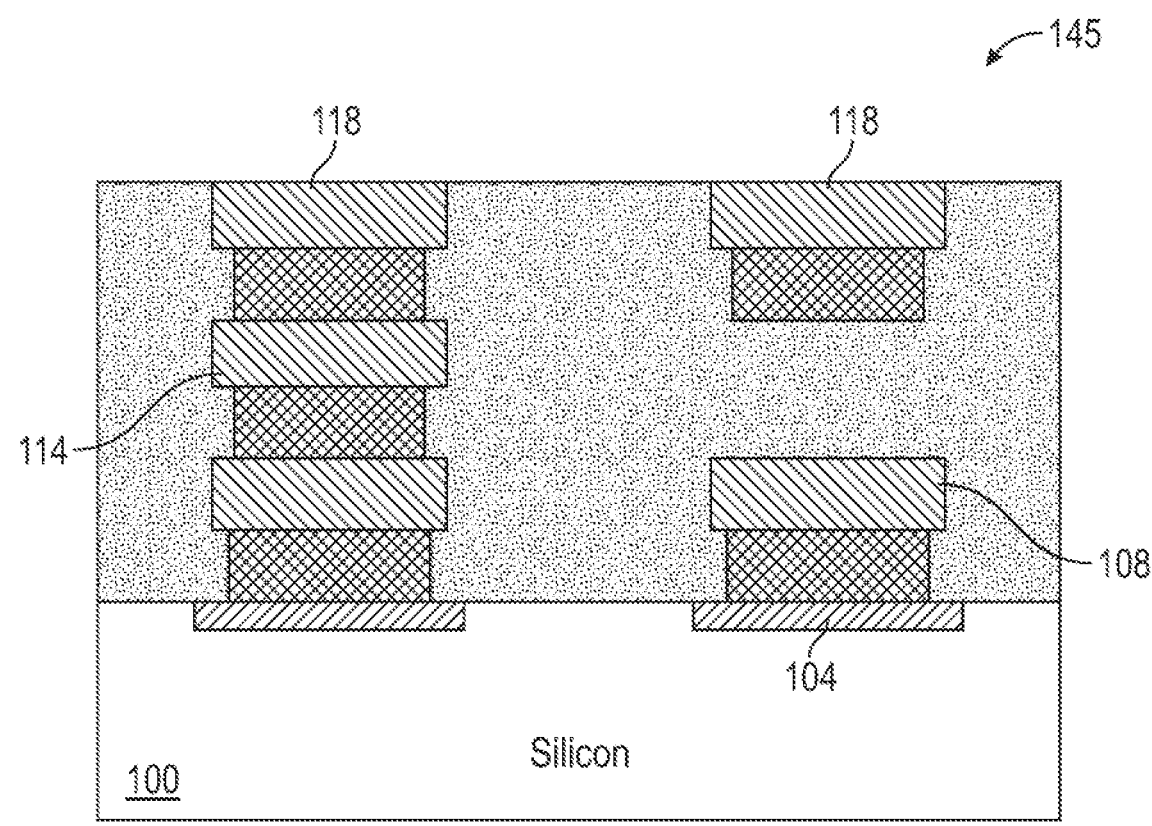

Next, openings 116 are formed above metal layer 114 until the surface of metal layer 114 is exposed. The resulting device structure 140 is shown in FIG. 4H. Next, during a metallization process, a layer of metal is deposited on structure 140 thus causing openings 116 to be filled with metal 118. Following a planarization process, device structure 145 shown in FIG. 4I is formed.

Figure 5:
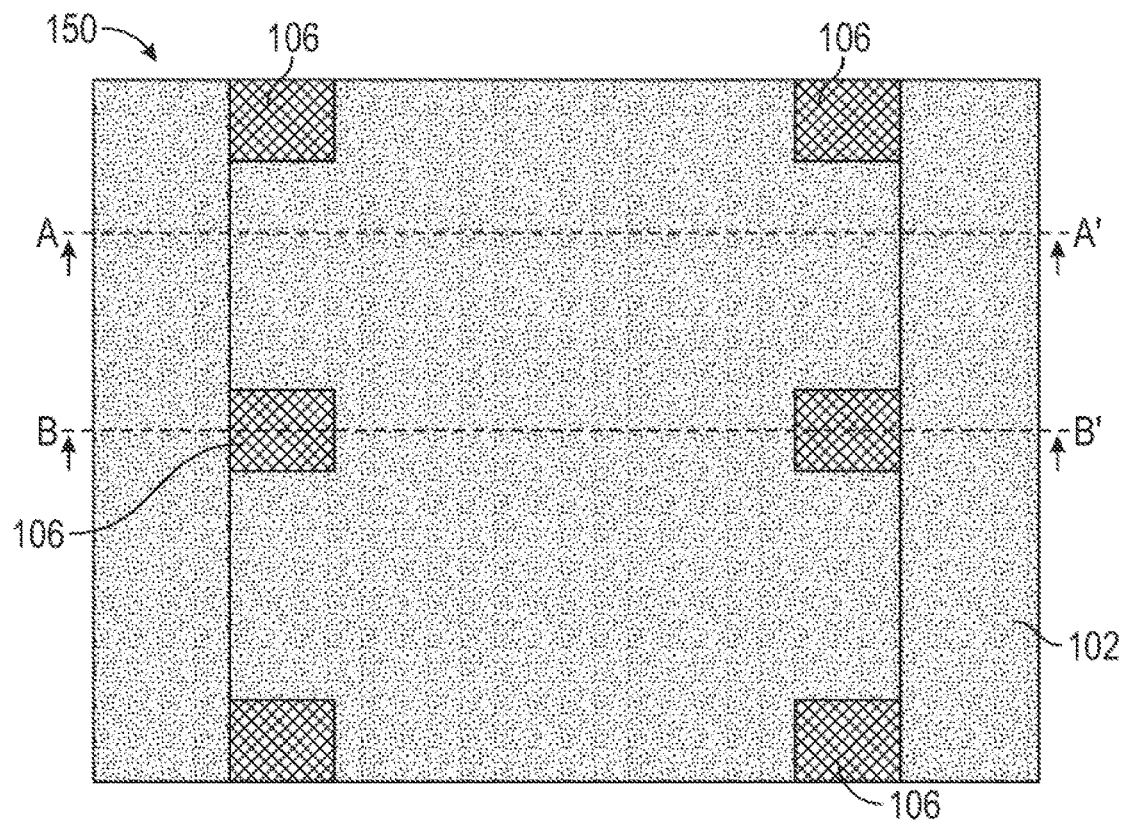
FIG. 5 is a top of view of a cross-section of a photonic device structure along its depth prior to a metal etch, in accordance with one embodiment of the present invention.

FIG. 5 is a view from the top of a cross-section of a photonic structure 150 shown prior to the metal etch. Metal-filled vias 106 provide pathways (channel) that guide the flow of metal etchants into the structure to facilitate the etching of the metal.

Figure 6A:
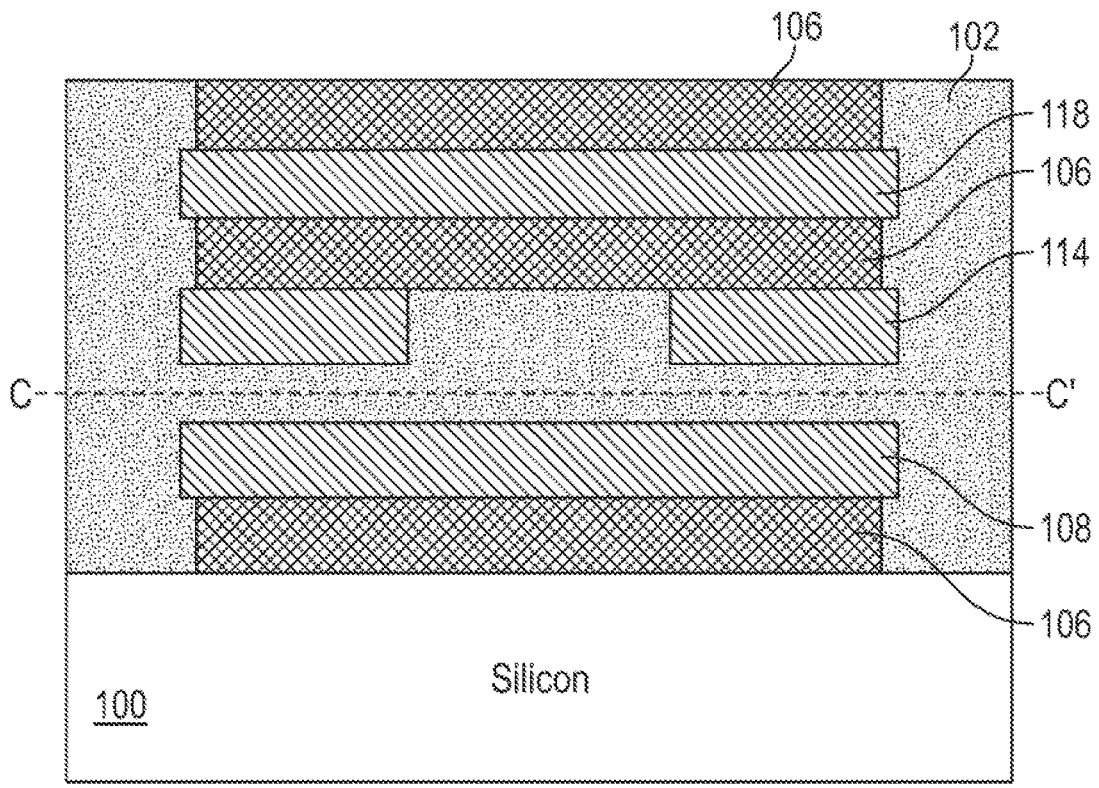
FIGS. 6A and 6B are different cross-sectional views of the photonic device structure shown in FIG. 5, in accordance with one embodiment of the present invention.
Figure 6B:
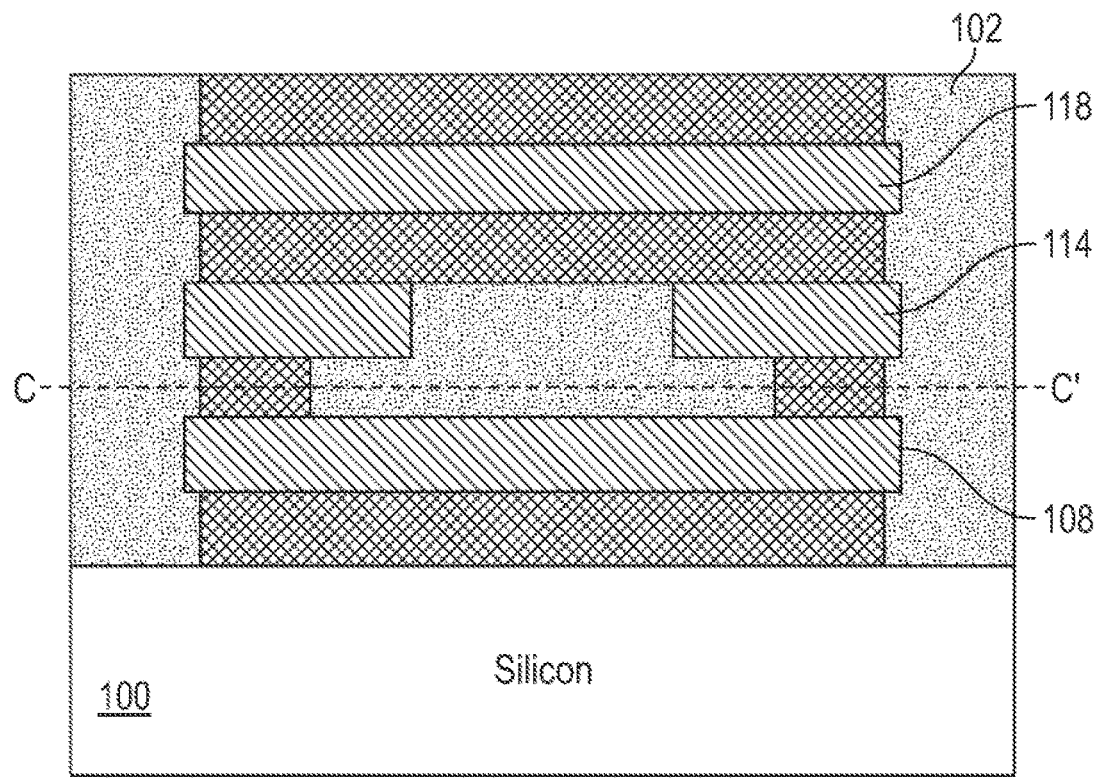

FIGS. 6A and 6B are cross-sectional views respectively along lines AA' and BB' of the device structure 150 shown in FIG. 5 when viewed along the direction of the arrows as shown. Dielectric 102, metal layers 108, 114 and 118 and metal-filled vias 106 are readily seen in these cross-sectional views. Cross-sectional views 6A and 6B show that metal layers 118, 114, 108 together with metal-filled vias 106 form a continuous metal trace defining an etch channel such that once the metal etch starts to etch the metal from metal-filled via 106 (overlaying metal layer 118) positioned along a top surface of the structure, the etchant is enabled to flow through the etch channel as it readily etches the remaining metal portions. After the metal etch process is completed, only dielectric material forming the photonic device remain. The processing steps used to from the various metal layers, vias and dielectric layers in forming device structure 150 are similar to those described above in reference to FIGS. 4A-4I and thus are not repeated. It is understood that FIG. 5 is a view from the top of the structures shown in FIGS. 6A and 6B after these structures are cut along lines CC'.

Figure 7:
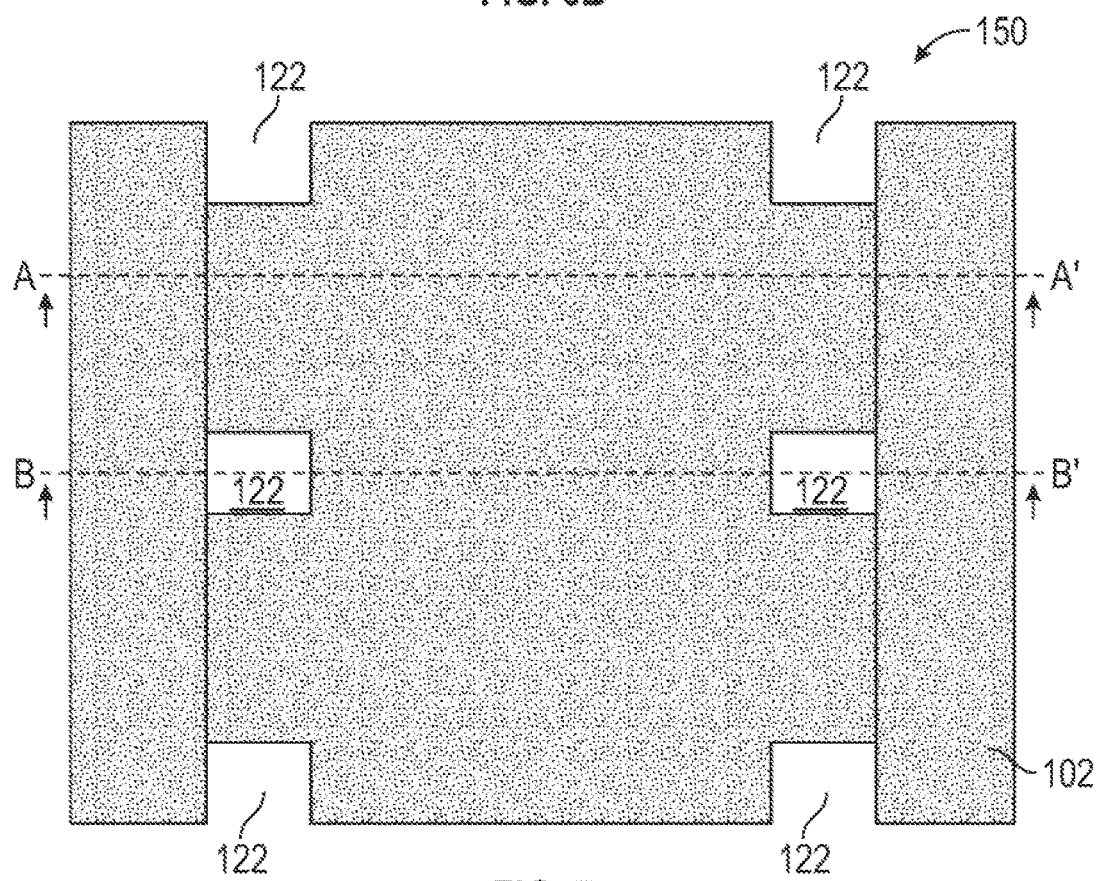
FIG. 7 is a top of view of the photonic device structure shown in FIG. 5 after a metal etch, in accordance with one embodiment of the present invention.
Figure 8A:
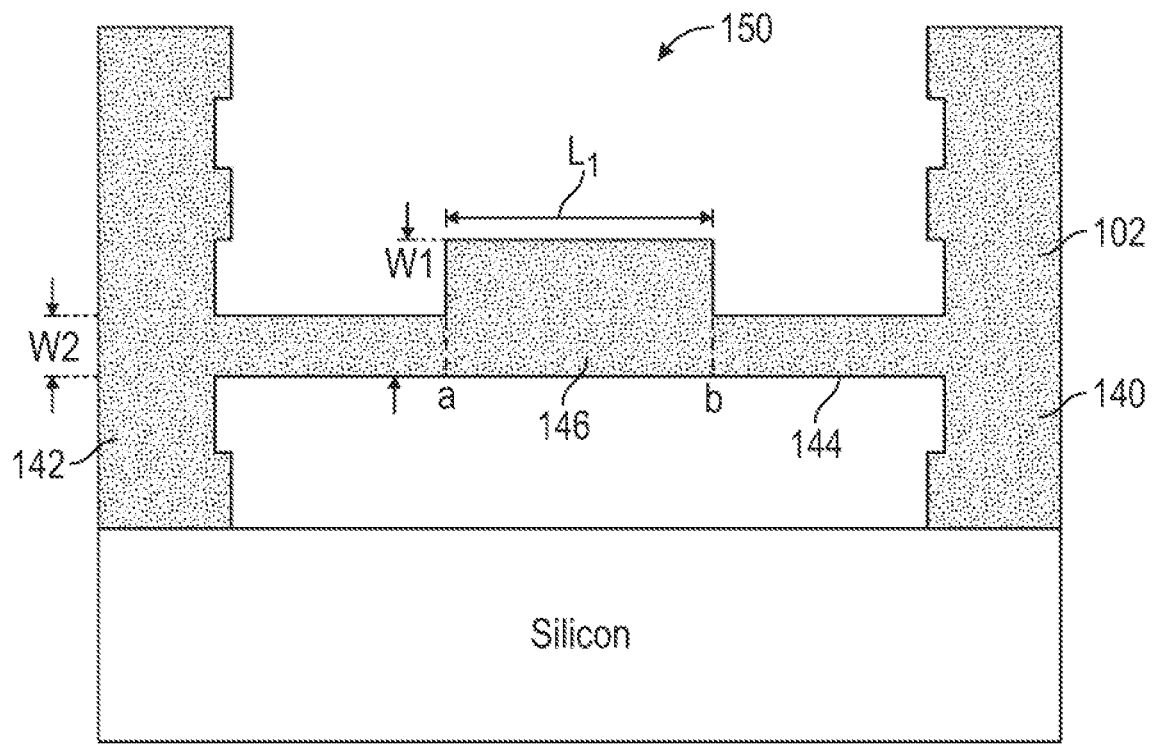
FIGS. 8A and 8B are different cross-sectional views of the photonic device structure shown in FIG. 7, in accordance with one embodiment of the present invention.
Figure 8B:
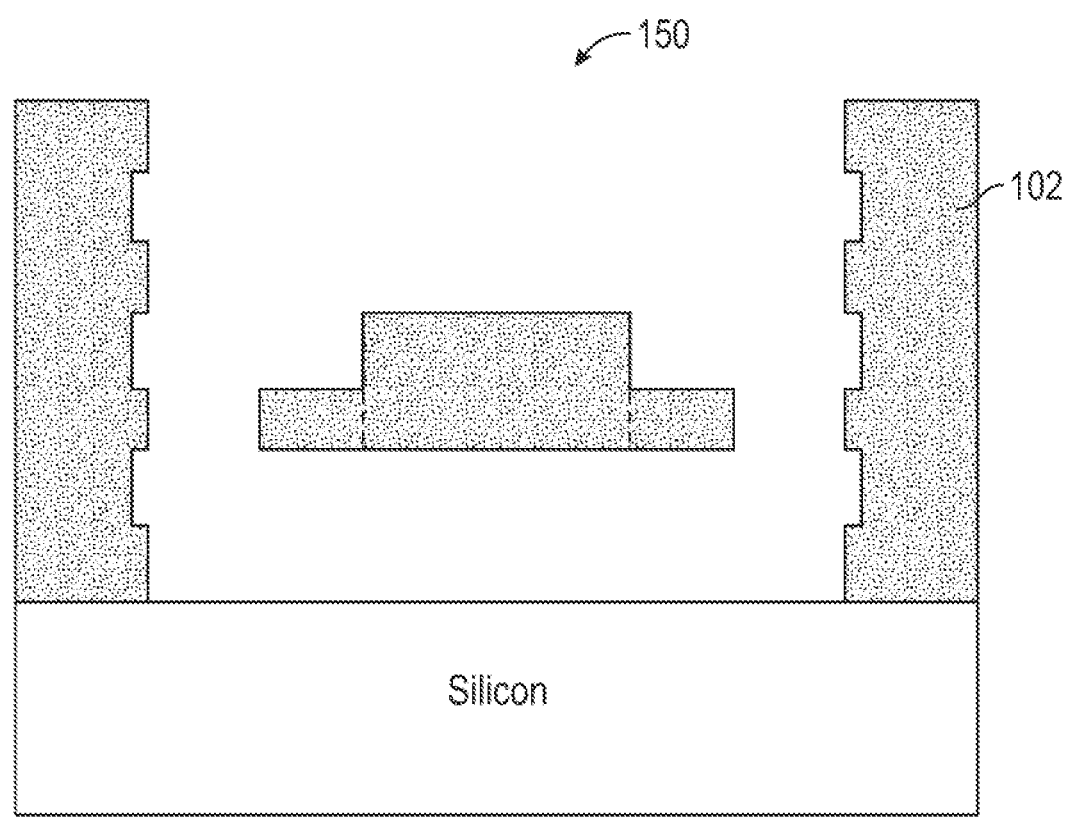

FIG. 7 is a top view of structure 150 after a metal etch. The etching process removes any metal present in structure 150 and results in the formation of openings 122. FIGS. 8A and 8B are cross-sectional views respectively along lines AA' and BB' of the device structure 150 shown in FIG. 7 when viewed along the direction of the shown arrows. Comparing FIG. 6A to 8A it is the seen that after the metal etch, only dielectric 102 forming the photonic device remains. Similarly by comparing FIG. 6B to 8B, it is seen that following the removal of the metal layer, including the metal present in the vias, only the dielectric layer 102 remains. Referring to FIG. 8A, it is seen that the waveguide has walls 140, 142 and rib 144. Center region 146 of the rib has a length $L_1$, and a width $W_1$ that is greater than the width $W_2$ of the rib. In one exemplary embodiment, nearly 80% of the light power propagates through the center region 146 of the waveguide. Accordingly, as seen by the embodiments of the present invention, the top surface of the photonic structure includes metals operating as a conduit for the metal etch to enter the interior of the structure and etch away any metal present therein and leave behind only the dielectric forming the photonic device.

In the exemplary embodiments of the devices described herein, pathways guiding the flow of the etchant are factored in the design such that all the metallic structures that need to be removed are accessible by the etchant.

In one embodiment, openings in the top dielectric (passivation) layer allow the etchant (e.g. acid) to etch at strategically located aluminum pads (e.g., aluminum-filled metal vias 106 shown in FIG. 5). In one exemplary embodiment, aluminum layers can be etched by an aluminum etch, such as aluminum etch type A. After the pads have been etched, a solution of, for example, 50% hydrogen peroxide and 50% EDTA may be used to chelate the copper, aluminum, tantalum, and tantalum nitride.

In one embodiment, a wafer/substrate on which the structure is formed, may be submerged in Aluminum etch type A for one hour at 80° C. In other embodiments, a gas or plasma may be used to etch Aluminum, Copper or any other metal that may be used. Subsequently the wafer is rinsed in deionized water and dried. Thereafter, the wafer is submerged in a solution of 50% hydrogen peroxide and 50% Ethylenediaminetetraacetic acid (EDTA) for one hour at 80° C. Next, the wafer is rinsed in deionized water and dried. Next, the wafer is submerged in Aluminum etch type A for, e.g., one hour at 80° C. The wafer is subsequently rinsed in deionized water and dried. Optionally the wafer may again be submerged in a solution of 50% hydrogen peroxide and 50% EDTA for one hour at 80° C. Following this immersion the wafer is again rinsed in deionized water and dried.

Suspended Channel Waveguide

Figure 9:
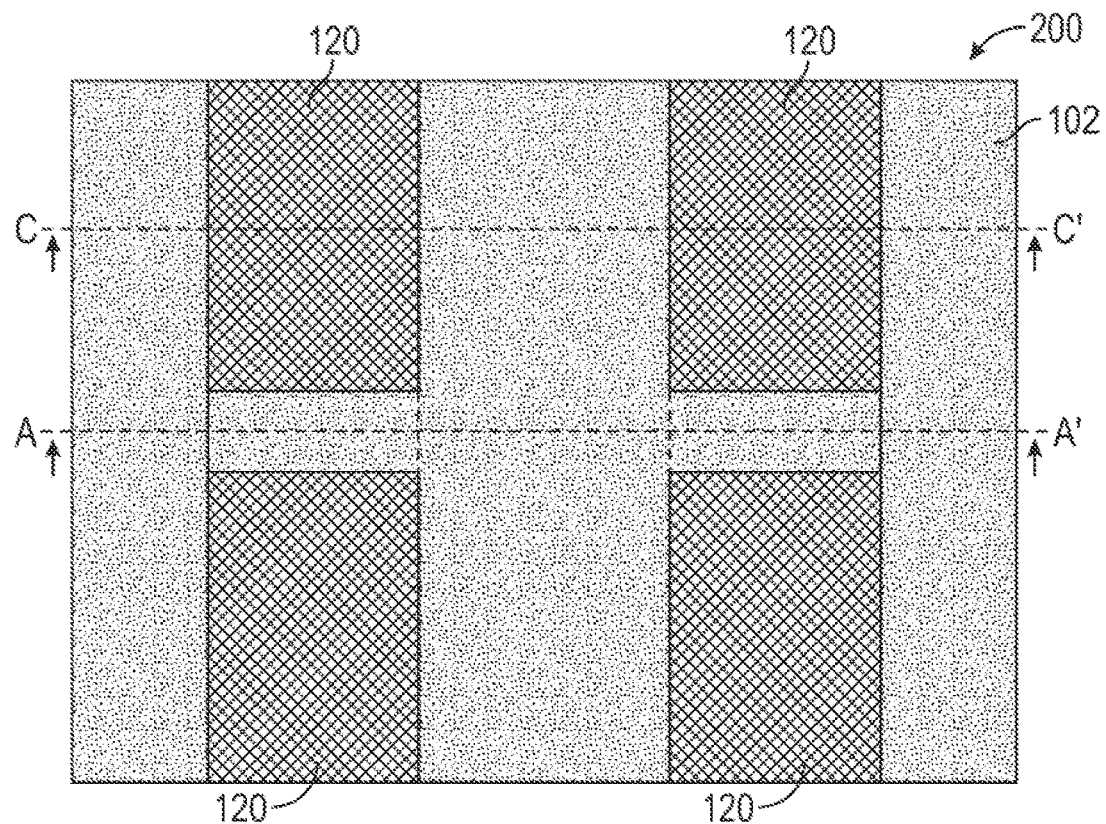
FIG. 9 is a top view of a cross-section of a photonic device structure along its depth prior to a metal etch, in accordance with one embodiment of the present invention.
Figure 10A:
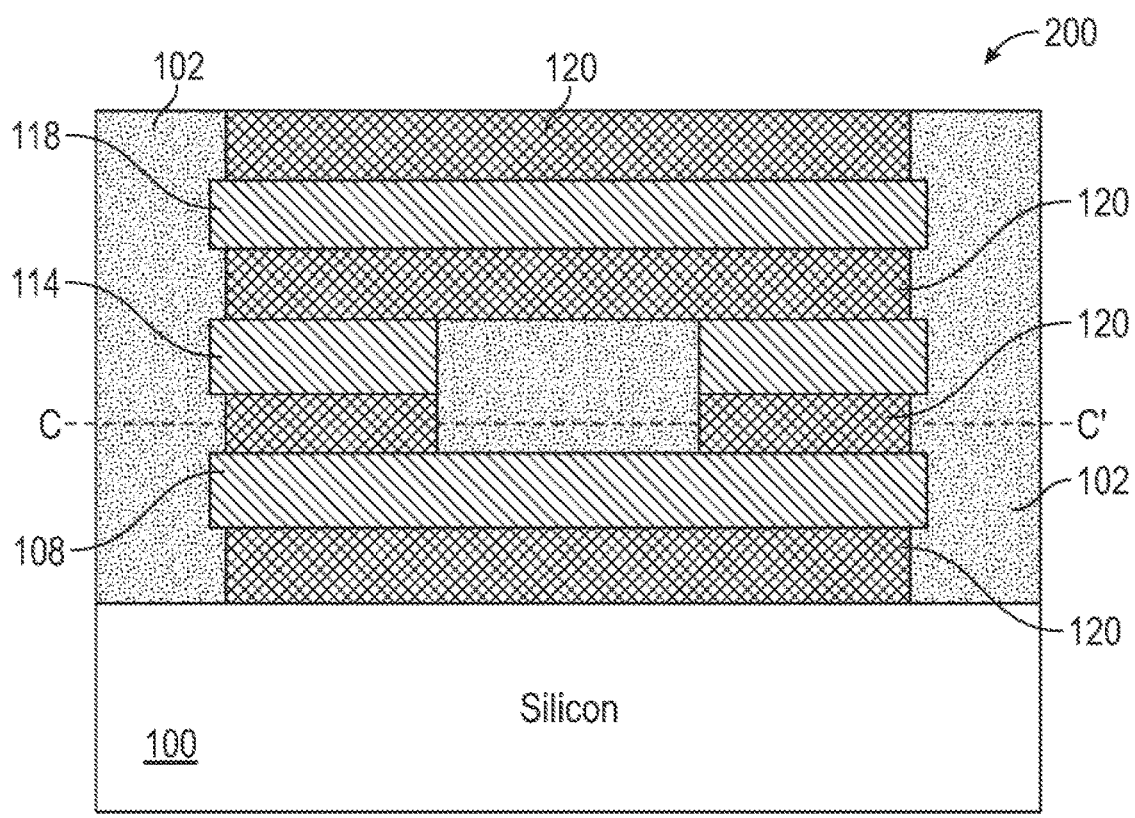
FIGS. 10A and 10B are different cross-sectional views of the photonic device structure shown in FIG. 9, in accordance with one embodiment of the present invention.
Figure 10B:
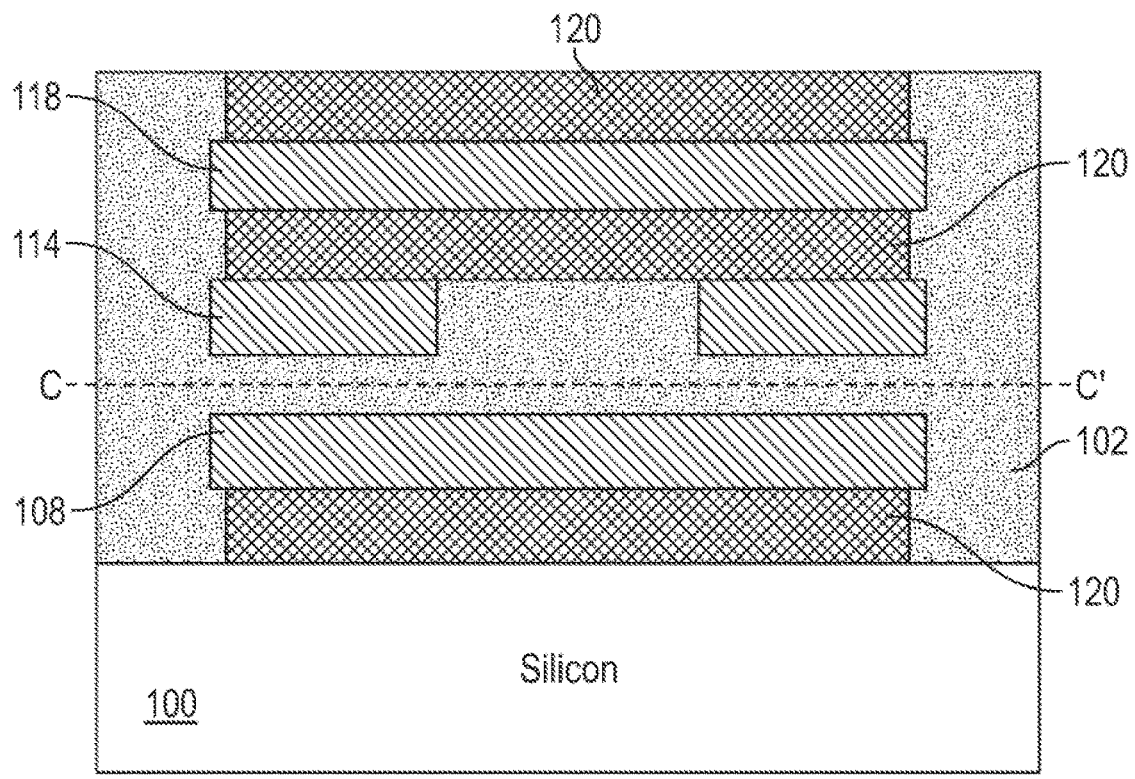

FIG. 9 is view from the top of a cross-section of a suspended channel waveguide 200 prior to a metal etch. Metal-filled vias 120 provide pathways that guide the flow of metal etchants into the structure to facilitate the etching of the metal. Waveguide 200 is formed using metal deposition, dielectric deposition, via formation and planarization steps in a manner similar to that described above in reference to waveguide 150. Waveguide 200's top is shown as including, in part, dielectric 102 and vias 120, which as described above are filled with metal. FIG. 10A is a cross-sectional view along lines CC' of waveguide 200 of FIG. 9 when viewed along the arrows as shown. As is seen from FIG. 10A, waveguide 200 is formed on silicon substrate 100 and includes, metal layers 108, 114, 118, metal-filled vias 120 and dielectric 102. FIG. 10B is a cross-sectional view along lines AA' of waveguide 200 of FIG. 9 when viewed along the arrows as shown. It is understood that FIG. 9 is a view from the top of the structures shown in FIGS. 10A and 10B after these structures are cut along lines CC'.

Figure 11:
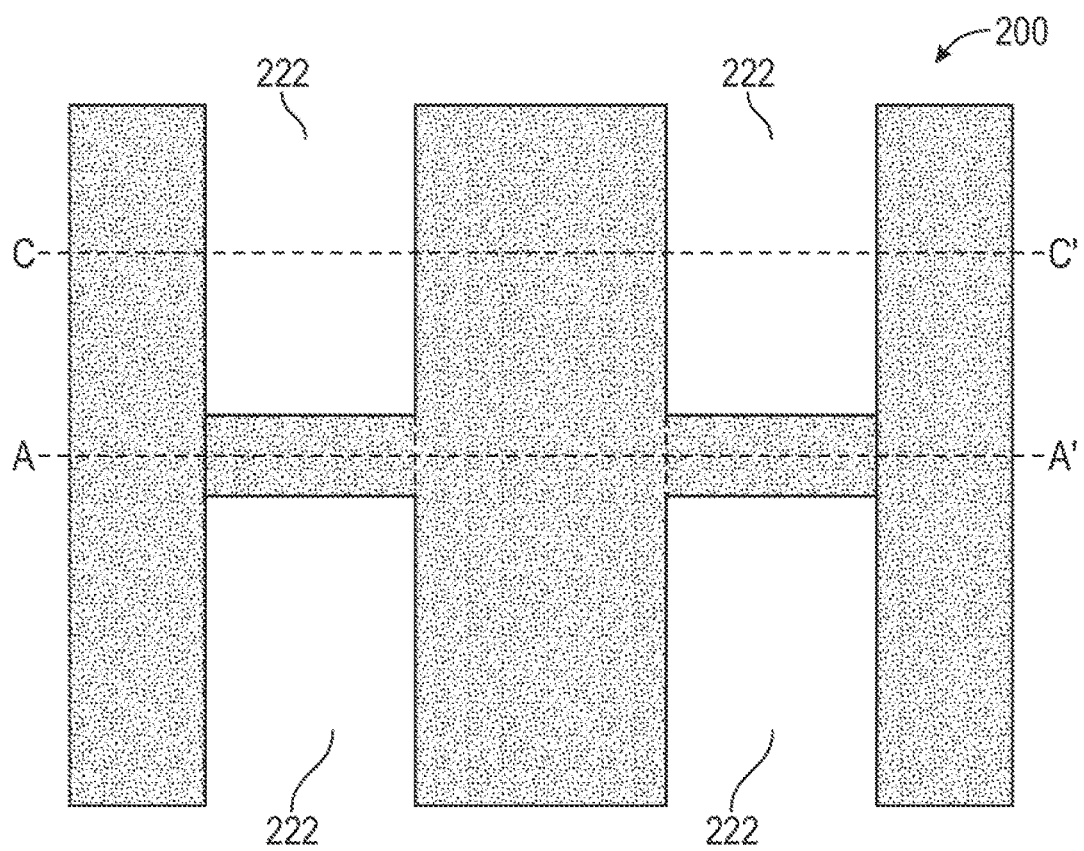
FIG. 11 is a top view of a photonic device structure of FIG. 9 after a metal etch, in accordance with one embodiment of the present invention.
Figure 12A:
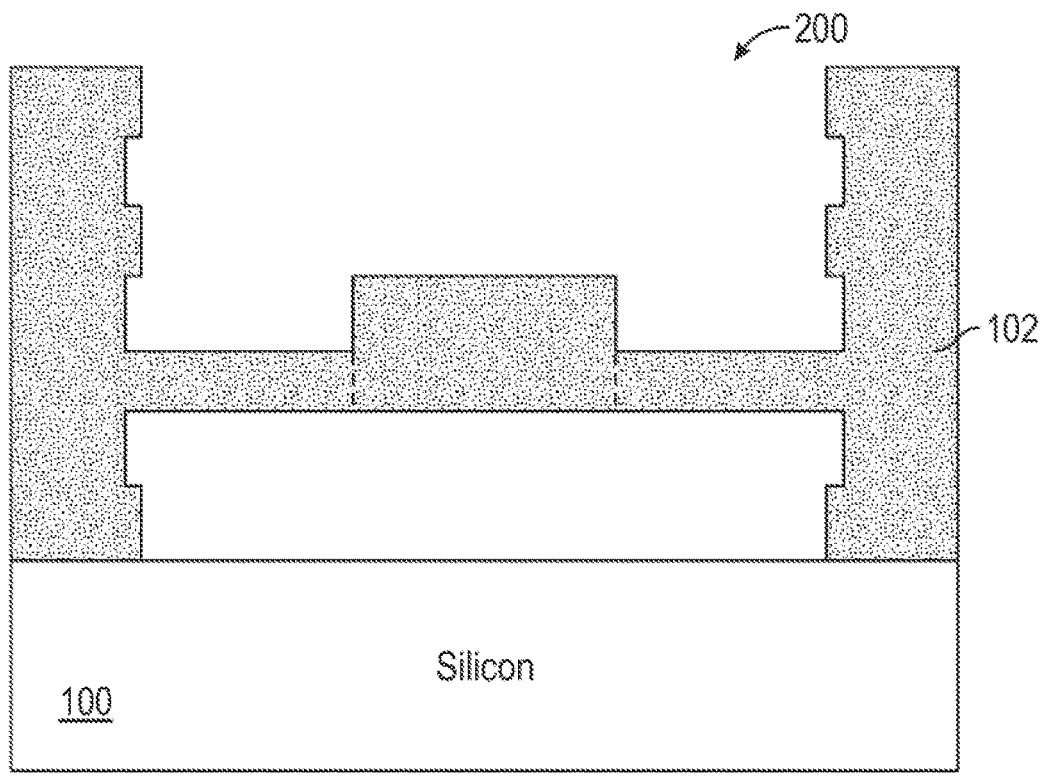
FIGS. 12A and 12B are different cross-sectional views of the photonic device structure shown in FIG. 11, in accordance with one embodiment of the present invention.
Figure 12B:
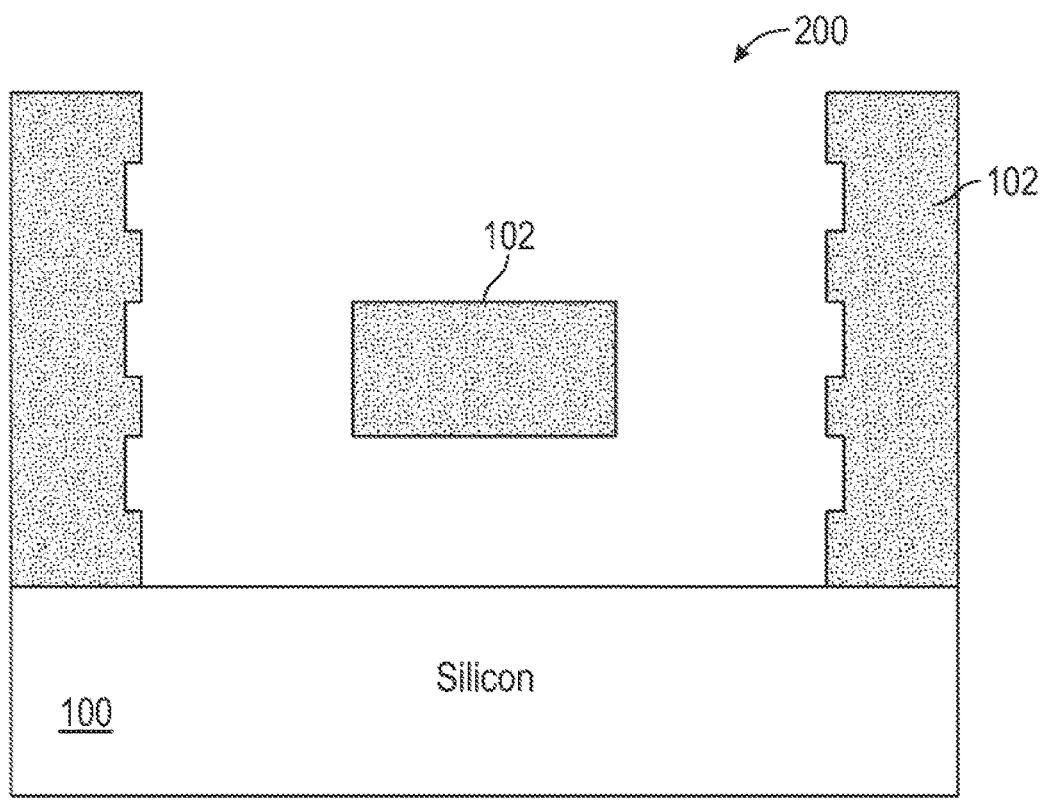

FIG. 11 is a top of view of waveguide structure 200 after a metal etch. The etching process removes any metal and results in the formation of openings 222. FIGS. 12A and 12B are cross-sectional views respectively along lines AA' and CC' of the waveguide structure 200 shown in FIG. 11 when viewed along the direction of the shown arrows.

In accordance with some embodiments of the present invention, additional materials such as photonic polymers, liquid crystals, III-V compounds, and the like may be added to the photonic structure during the fabrication. Such materials may be added to enclose the dielectric material or to fill the gap created during the metal removal. Accordingly, such materials may be either cladding material or part of the optical guiding structure of the device.

In one exemplary embodiment, photonic polymers are added to surround the waveguide and facilitate optical modulation. In one exemplary embodiment, photonic polymers are added to the interior of a slot waveguide to facilitate optical modulation. In one exemplary embodiment, photonic polymer is used to form a channel waveguide by filling the empty space created as a result of the metal etch.

In one exemplary embodiment, liquid crystals are added to surround a waveguide and facilitate optical modulation. In one exemplary embodiment, liquid crystals are added to the interior of a slot waveguide to facilitate optical modulation. In one exemplary embodiment, liquid crystals are used to form a channel waveguide by filling the empty space created as a result of the metal etch.

In one exemplary embodiment, III-V materials are heterogeneously integrated with the photonic device structure. In one exemplary embodiment, such materials are integrated with the device using vapor deposition techniques. Such III-V materials may then be used to form fixed-wavelength lasers, tunable lasers, optical amplifiers, high-efficiency photodetectors, or other devices.

In one exemplary embodiment, a photosensitive material (such as germanium) is added to form a photodetector or photo-absorber. In one exemplary embodiment, traveling wave electrodes are designed such that the deposition of photosensitive materials results in a traveling wave photodetector or photo-absorber. In one exemplary embodiment, the active area of the silicon substrate is used to form a silicon photodetector or photo-absorber.

Figure 14:
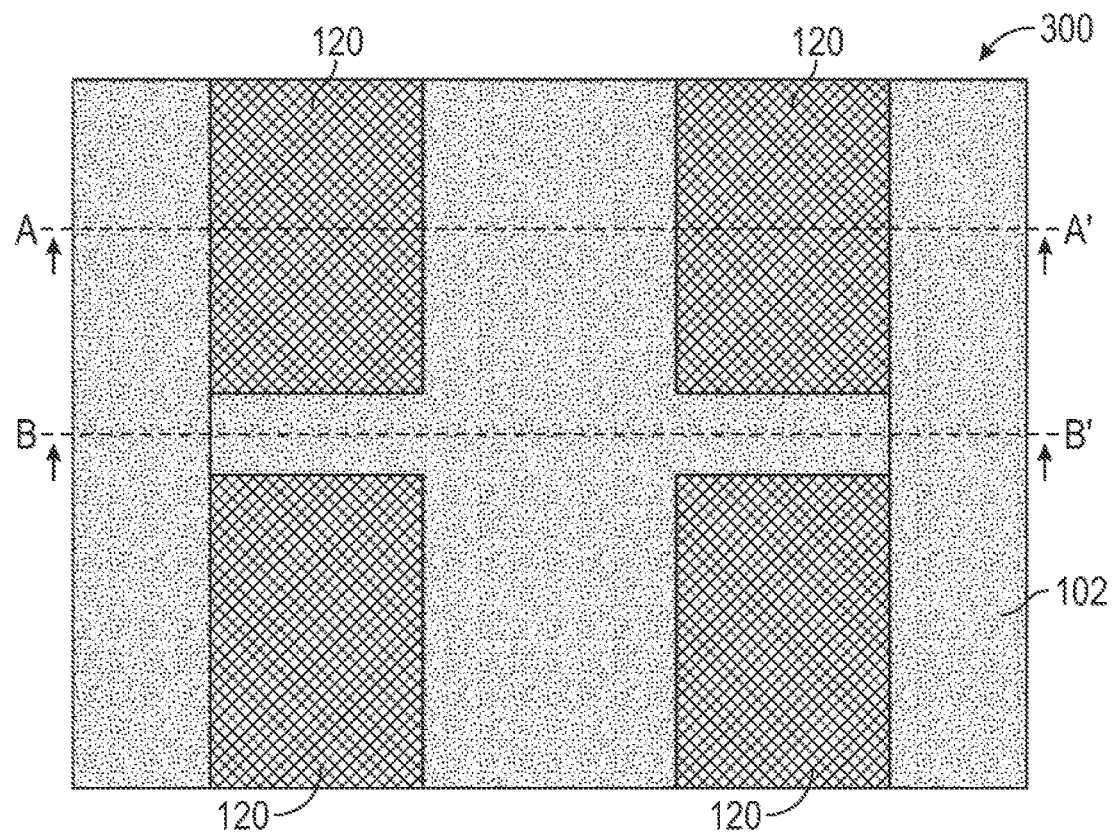
FIG. 14 is a top view of a photonic device structure prior to a metal etch, in accordance with one embodiment of the present invention.
Figure 15A:
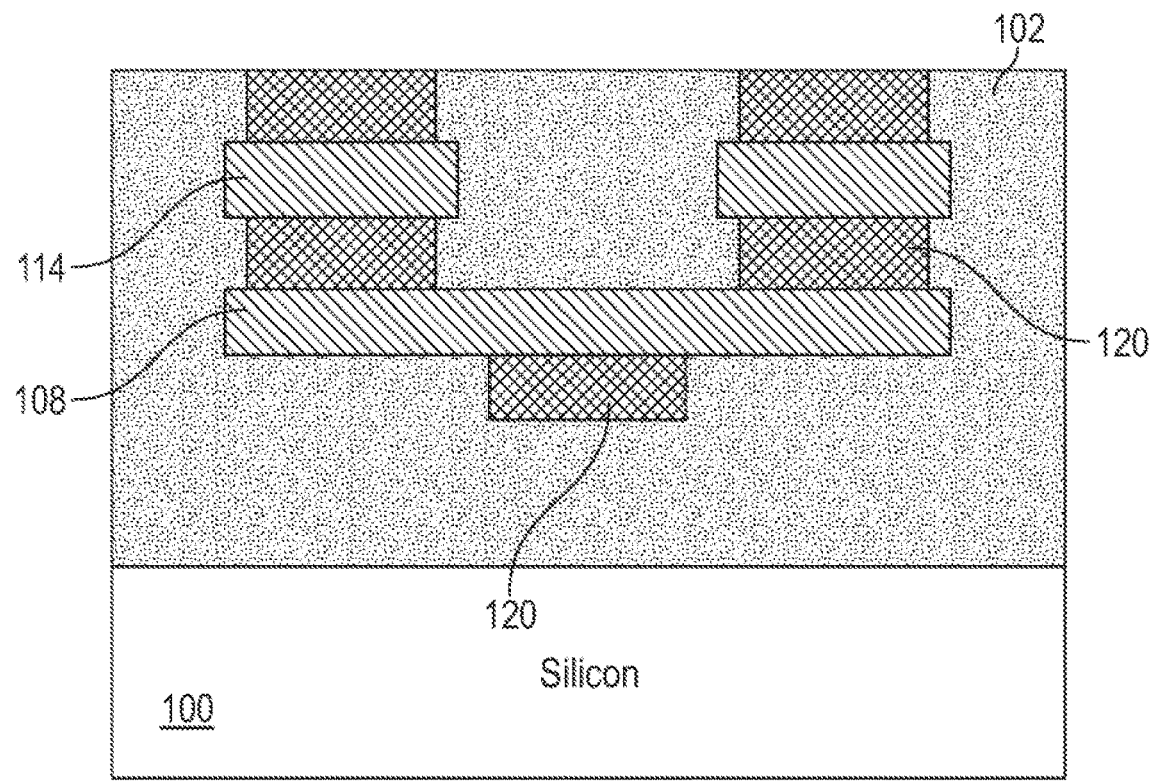
FIGS. 15A and 15B are different cross-sectional views of the photonic device structure shown in FIG. 14, in accordance with one embodiment of the present invention.
Figure 15B:
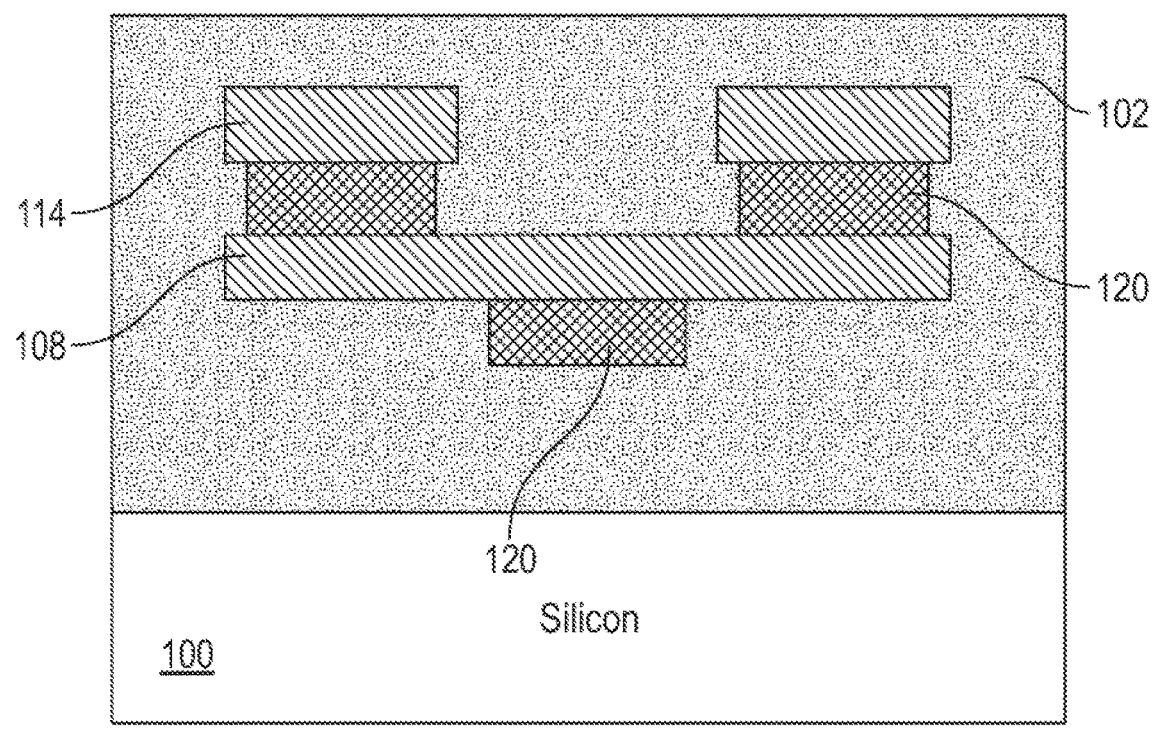

FIG. 14 is a top view of a suspended channel waveguide 300 prior to a metal etch. Waveguide 300 is formed using metal deposition, dielectric deposition, via formation and planarization steps in a manner similar to that described above in reference to waveguide 150. Waveguide 300's top view, which is similar to that of waveguide 200 shown in FIG. 9, is shown as including, in part, dielectric 102 and vias 120. FIG. 15A is a cross-sectional view along lines AA' of waveguide 300 when viewed along the arrows as shown. As is seen from FIG. 15A, waveguide 300 is formed on silicon substrate 100 and includes, in part, metal layers 108, 114, metal-filled vias 120 and dielectric 102. FIG. 15B is a cross-sectional view along lines BB' of waveguide 300 of FIG. 14 when viewed along the arrows as shown.

Figure 16:
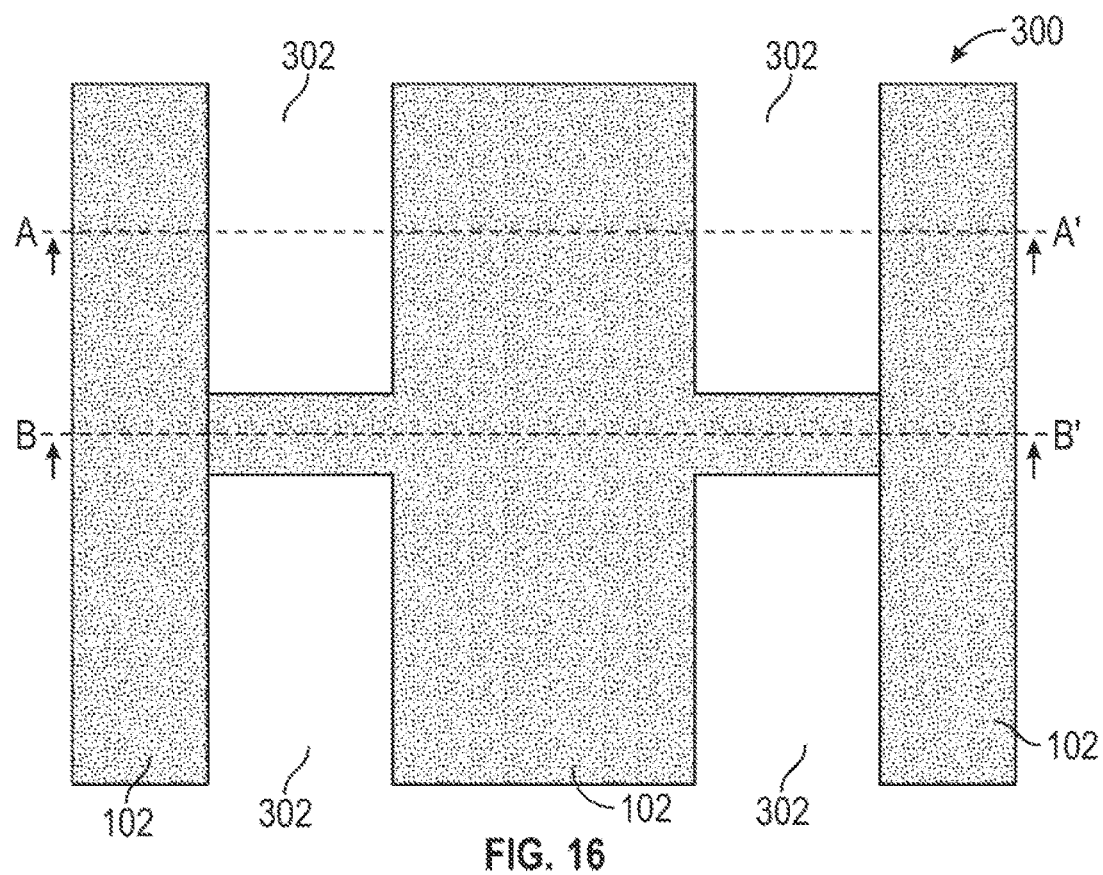
FIG. 16 is a top view of a photonic device structure of FIG. 14 after a metal etch, in accordance with one embodiment of the present invention.
Figure 17A:
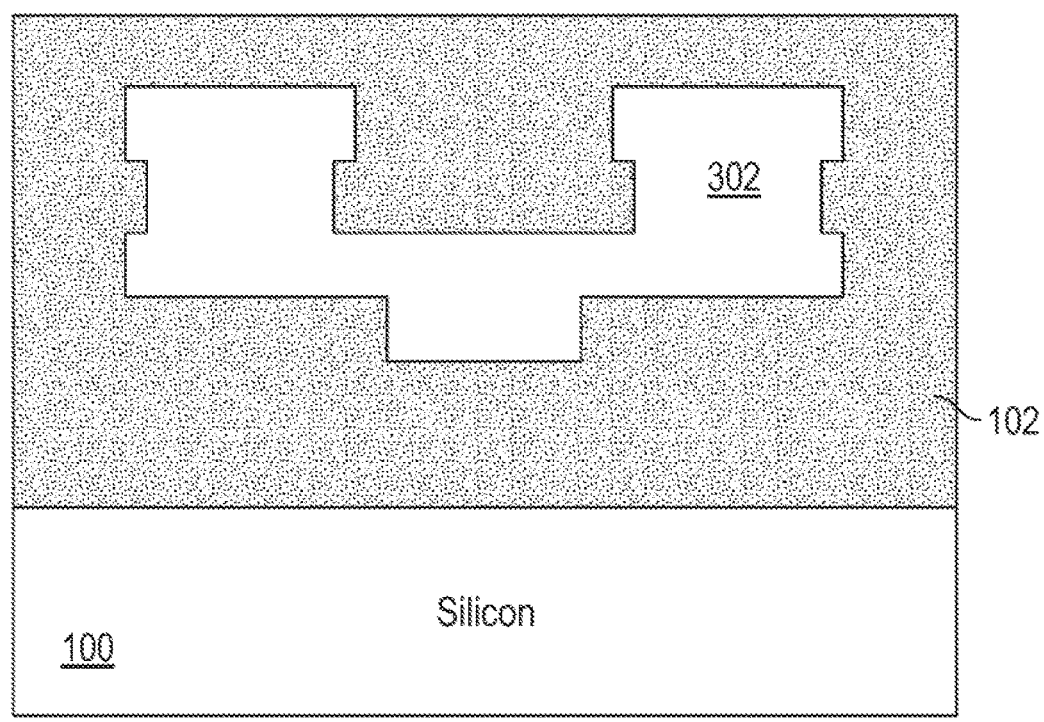
FIGS. 17A and 17B are different cross-sectional views of the photonic device structure shown in FIG. 16, in accordance with one embodiment of the present invention.
Figure 17B:
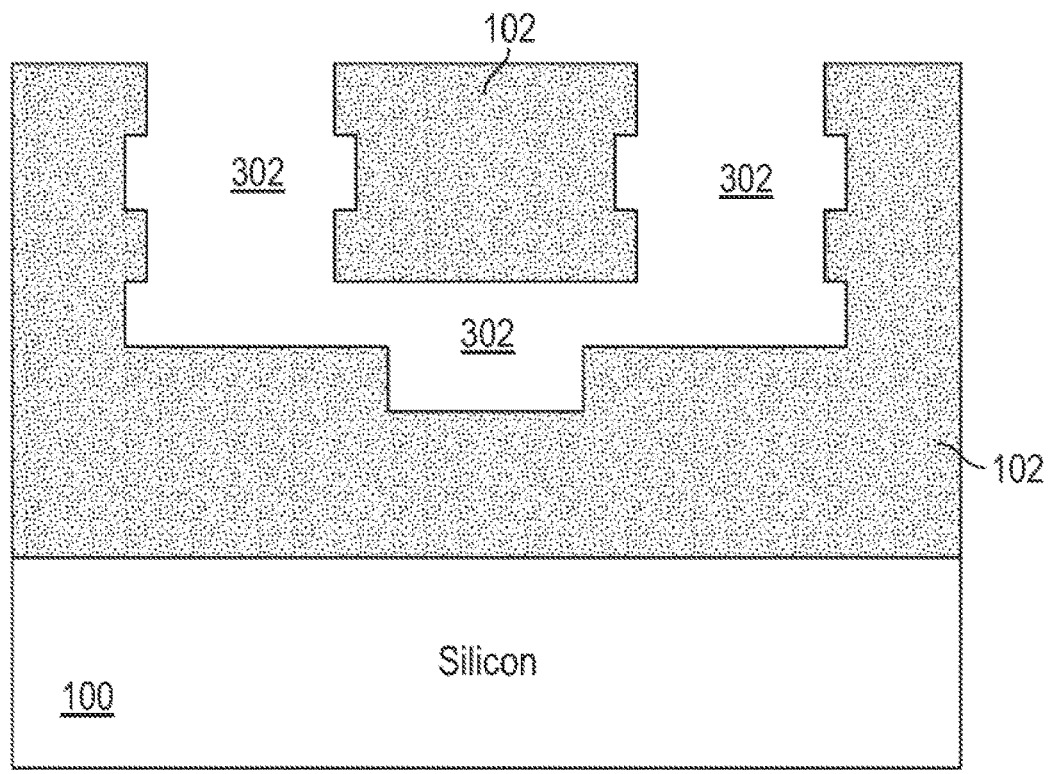

FIG. 16 is a top of view of waveguide structure 300 after a metal etch. The etching process removes any metal present in the waveguide and results in the formation of openings 302. FIGS. 17A and 17B are cross-sectional views respectively along lines BB' and AA' of the waveguide structure 300 viewed along the direction of the shown arrows. As is seen from FIGS. 17A and 17B, following the metal etch, openings 302 are formed in the waveguide.

Figure 18:
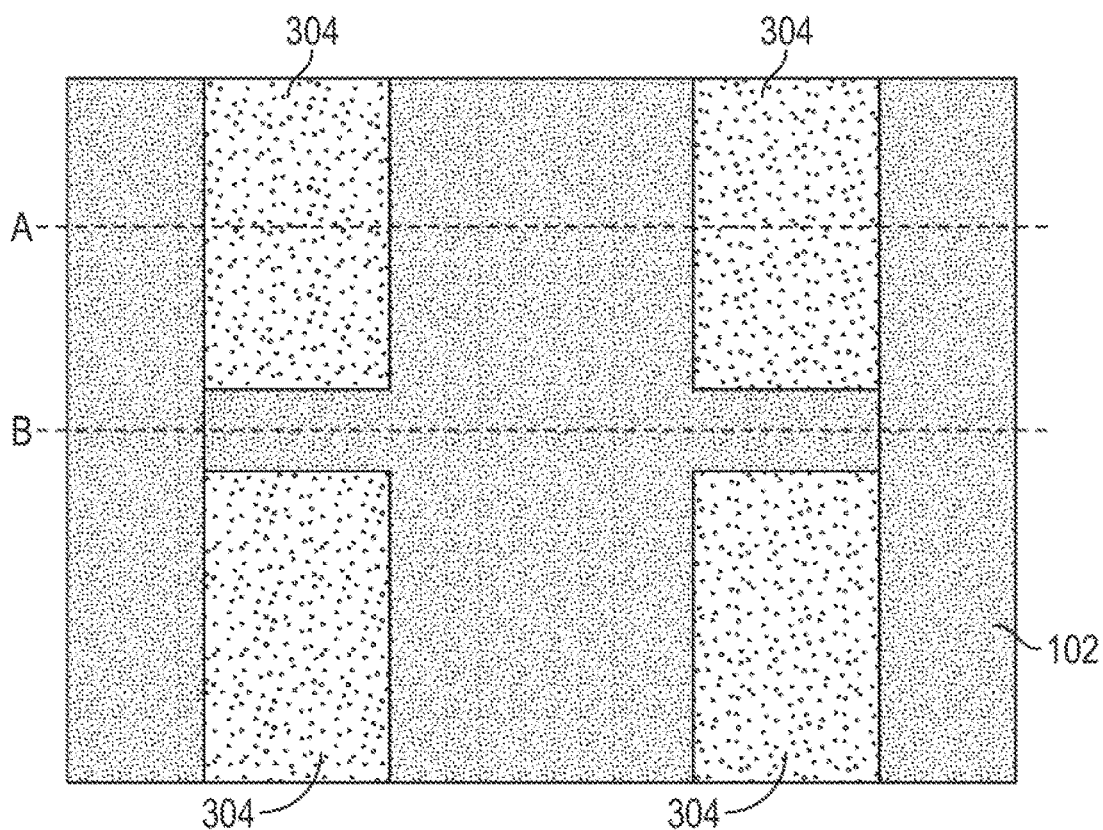
FIG. 18 is a top view of the photonic device structure shown in FIG. 16 following the disposition of one or more materials in the openings created as a result of the metal etch, in accordance with one embodiment of the present invention.
Figure 19A:
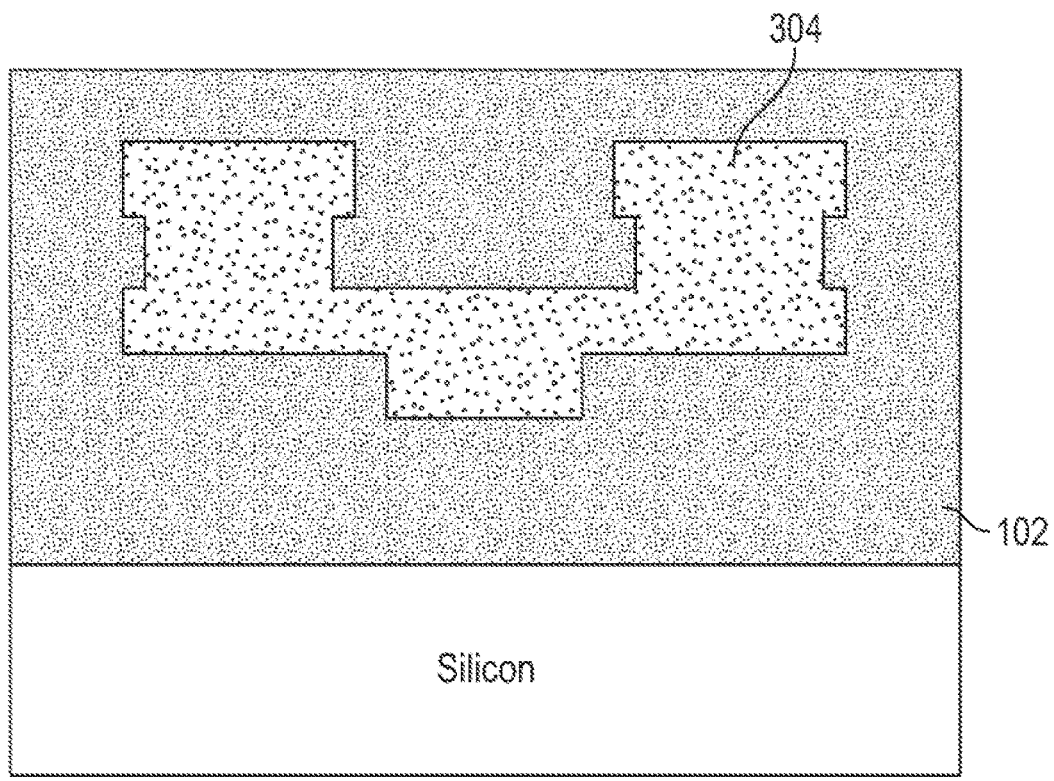
FIGS. 19A and 19B are different cross-sectional views of the photonic device structure shown in FIG. 18, in accordance with one embodiment of the present invention.
Figure 19B:
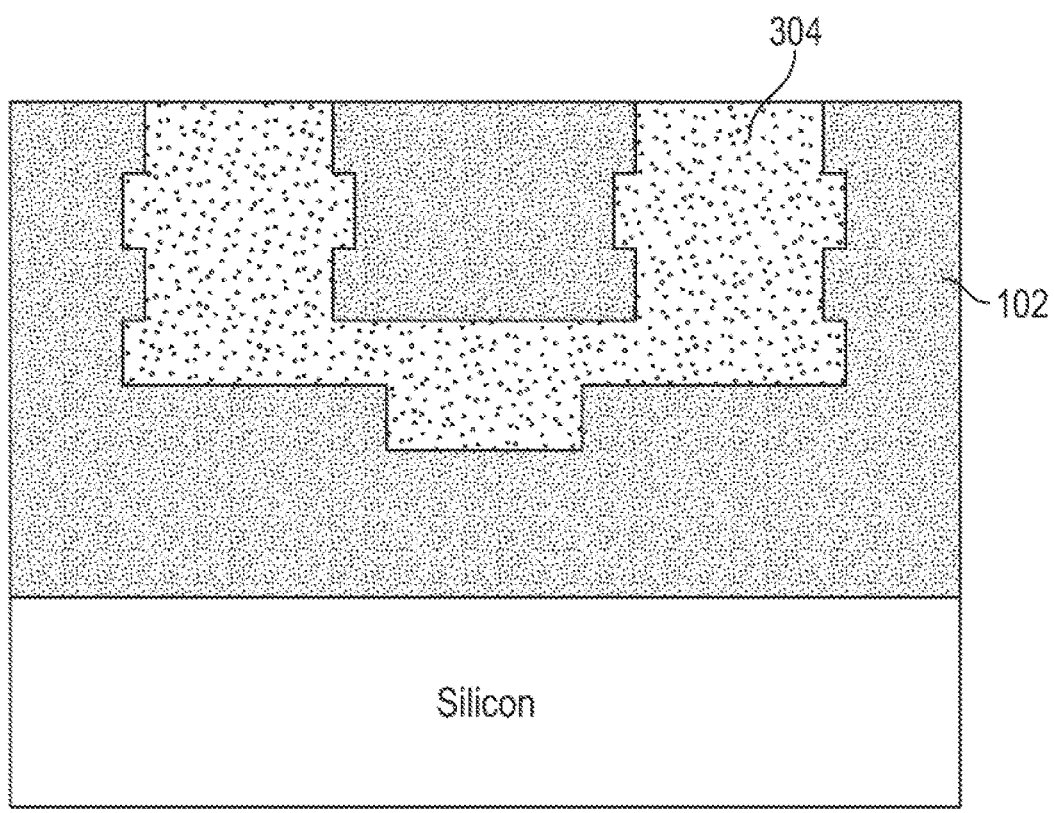

FIG. 18 is a top view of waveguide structure 300 shown in FIG. 16 following the injection of one or more materials in the openings 302 created as a result of the metal etch. Injected materials 304 are shown as having filled the openings 302. FIGS. 19A and 19B, that respectively correspond to FIGS. 17A and 17B, also show the filling of the openings by injected material 304.

Figure 20:
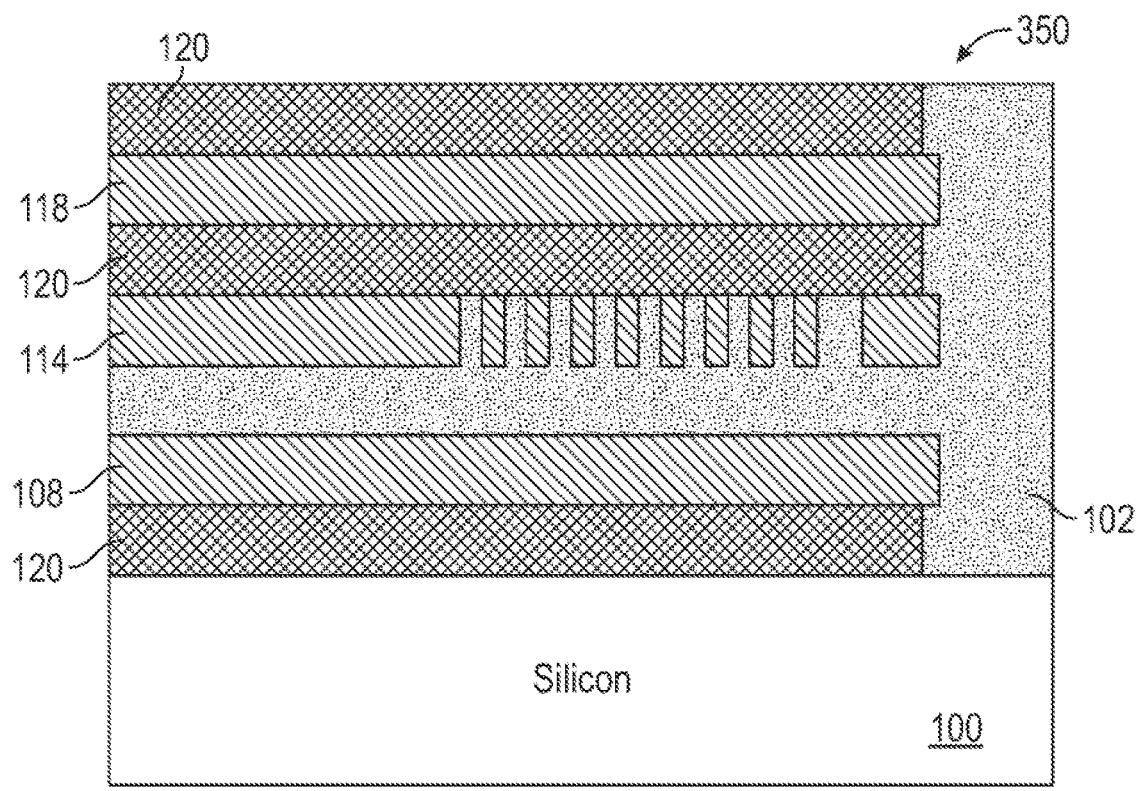
FIG. 20 is a cross-sectional view of a photonic device structure prior to a metal etch, in accordance with one embodiment of the present invention.
Figure 21A:
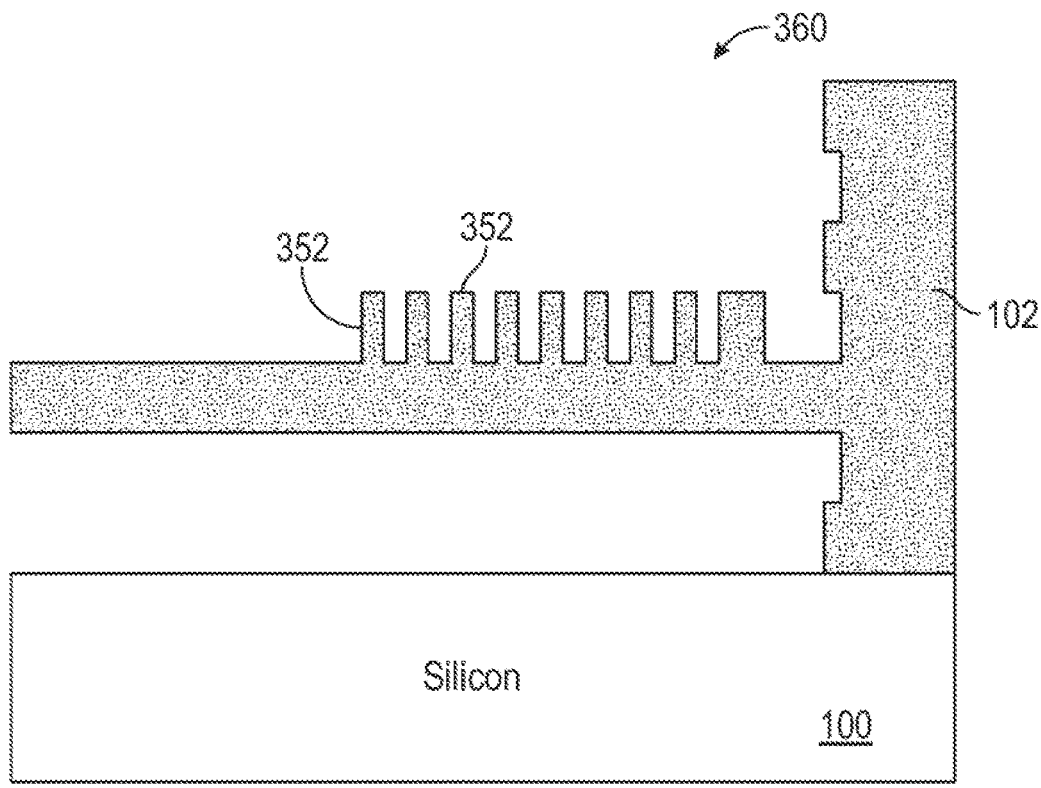
FIG. 21A is a cross-sectional view of the photonic device structure of FIG. 20 after a metal etch, in accordance with one embodiment of the present invention.
Figure 21B:
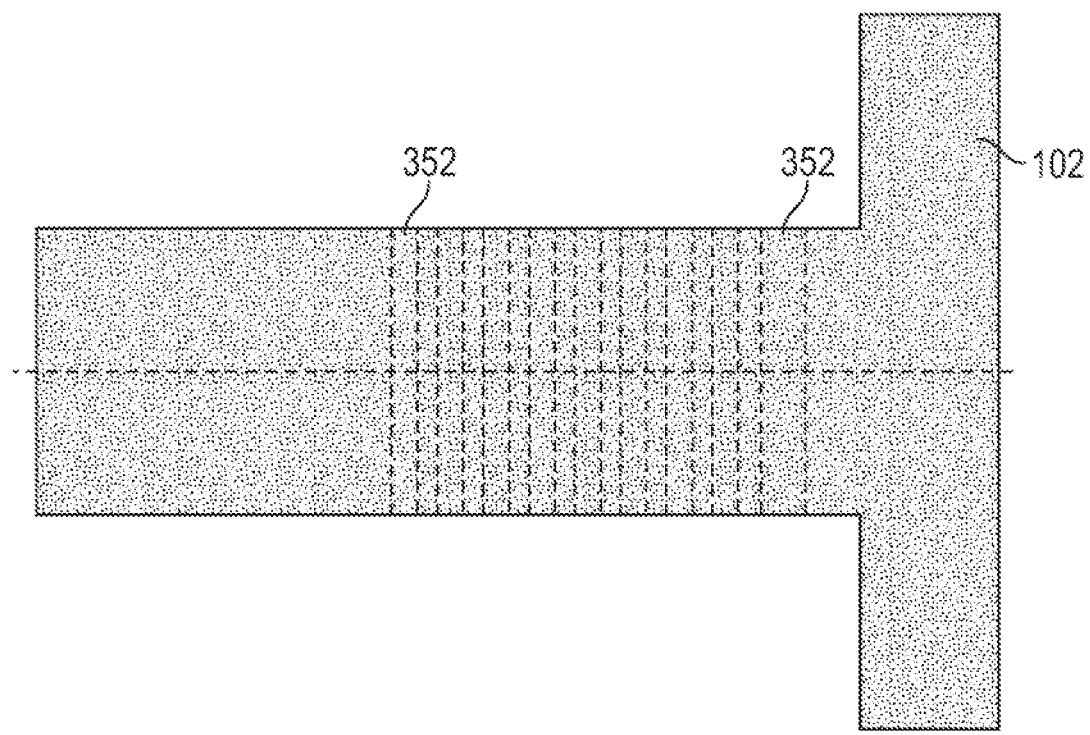
FIG. 21B is a top view of the photonic device structure of FIG. 21A, in accordance with one embodiment of the present invention.

FIG. 20 is a cross-sectional view of a grating coupler structure 350 that includes multiple layers of metals, namely layers 108, 114, 118, metal-filled vias 120 and dielectric 102, that are formed using the metal deposition, via formation, dielectric deposition and planarization techniques as described above. After removing the metal from structure 350 using a metal etch, grating structure 360 shown in FIG. 21A is formed. FIG. 21A also shows the individual diffraction grating rulers 352 of grating coupler 360. FIG. 21B is a top view of grating coupler 360. The widths and heights of the rulers, as well as the spacing between them is determined by the desired wavelength and can be varied to achieve a desired response and generate maximum coupling at a given wavelength.

Figure 22A:
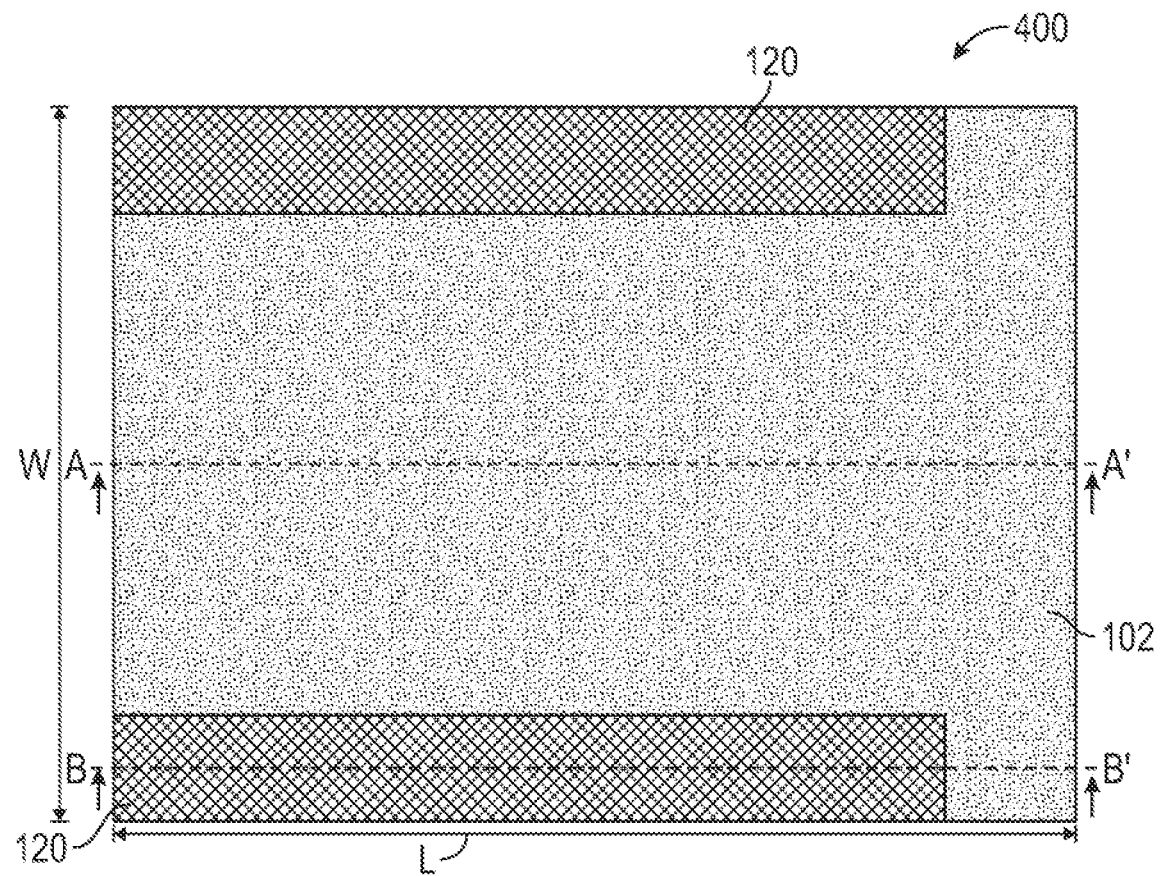
FIG. 22A is a top view of a photonic device structure prior to a metal etch, in accordance with another embodiment of the present invention.
Figure 22B:
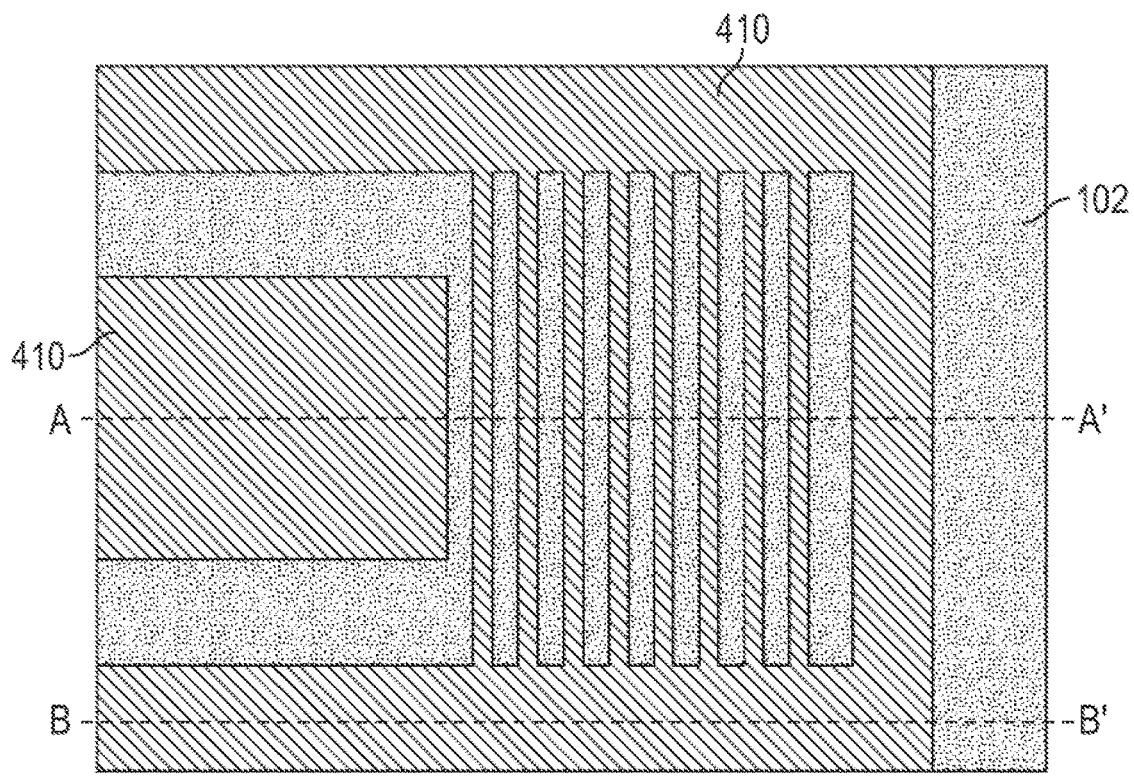
FIG. 22B shows a top view of the photonic device structure of FIG. 22A when cut along its depth, in accordance with another embodiment of the present invention.

FIG. 22A is a top view of a grating coupler 400 prior to a metal etch, in accordance with another embodiment of the present invention. Grating coupler 400 is shown as having a length of L, a width W and a depth D (See FIG. 22C) that extends out of the plane of the paper in the Z-direction. Top view of the grating coupler is shown as including dielectric 102 and metal-filled vias 120. FIG. 22B shows a top view 410 of the grating coupler when the grating coupler is cut along its depth D. Metal 410 and dielectric 102 are readily seen from FIG. 22B. It is understood that grating coupler 400 is formed using metal deposition, via formation, dielectric deposition and planarization techniques as described above.

Figure 22C:
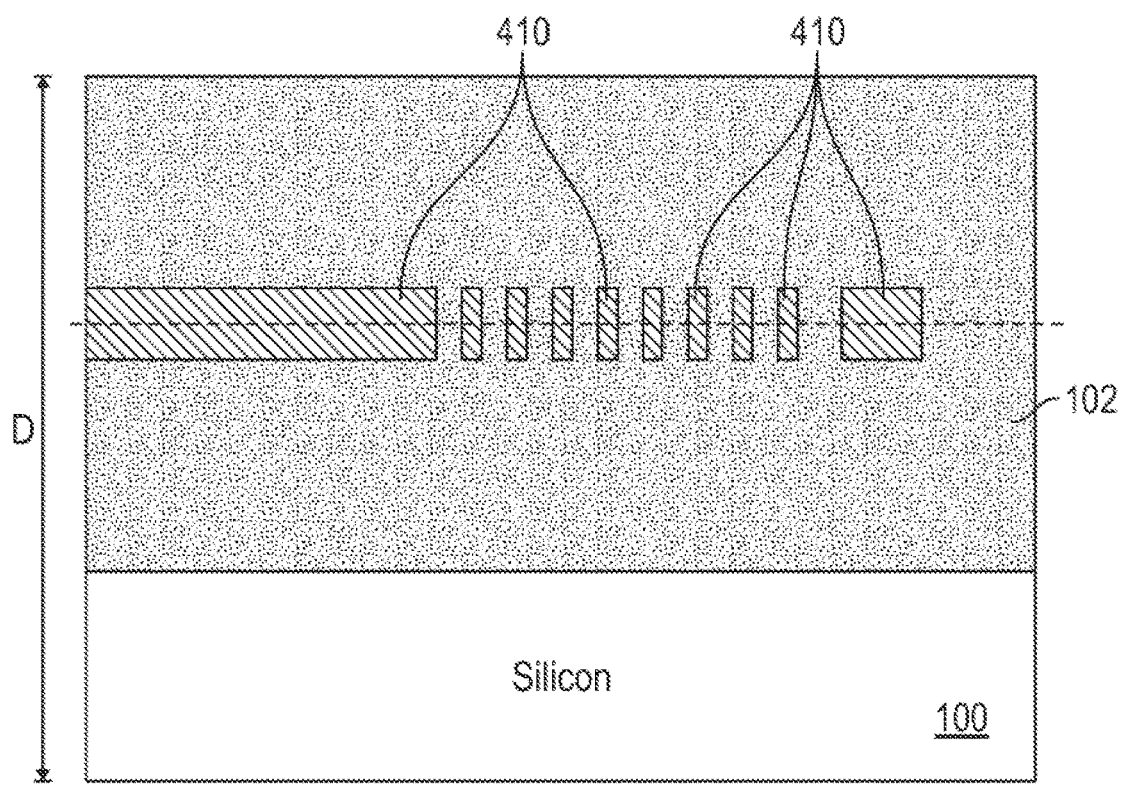
FIG. 22C is a cross-sectional view of the photonic device structure of FIG. 22A along a first direction, in accordance with another embodiment of the present invention.
Figure 22D:
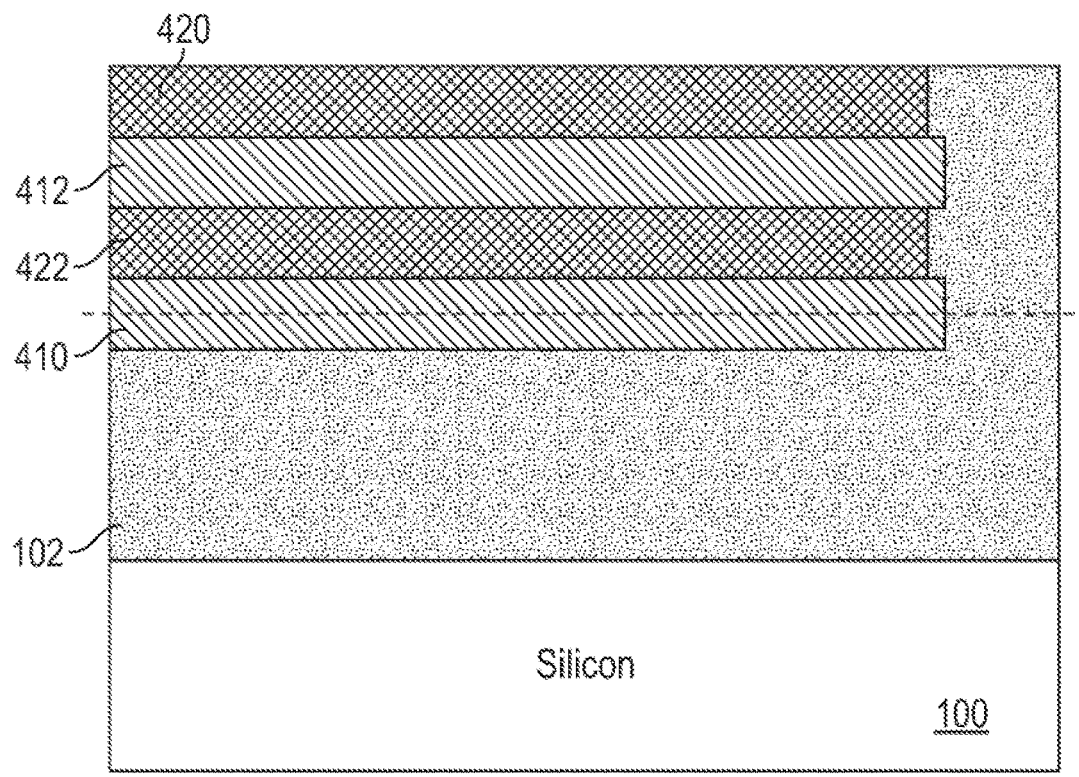
FIG. 22D is a cross-sectional view of the photonic device structure of FIG. 22A along a second direction, in accordance with another embodiment of the present invention.

FIG. 22C is a cross-sectional view along lines AA' of waveguide structure 400 when viewed in the direction of the shown arrows prior to metal etch. As is seen from FIG. 22C, grating coupler 400 is formed on silicon substrate 100 and includes metal traces 410 enclosed within dielectric 102. FIG. 22D is a cross-sectional view along lines BB' of waveguide structure 400 viewed in the direction of the shown arrows prior to a metal etch. As is seen from FIG. 22D, grating coupler 400 is shown as including two metal layers 410, 412 and metal-filled vias 420, 422.

Figure 22E:
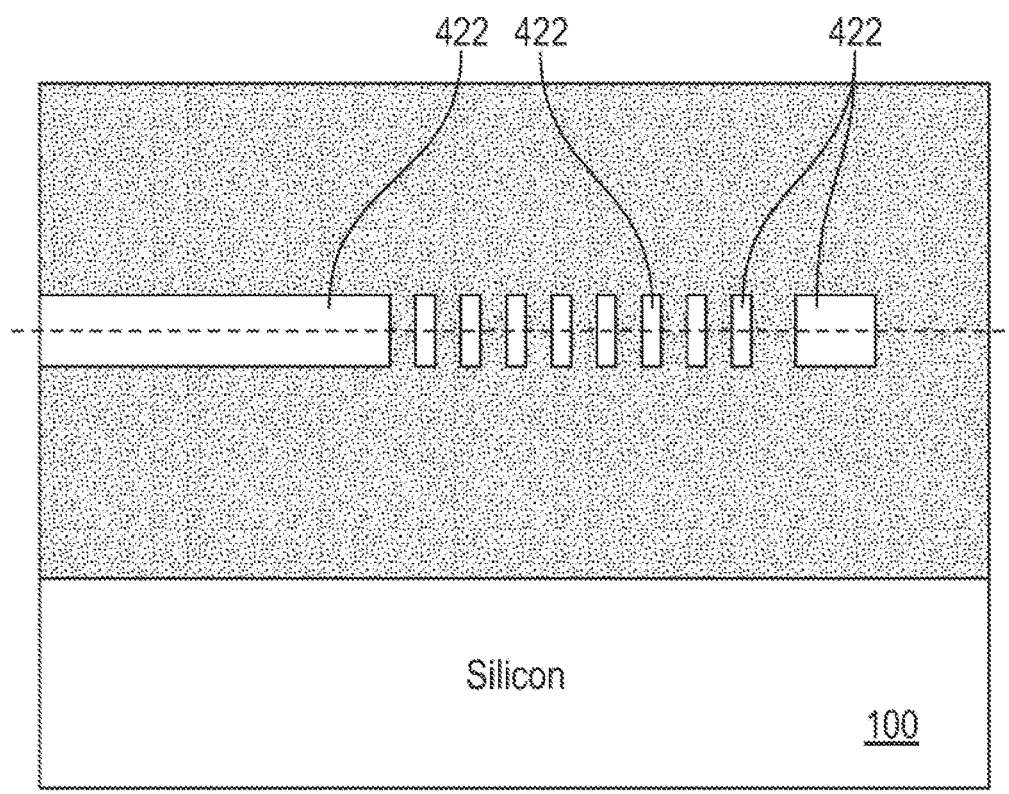
FIG. 22E is a cross-sectional view of the photonic device structure of FIG. 22A along the first direction after a metal etch, in accordance with another embodiment of the present invention.
Figure 22F:
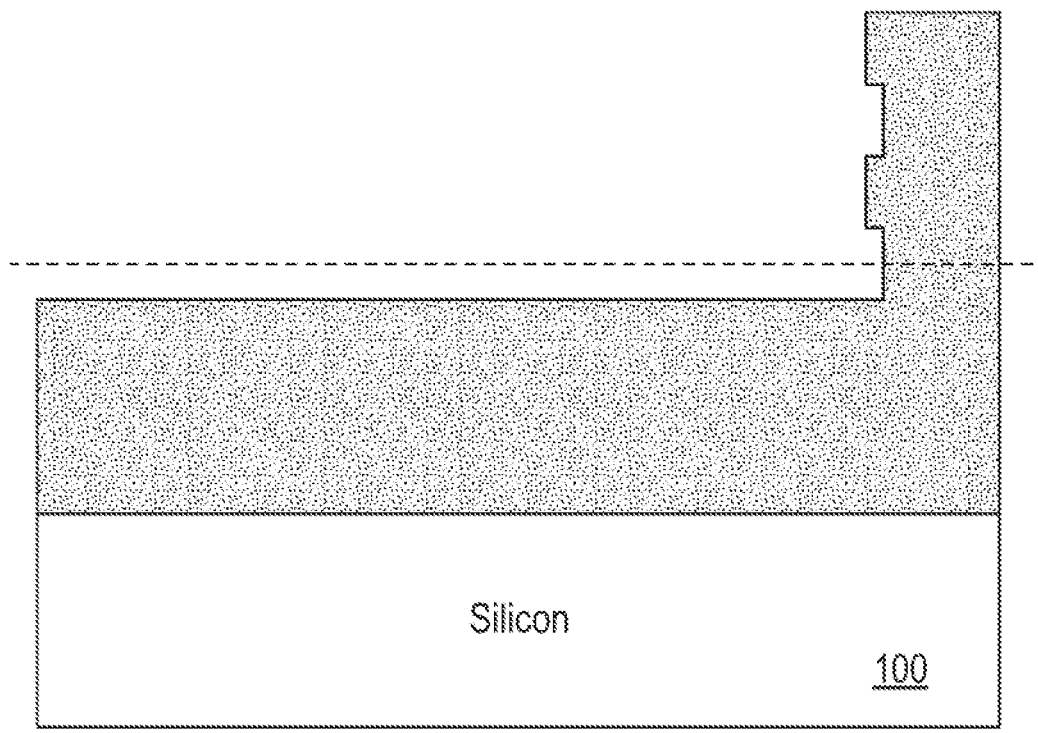
FIG. 22F is a cross-sectional view of the photonic device structure of FIG. 22A along the second direction after a metal etch, in accordance with another embodiment of the present invention.

FIG. 22E is a cross-sectional view along lines AA' of waveguide structure 400 viewed in the direction of the shown arrows after the metal etch. As is seen from FIG. 22E, metal 410 has been removed following the etch process creating openings 422. FIG. 22F is a cross-sectional view along lines BB' of waveguide structure 400 viewed in the direction of the shown arrows after the metal etch.

Figure 22G:
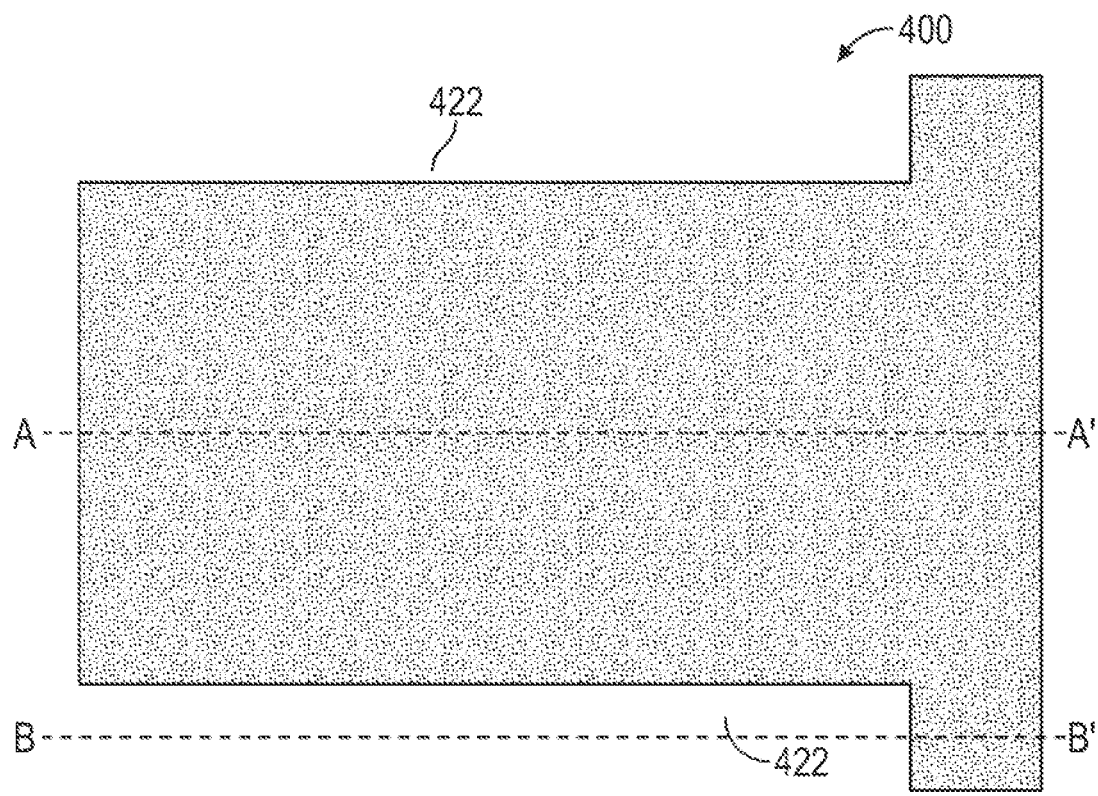
FIG. 22G is a top view of the photonic device structure of FIG. 22A after a metal etch, in accordance with one embodiment of the present invention.
Figure 22H:
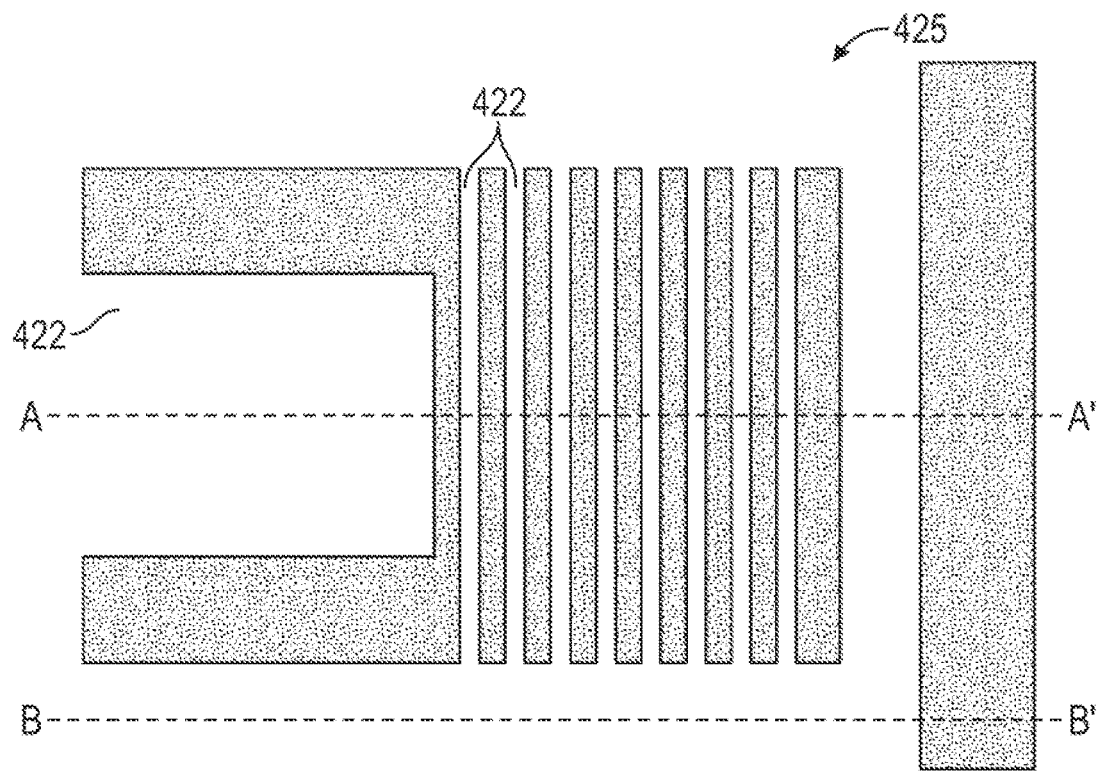
FIG. 22H is a cross sectional view of the photonic device structure of FIG. 22A after a metal etch, in accordance with another embodiment of the present invention.

FIG. 22G is a top view of grating coupler 400 following a metal etch process. Comparing FIGS. 22A and 22G it is seen that following the metal etch the metal disposed in vias 120 are removed. FIG. 22H shows a top view 425 of the grating coupler when the grating coupler is cut along its depth D following a metal etch process. Comparing FIGS. 22B and 22H it is seen that following the metal etch, metal 410 is removed.

Figure 22I:
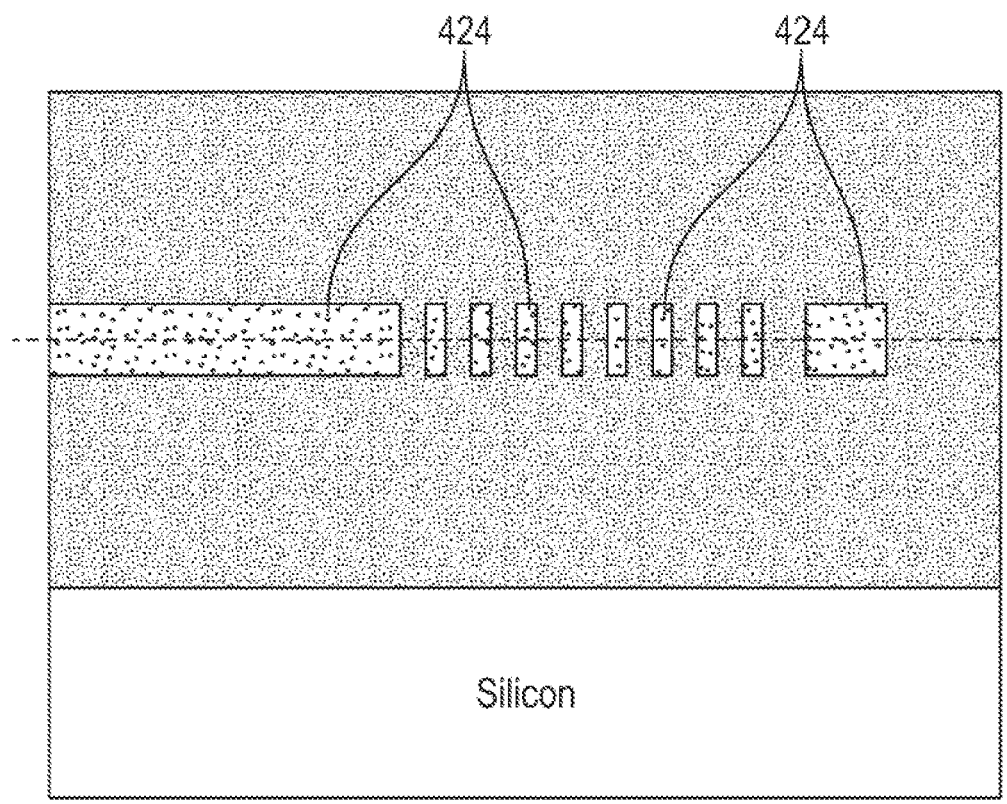
FIG. 22I is a first cross sectional view of the photonic device structure of FIG. 22A following the disposition of one or more materials in the openings created as a result of the metal etch, in accordance with one embodiment of the present invention.
Figure 22J:
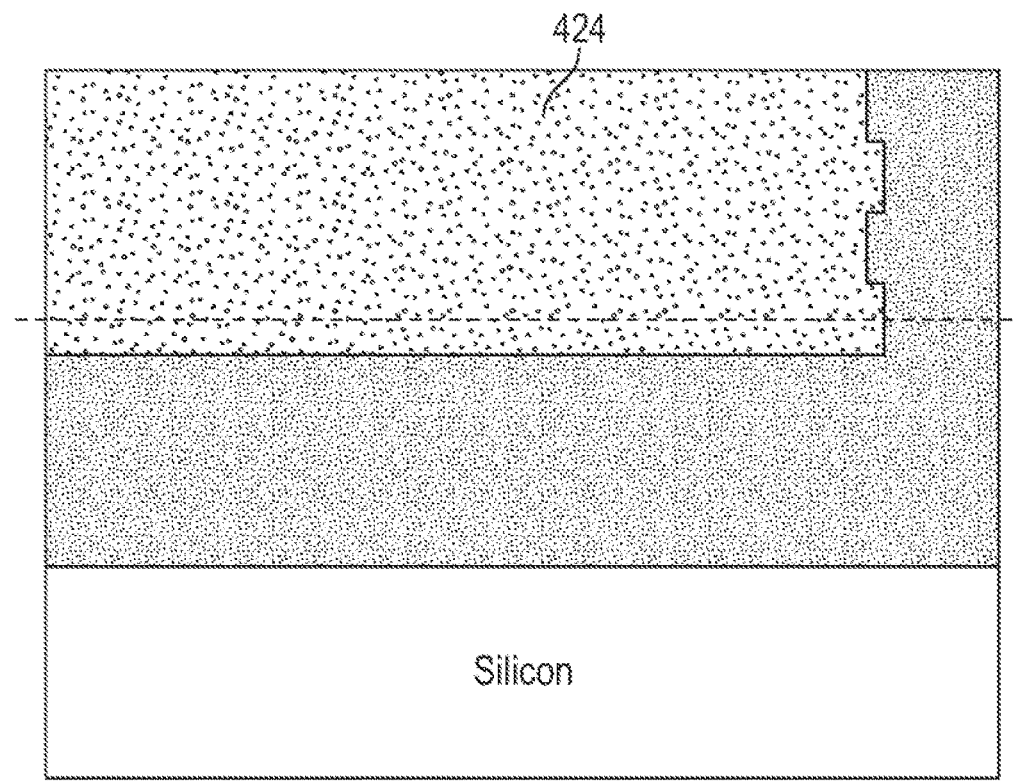
FIG. 22J is a second cross sectional view of the photonic device structure of FIG. 22A following the disposition of one or more materials in the openings created as a result of the metal etch, in accordance with one embodiment of the present invention.
Figure 22K:
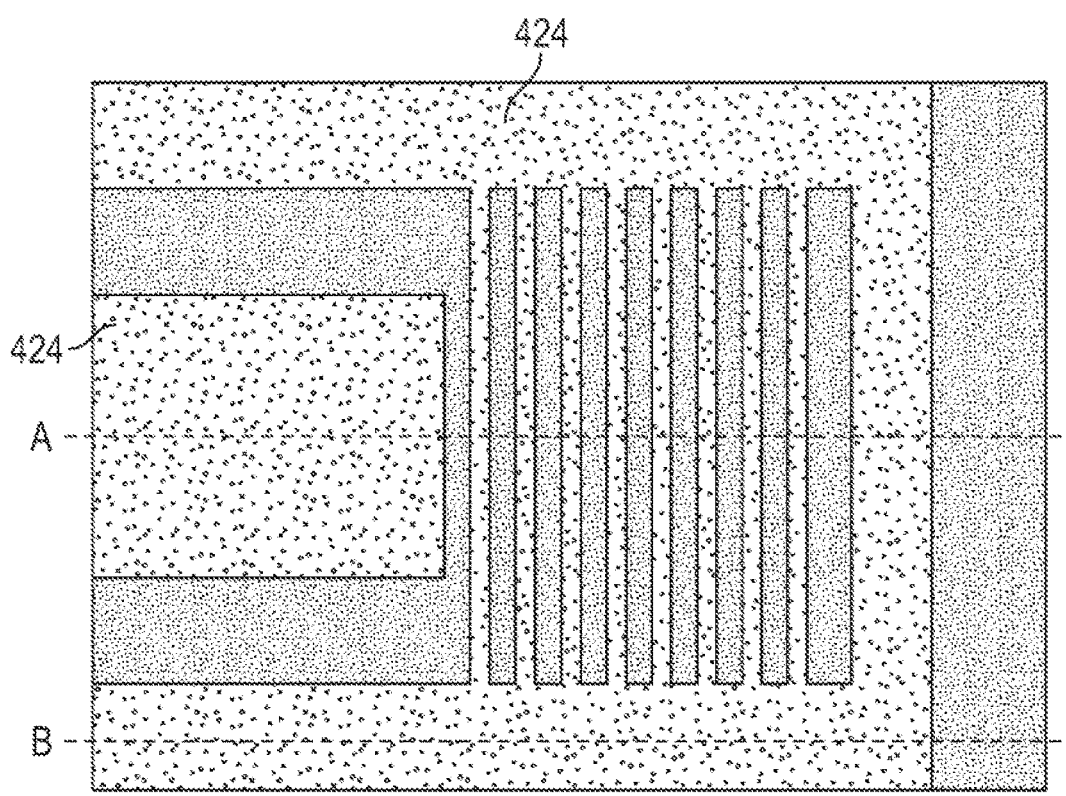
FIG. 22K is a third cross sectional view of the photonic device structure of FIG. 22A following the disposition of one or more materials in the openings created as a result of the metal etch, in accordance with one embodiment of the present invention.
Figure 22L:
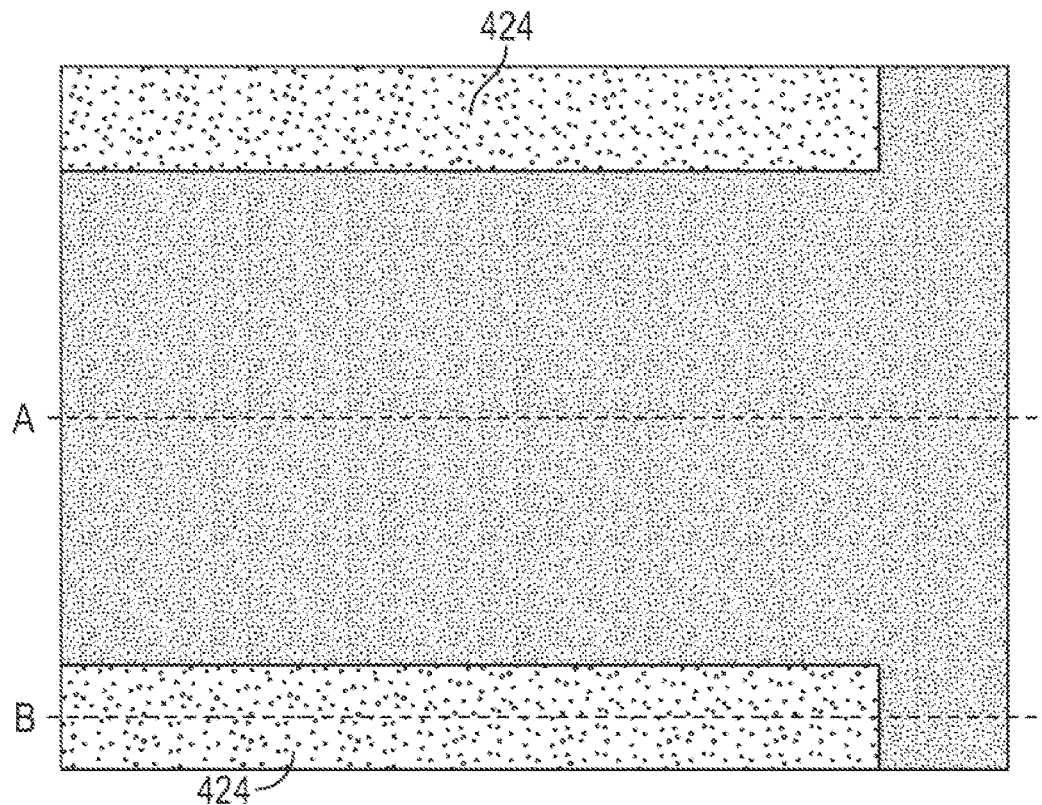
FIG. 22L is a top view of the photonic device structure of FIG. 22A following a metal etch, in accordance with one embodiment of the present invention.

After the metal is etched away, additional material is injected into the grating coupler to fill in the voids created as a result of the metal etch. FIG. 22I is similar to FIG. 22E except that in FIG. 22I, openings 422 have been filled with material 424. FIG. 22J is similar to FIG. 22F, except that in FIG. 22J, the openings created as a result of the metal etch have been filled with material 424. FIG. 22K is similar to FIG. 22H except that in FIG. 22K openings 422 have been filled with material 424. FIG. 22L is similar to FIG. 22G, except that in FIG. 22L, openings 422 created as a result of the metal etch have been filled with material 424.

Figure 23A:
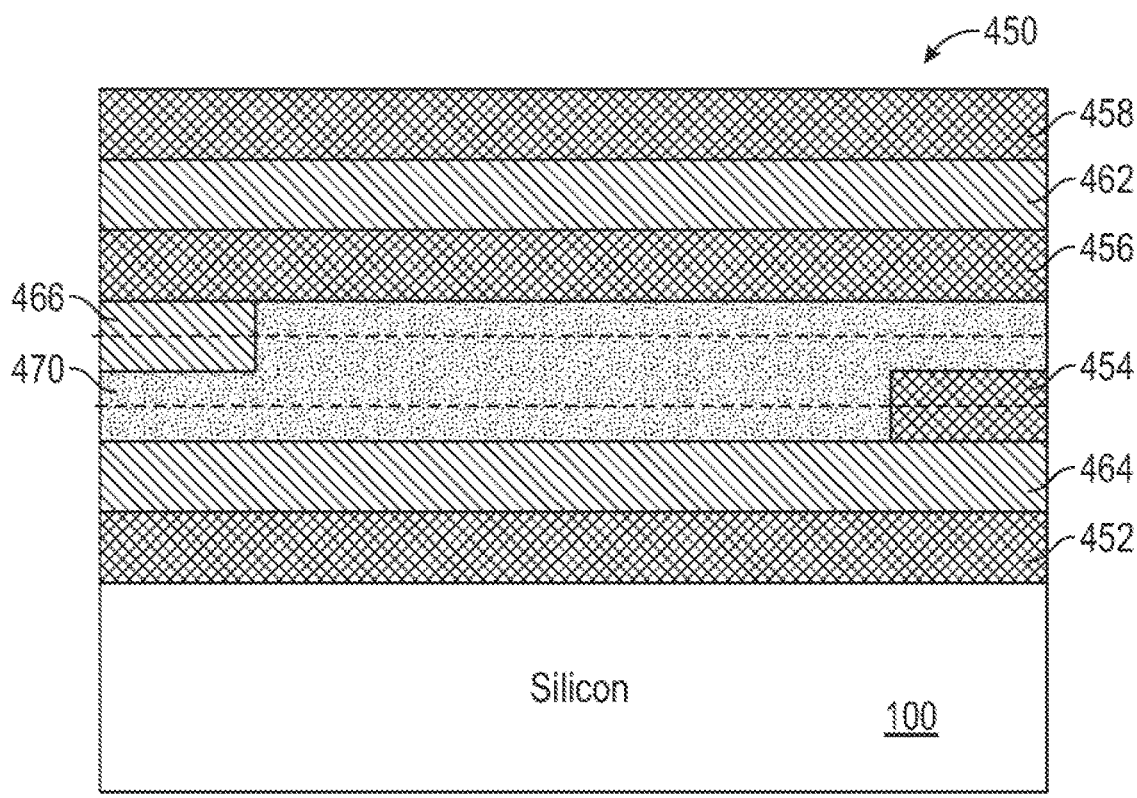
FIGS. 23A-23D show various views of an interlayer-coupler following completion of a number of processing steps, in accordance with one embodiment of the present invention.
Figure 23B:
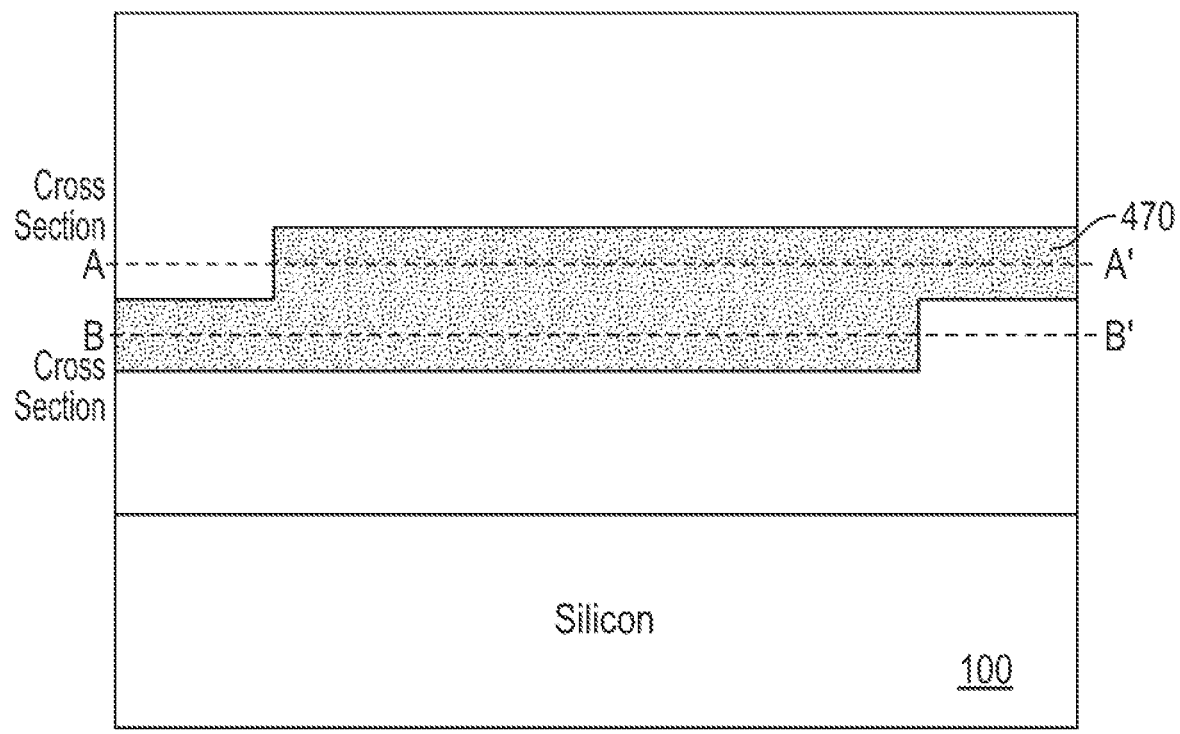
Figure 23C:
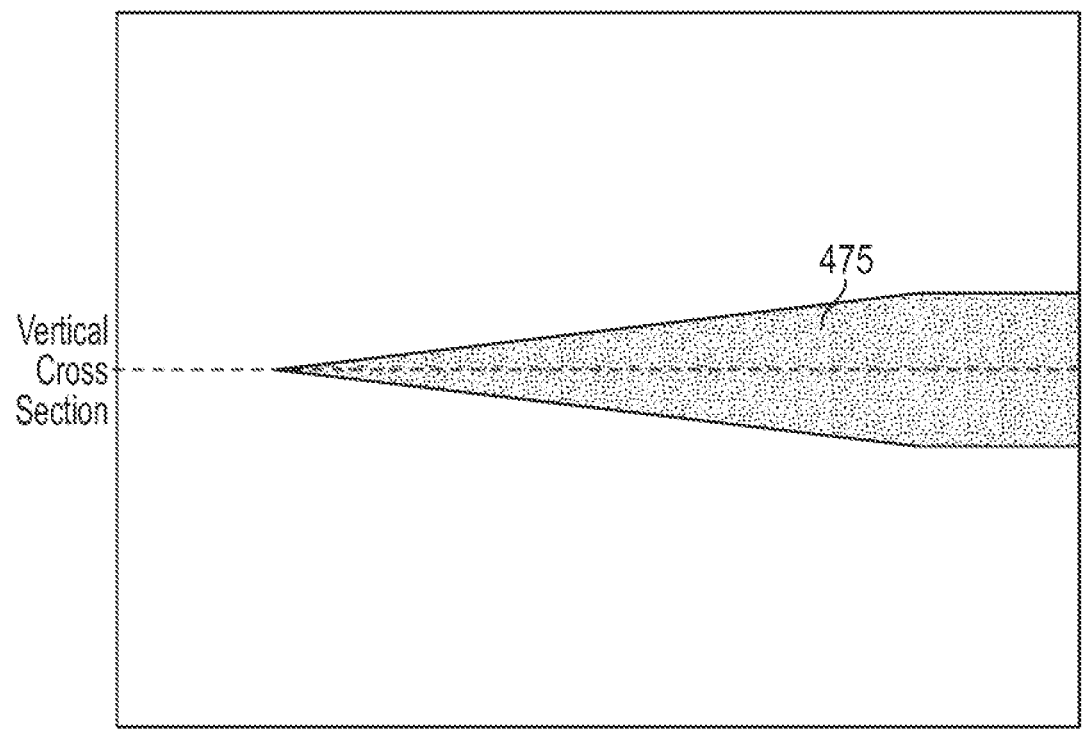
Figure 23D:
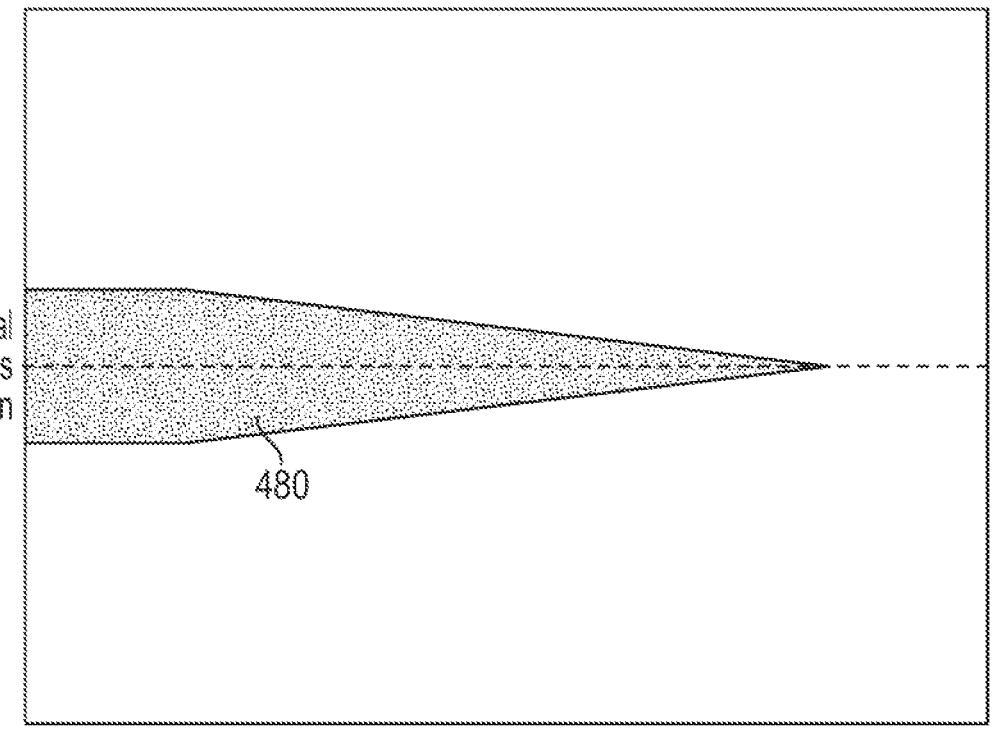

FIG. 23A is a cross-sectional view of an inter-layer photonic coupler 450, in accordance with one embodiment of the present invention, prior to a metal etch. Inter-layer photonic coupler 450 is shown as including metal-filled vias 452, 454, 456, 458, metal layers 464, 466, 462 and dielectric layer 470. The various steps performed in forming inter-layer photonic coupler 450 are similar to those described above with reference to FIGS. 4A-4I. FIG. 23B is a cross-sectional view of inter-layer photonic coupler 450 after a metal etch. FIG. 23C is a top view of the cross-section of the inter-layer photonic coupler 450 shown in FIG. 23B when cut along lines AA'. Coupler 475 shown in FIG. 23C has a tapered shape. FIG. 23D is a top view of the cross-section of the inter-layer photonic coupler 450 shown in FIG. 23B when cut along lines BB'. Coupler 480 shown in FIG. 23C has a tapered shape. Couplers 475 and 480 are adapted to couple the light propagating therethrough. Dielectric structure 40 that includes tapered waveguides 475 and 480 is physically connected to and thus supported by the substrate outside the view of the figure and is not shown for clarity. Tapered waveguides 475 and 480 may be rib waveguides, channel waveguides, and the like.

Figure 24A:
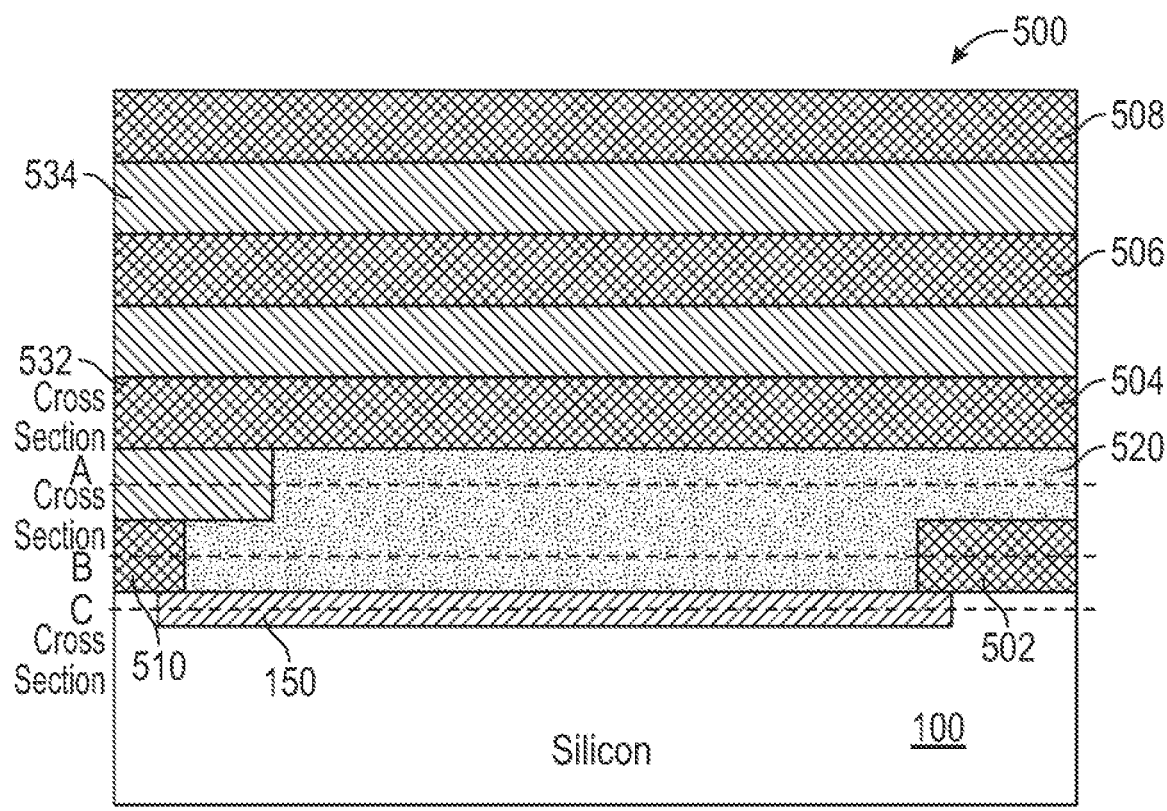
FIGS. 24A-24D show various views of a photo detector following completion of a number of processions steps, in accordance with one embodiment of the present invention.

FIG. 24A is a cross-sectional view of a photo detector 500, in accordance with one embodiment of the present invention, prior to a metal etch. Photo detector 500 is shown as including, active (doped) region 150 formed in silicon substrate 100, metal-filled vias 502, 504, 506, 508, metal layers 532, 534 and dielectric layer 520. The various steps performed in forming inter-layer photonic coupler 450 are similar to those described above with reference to FIGS. 4A-4I.

Figure 24B:
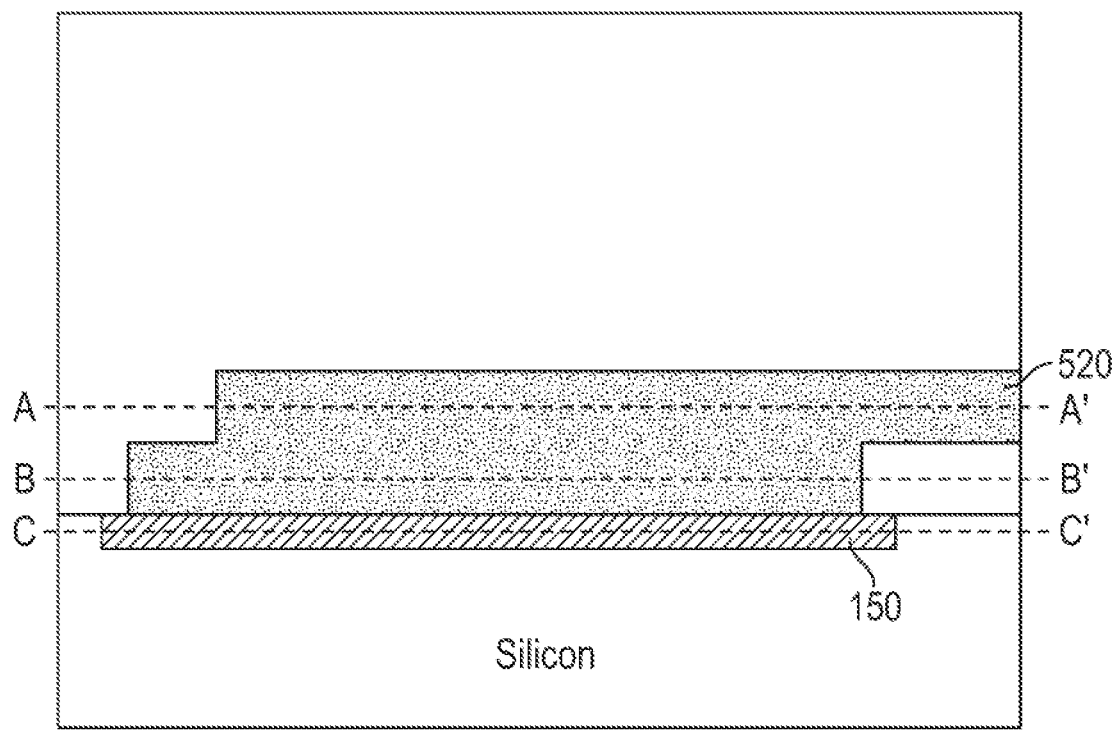
Figure 24C:
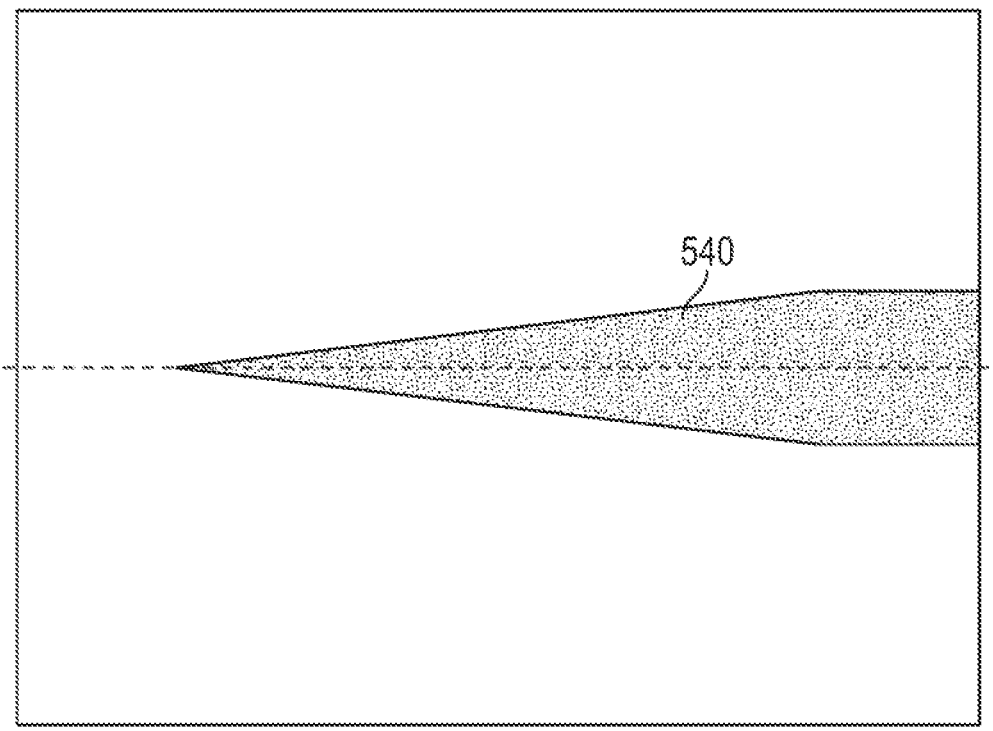
Figure 24D:
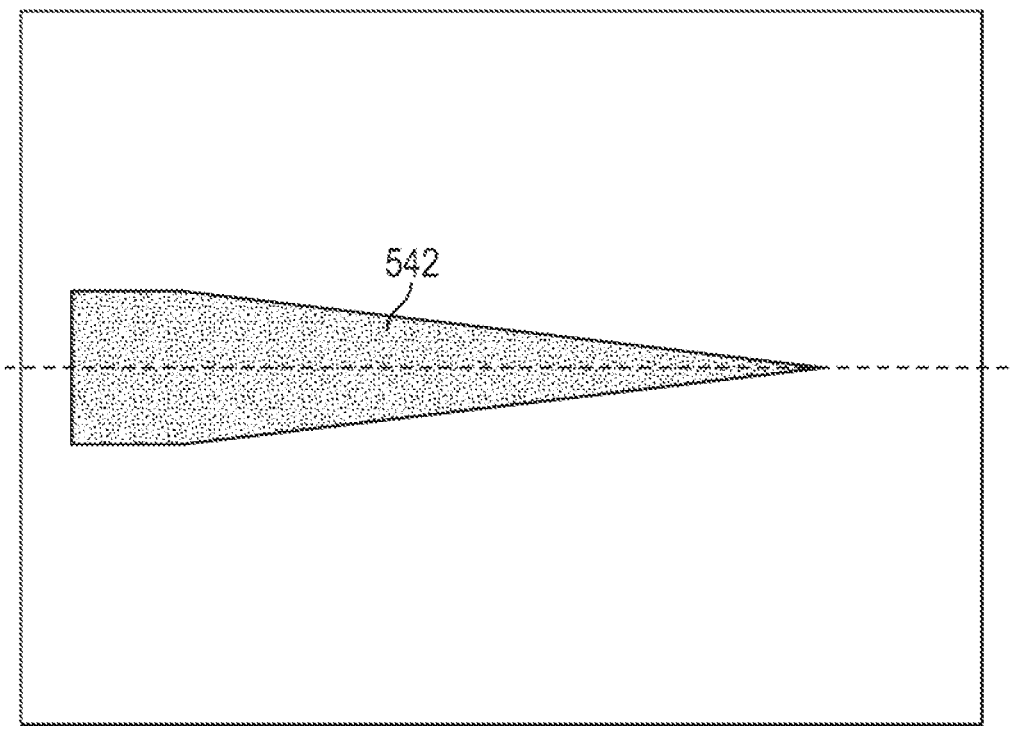

FIG. 24B is a cross-sectional view of photo detector 500 after a metal etch. As is seen from FIG. 24B, after the metal etch, dielectric layer 520 and active region 150 remain. FIG. 24C is a top view of the cross-section of photo detector 500 shown in FIG. 24B when cut along lines AA'. Tapered waveguide 540 is adapted to receive the light entering the waveguide from the right. FIG. 24D is a top view of the cross-section of photo detector 500 shown in FIG. 24B when cut along lines BB'. Tapered waveguide 542 is adapted to receive the light propagating through tapered waveguide 540 which is then received by active region 150.

Figure 25A:
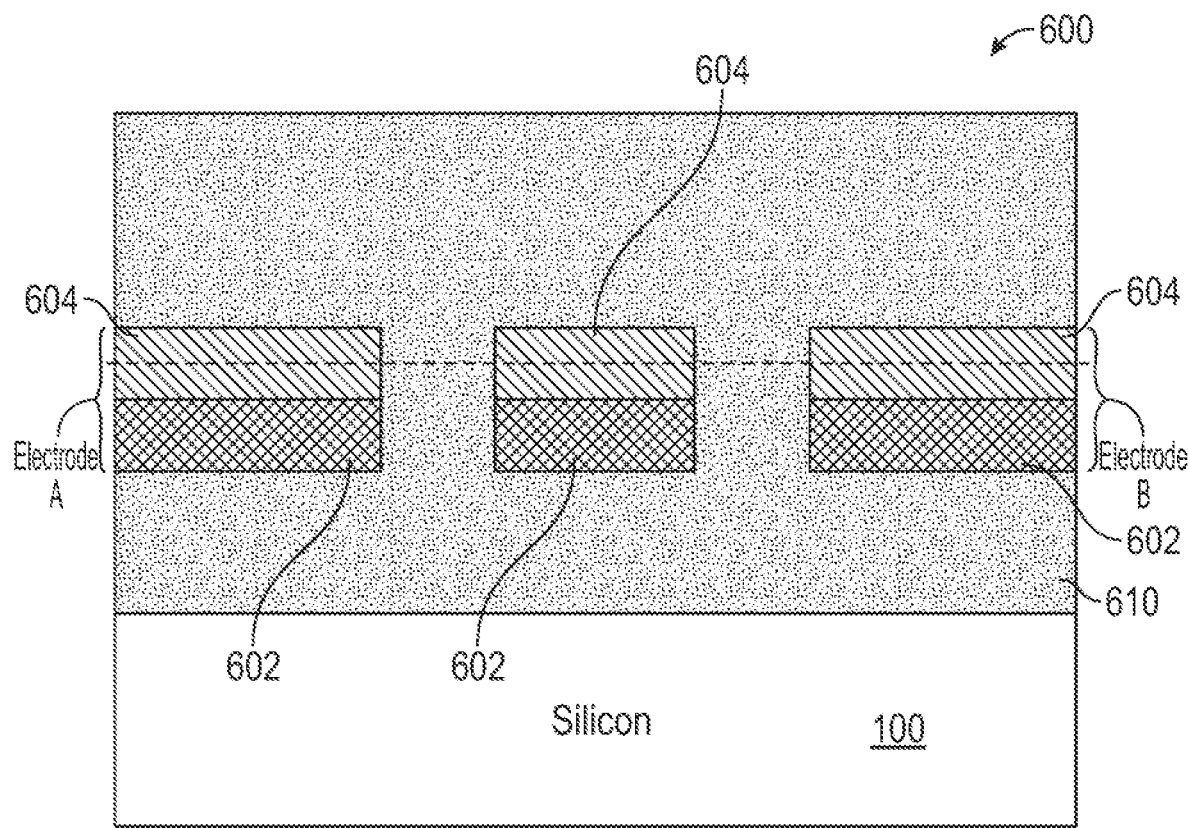
FIGS. 25A-25L show various views of a phase modulator following completion of a number of processing steps, in accordance with one embodiment of the present invention.

FIG. 25A is a first cross sectional view of a phase modulator 600, in accordance with one embodiment of the present invention, prior to a metal etch. Phase modulator 600 is formed in silicon substrate 100, and in this cross-sectional view is shown as including metal-filled vias 602, metal layer 604 and dielectric 610. The various steps performed in forming phase modulator 500 are similar to those described above with reference to FIGS. 4A-4I. Via 602 and metal layer 604 positioned along the left edge of phase modulator 600 form a first electrode A, and via 602 and metal layer 604 positioned along the right edge of phase modulator 600 form a second electrode B.

Figure 25B:
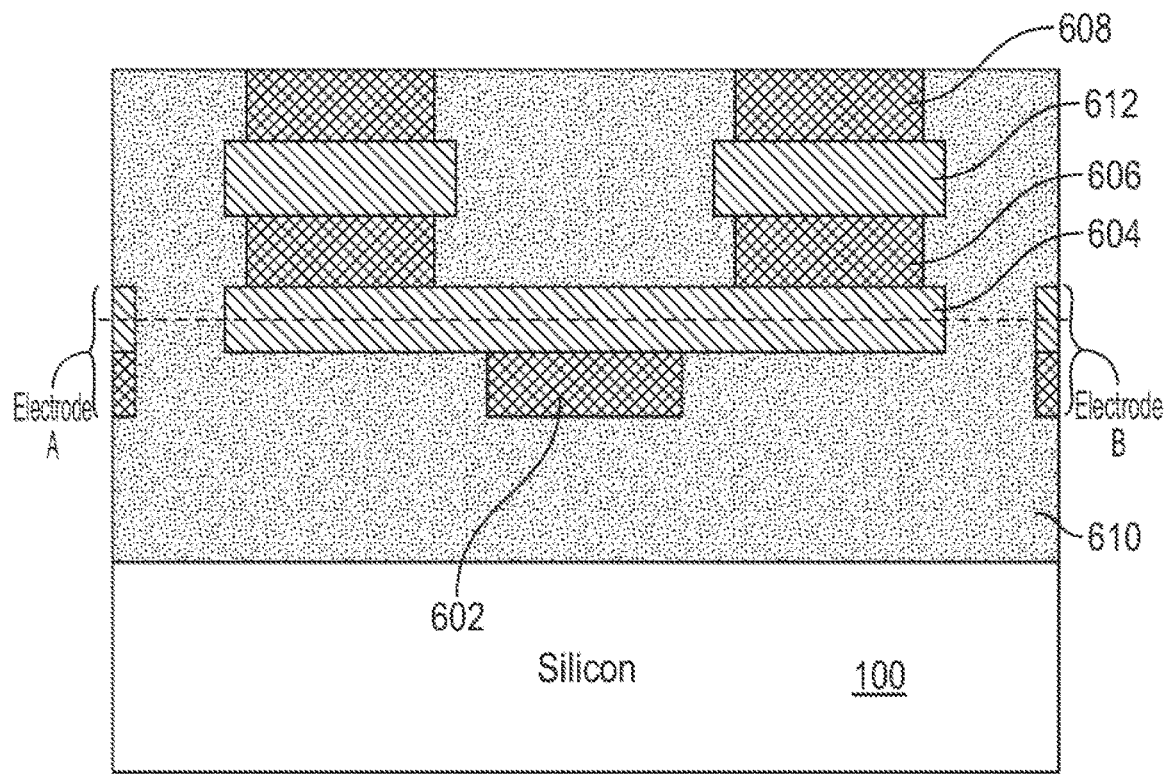
Figure 25C:
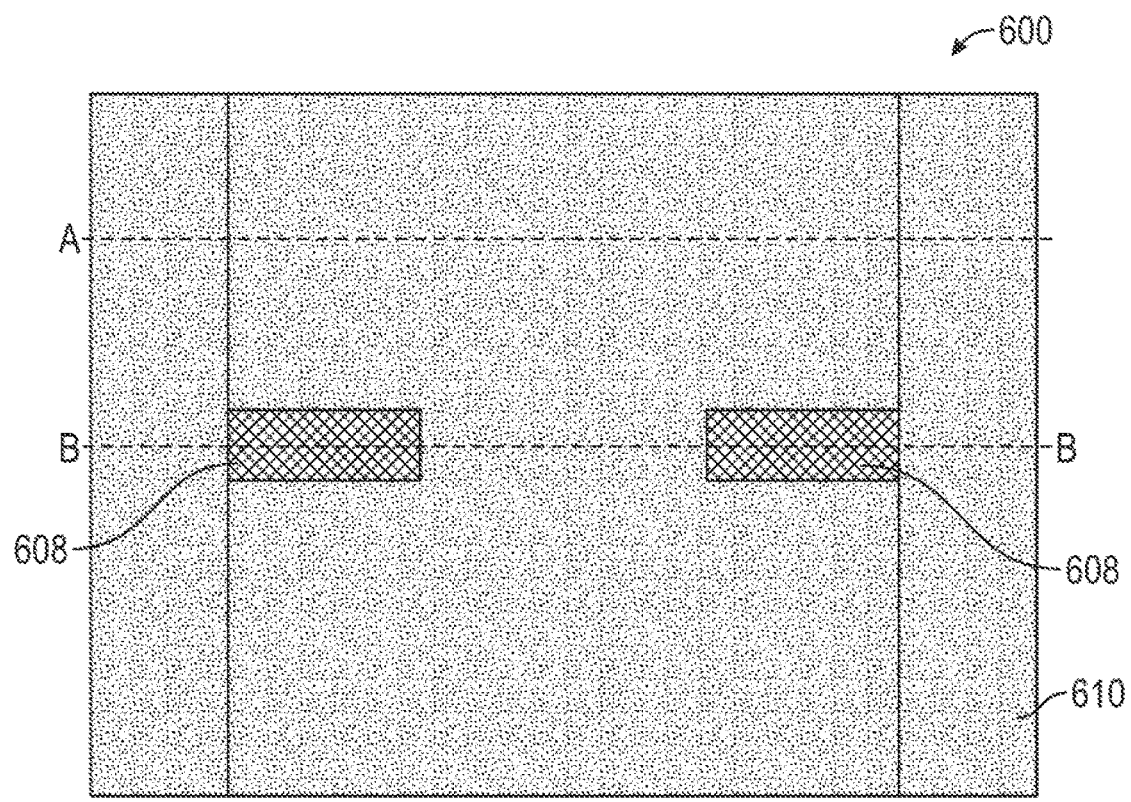

FIG. 25B is a second cross sectional view of phase modulator 600, prior to a metal etch. In this cross-sectional view, the phase modulator is shown as including metal-filled vias 602, 606, 608, metal layers 604, 612 and dielectric 610. Also shown are terminals A and B. FIG. 25C is a top view of phase modulator 600 showing dielectric 610 and metal-filled vias 608.

Figure 25D:
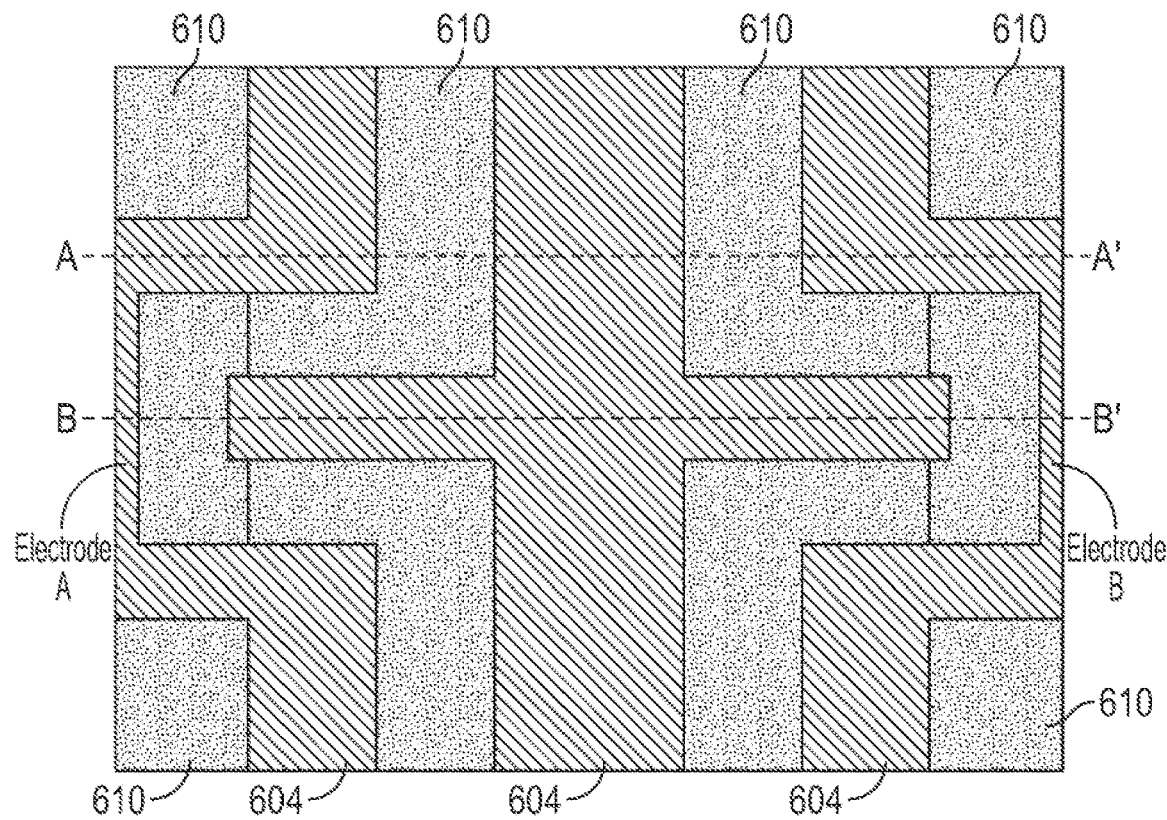

FIG. 25D is a view from the top of phase modulator 600 shown in FIG. 25C when the phase modulator is cut along its depth in a horizontal direction and parallel to the surface of the substrate 100 prior to a metal etch. Shown in FIG. 25D are metal 604 and dielectric 610.

Figure 25E:
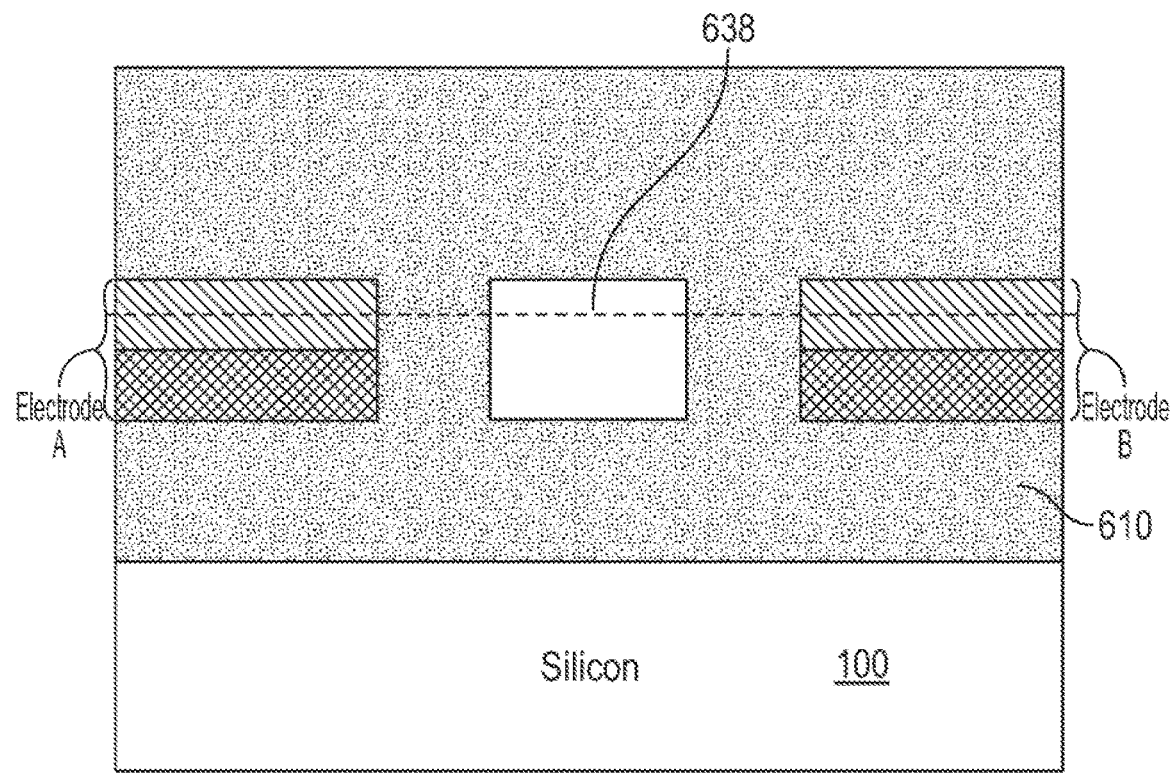
Figure 25F:
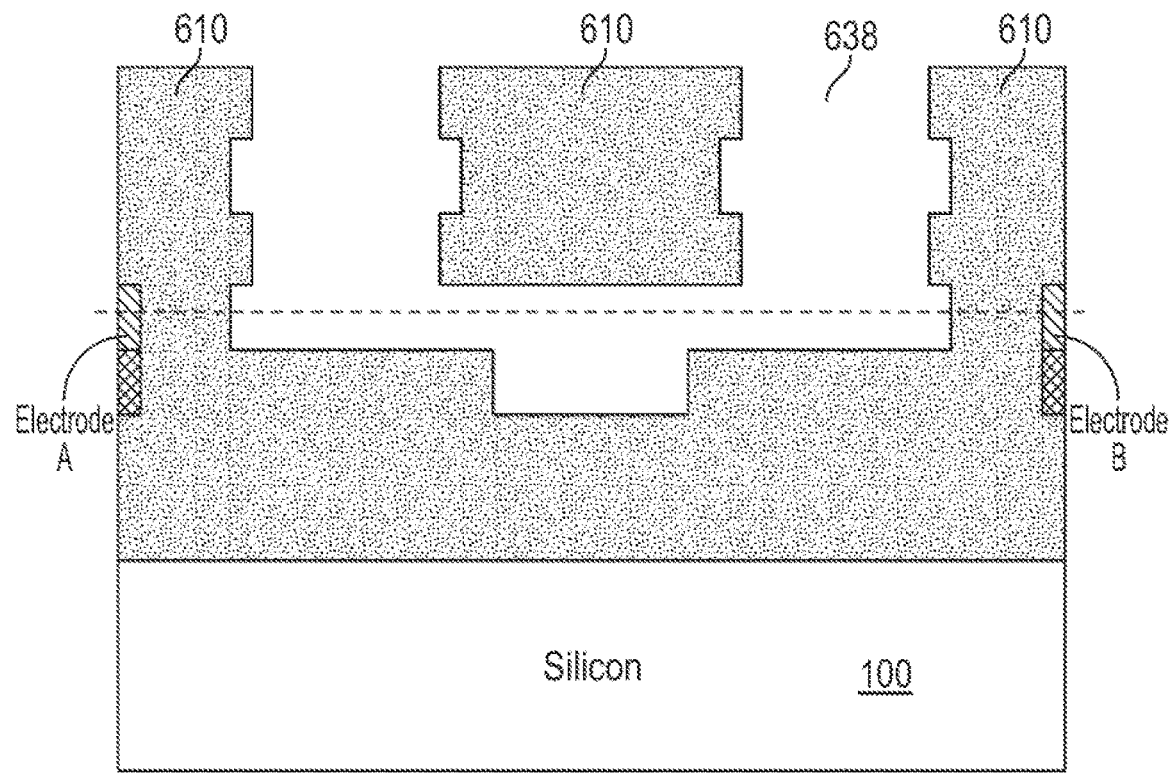
Figure 25G:
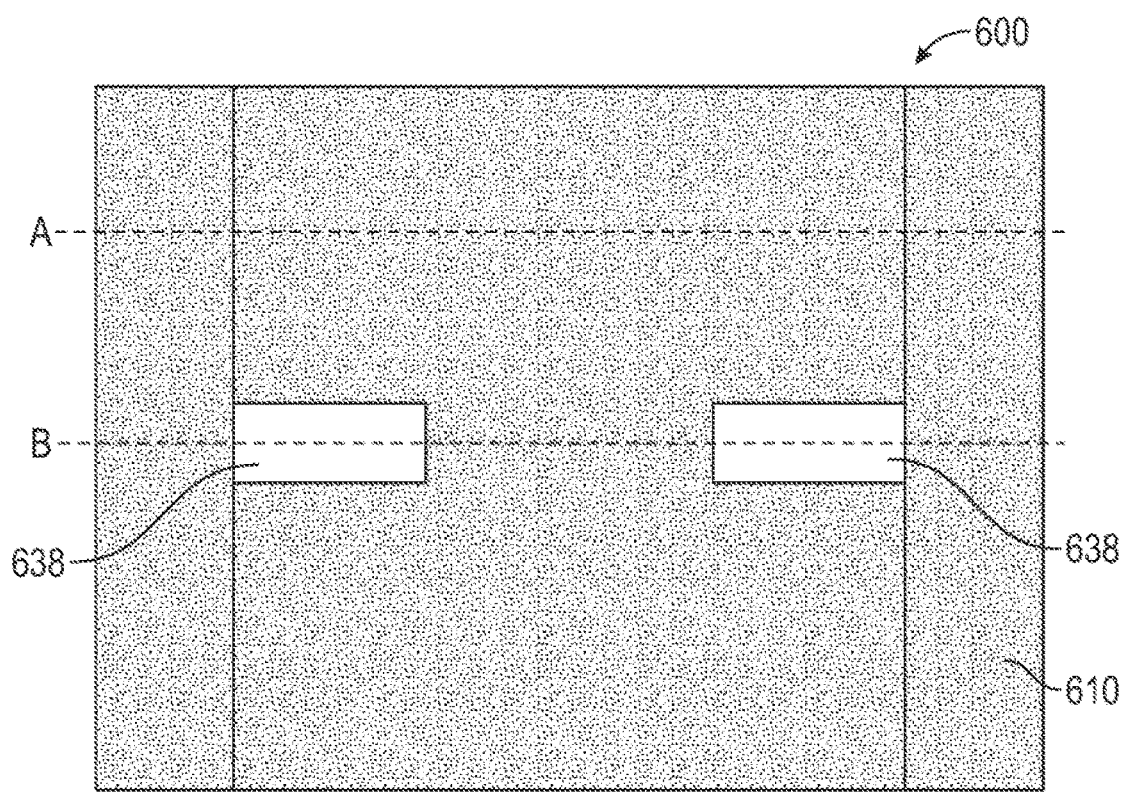

FIG. 25E is the first cross sectional view of phase modulator 600, after a metal etch. Comparing FIG. 25E to FIG. 25A it is seen that metal 604 and via 602 enclosed by dielectric 610 are removed thus resulting in the formation of opening 638. It is understood that electrodes A and B are passivated and thus are not etched. FIG. 25F is the second cross sectional view of phase modulator 600, after a metal etch. Comparing FIG. 25F to FIG. 25B it is seen that metals 604, 612 and metal-filled vias 602, 606 and 608 enclosed by dielectric 610 are removed. FIG. 25G is a top view pf phase modulator 600 after the metal etch. Comparing FIGS. 25C and 25G, it is seen that metal-filled vias 608 have been etched thereby creating openings 638.

Figure 25H:
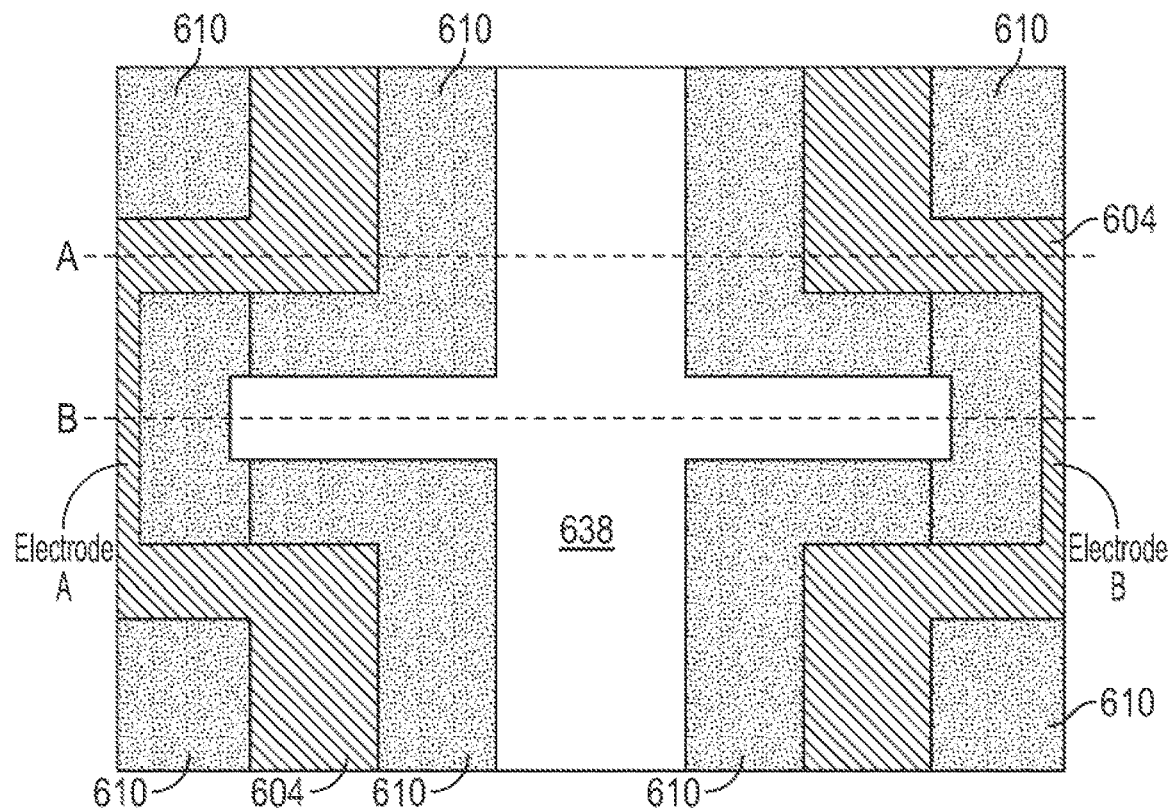

FIG. 25H is the same view of phase modulator 600 as FIG. 25D but after a metal etch. It is understood that electrodes A and B are passivated and thus are not etched during the etch process as the metal traces forming these two electrodes are passivated. Also shown in FIG. 25H is dielectric 610 and opening 638.

Figure 25I:
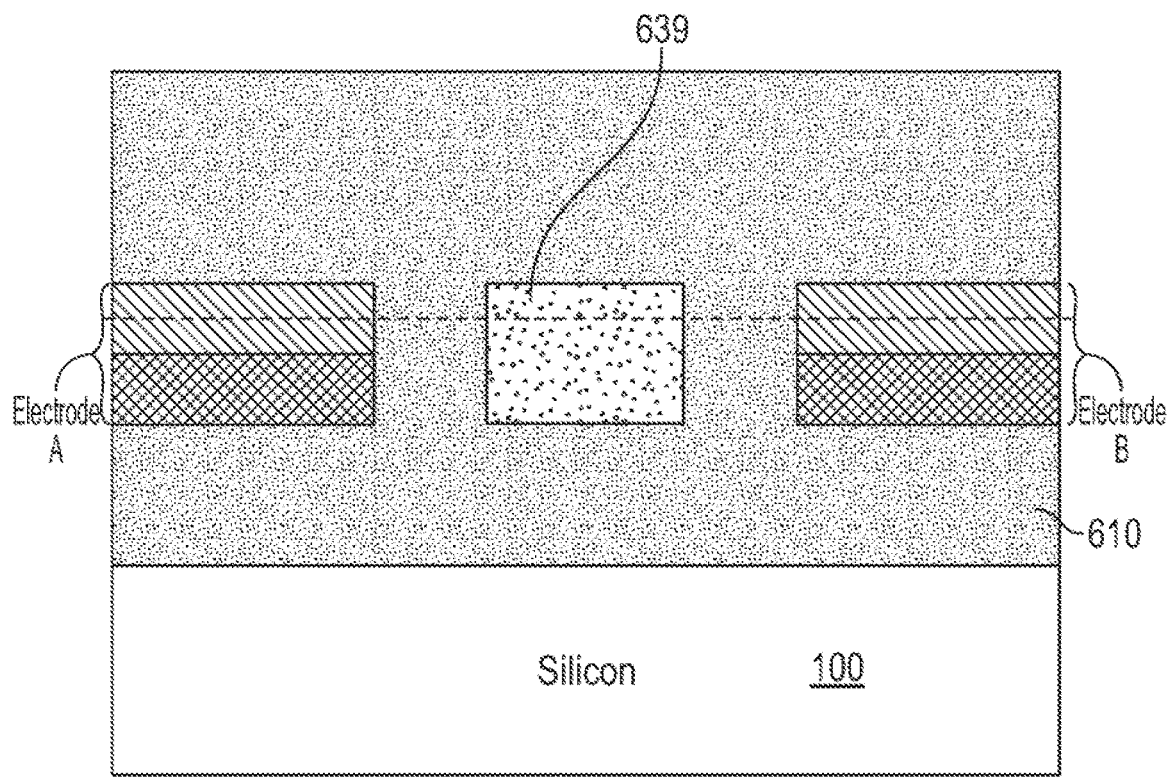
Figure 25J:
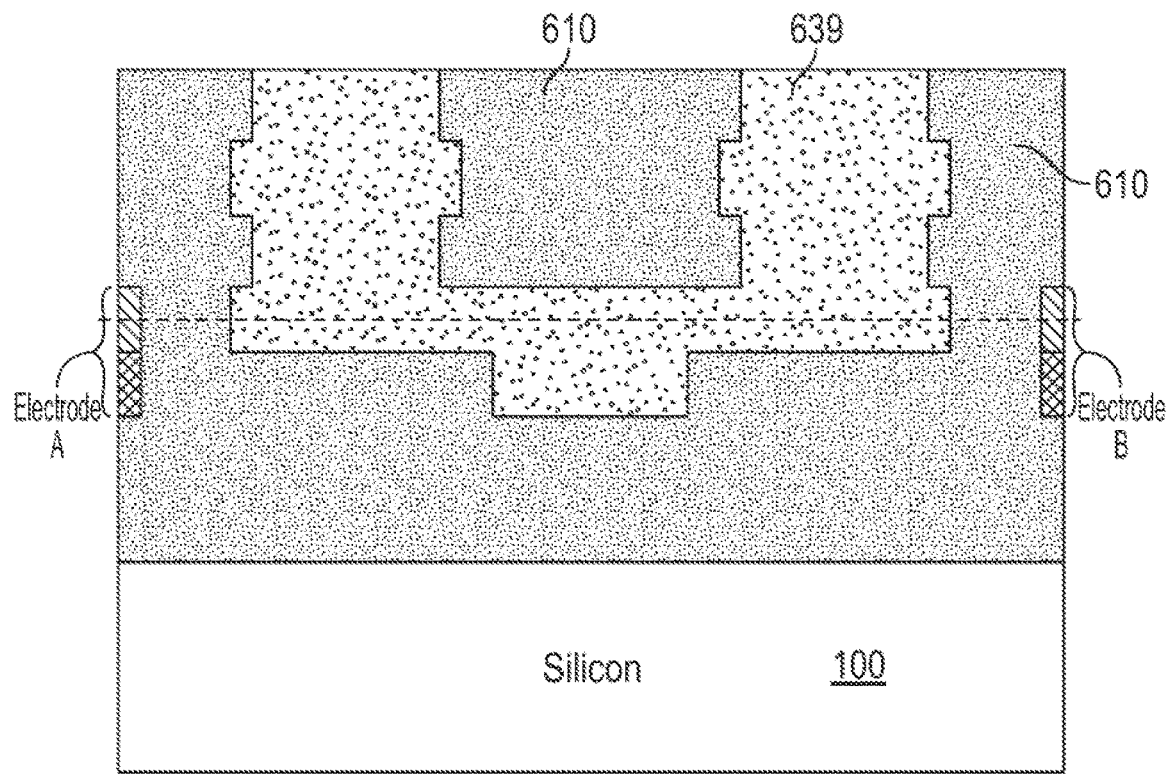
Figure 25K:
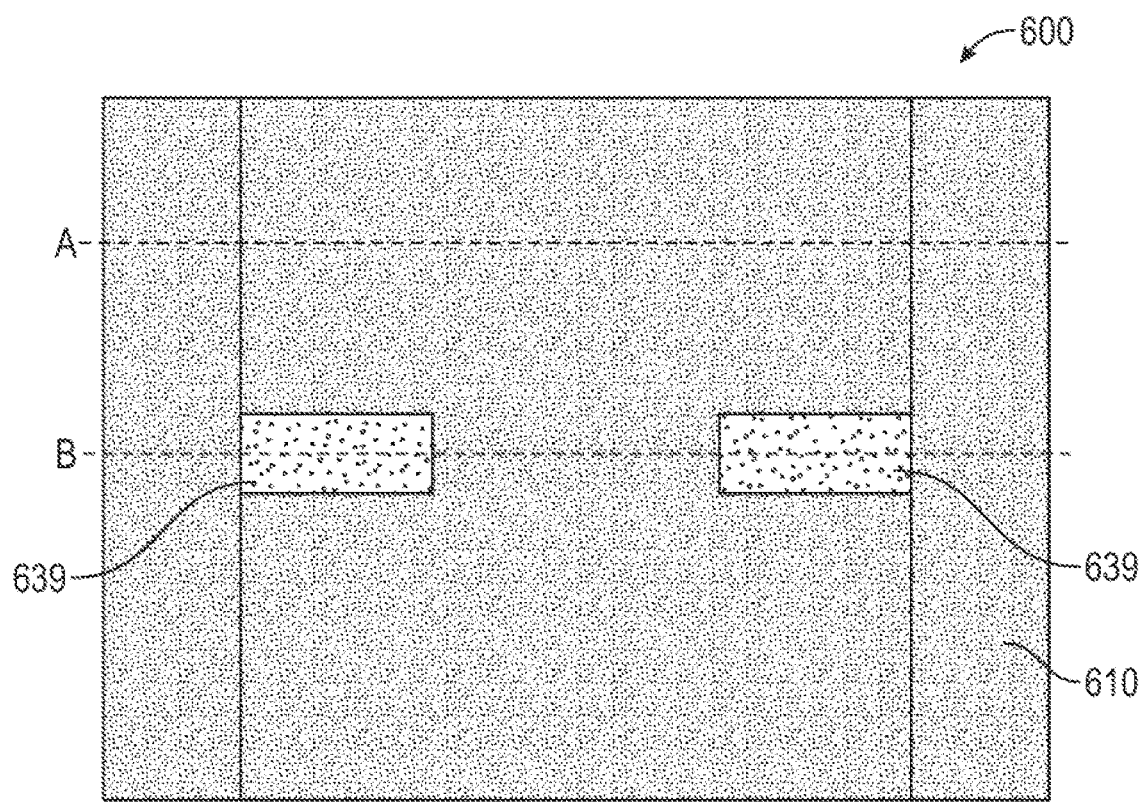
Figure 25L:
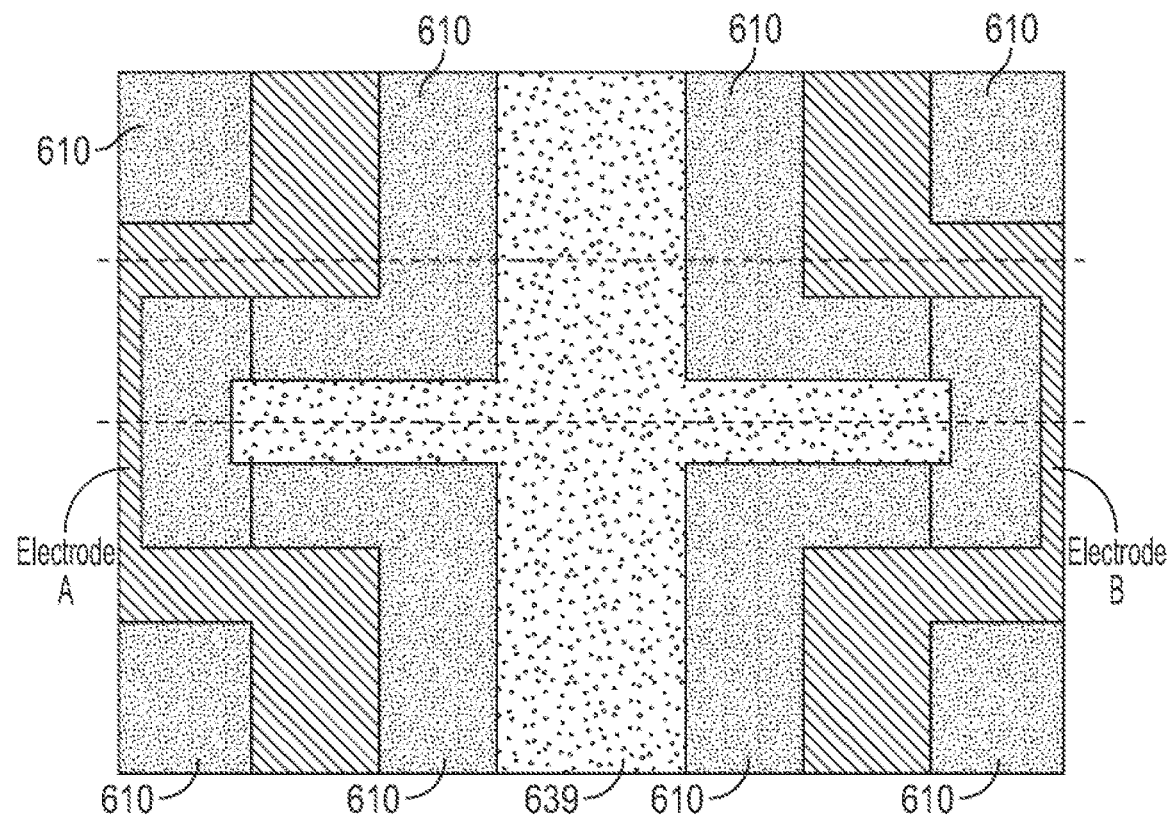

FIG. 25I is the same view of phase modulator 600 as FIG. 25E except that to form the phase modulator of FIG. 25I, a material 639 has been injected into the phase modulator to fill in the opening 638. FIG. 25J is the same view of phase modulator 600 as FIG. 25F except that to form the phase modulator of FIG. 25J, a material 639 has been injected into the phase modulator to fill in the opening 638. FIG. 25K is the same view of phase modulator 600 as FIG. 25G except that to form the phase modulator of FIG. 25K, a material 639 has been injected into the phase modulator to fill in the opening 638. FIG. 25L is the same view of phase modulator 600 as FIG. 25H except that to form the phase modulator of FIG. 25L, a material 639 has been injected into the phase modulator to fill in the opening 638.

Figure 26A:
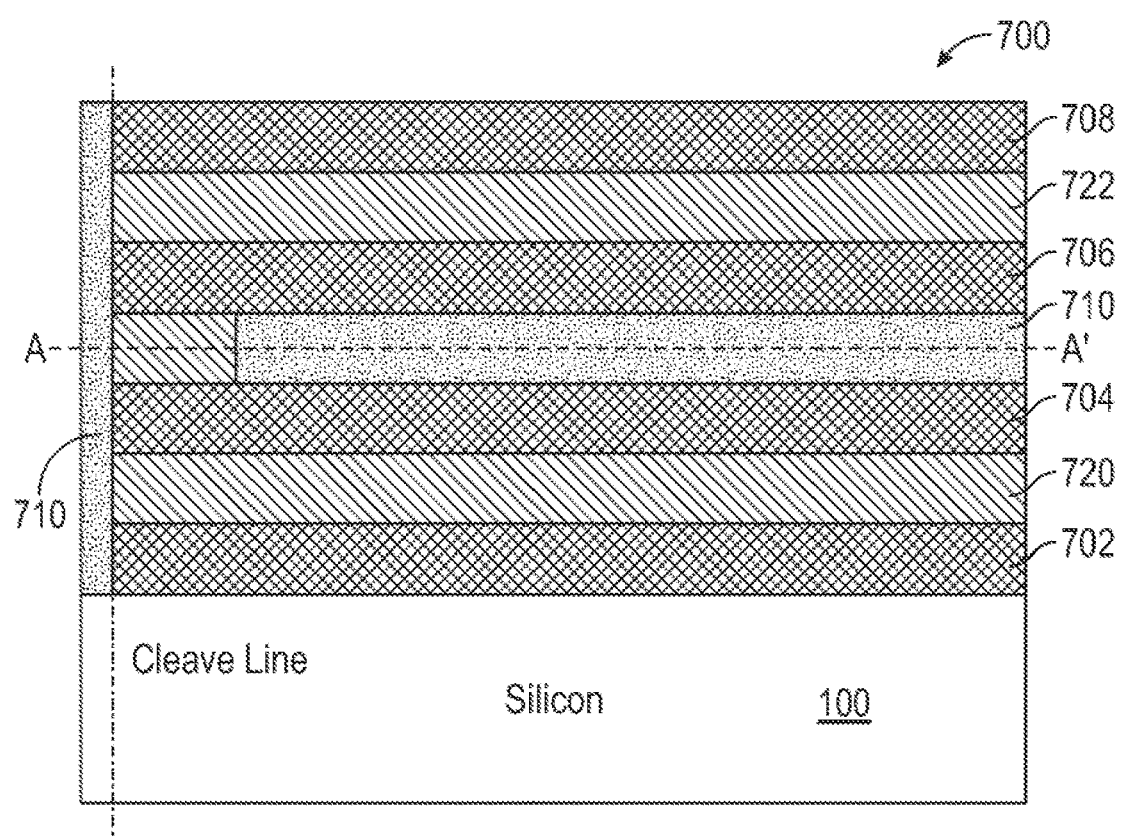
FIGS. 26A-26E show various views of an edge coupler following completion of a number of processions steps, in accordance with one embodiment of the present invention.
Figure 26B:
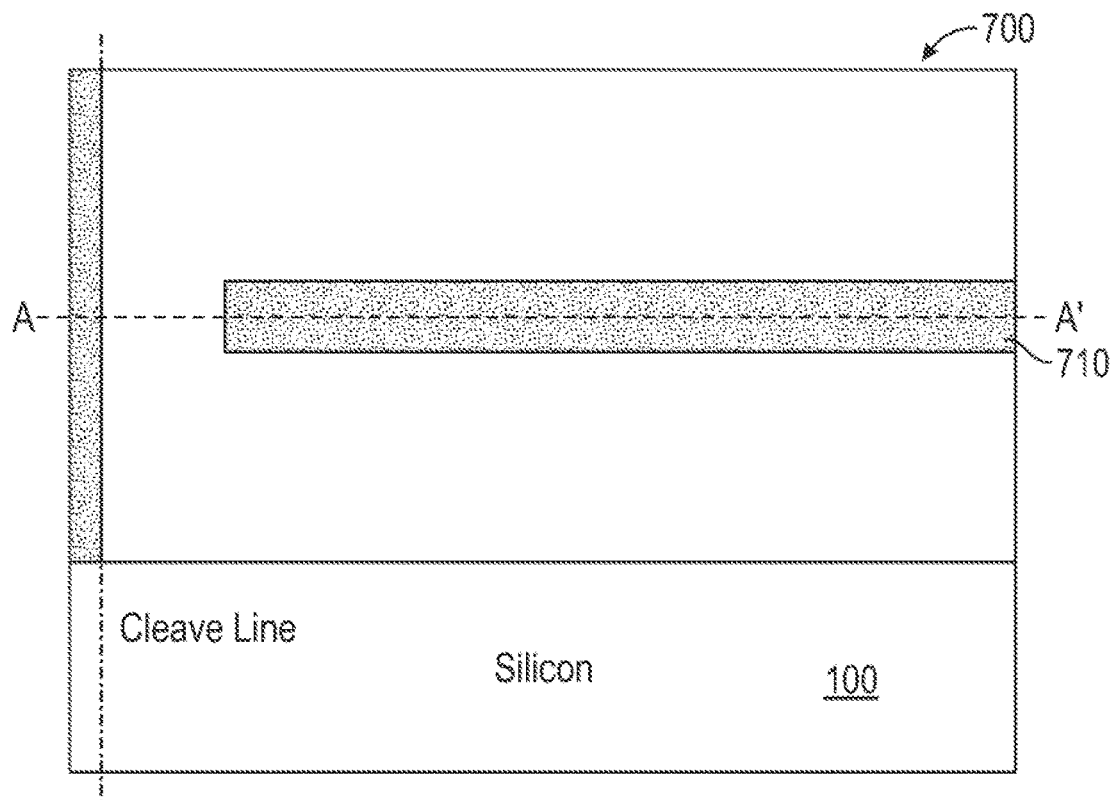

FIG. 26A is a first cross sectional view of an edge coupler 700, in accordance with one embodiment of the present invention, prior to a metal etch. Edge coupler 700 is formed in silicon substrate 100, and in this cross-sectional view is shown as including metal-filled vias 702, 704, 706, 708, metal layers 720, 722 and dielectric 710. The various steps performed in forming edge coupler 700 are similar to those described above with reference to FIGS. 4A-4I. Edge coupler 700 is also shown as including a relatively narrows strip of dielectric 710 extending from the top surface to the silicon substrate defining the cleave line. FIG. 26B is the same view of edge coupler 700 as that shown in FIG. 26A after a metal etch. It is seen that following the etching step, all metal and metal-filled vias are removed.

Figure 26C:
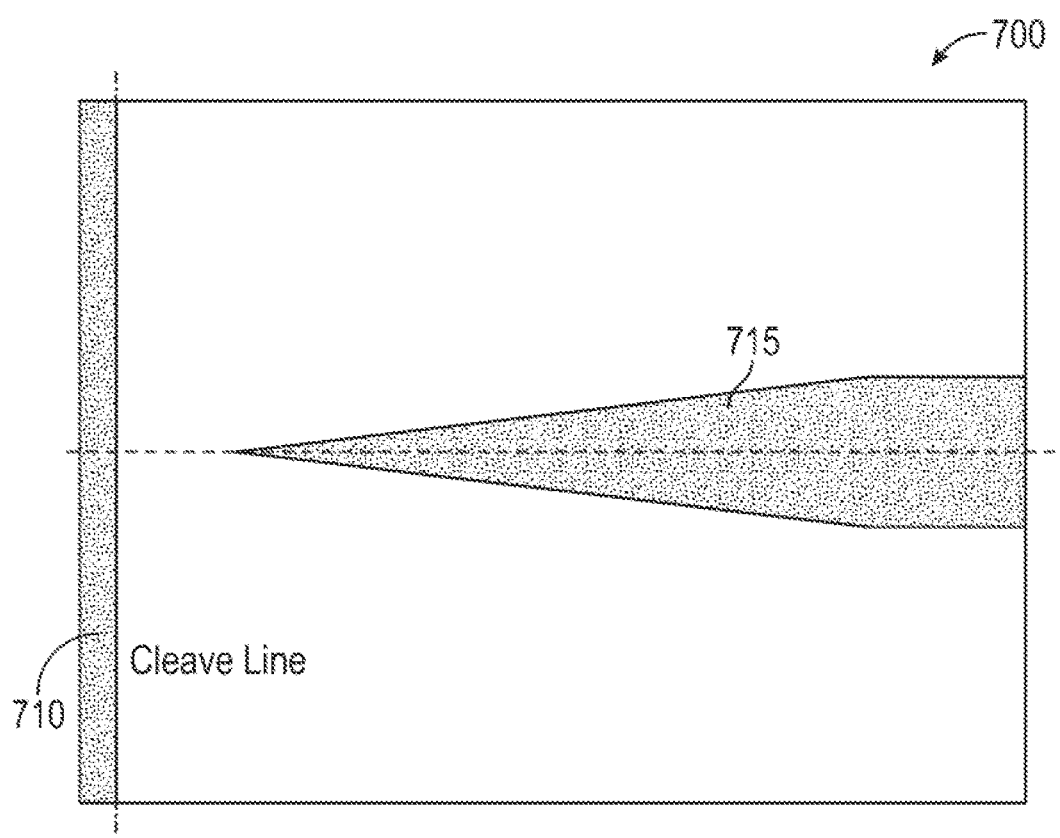
Figure 26D:
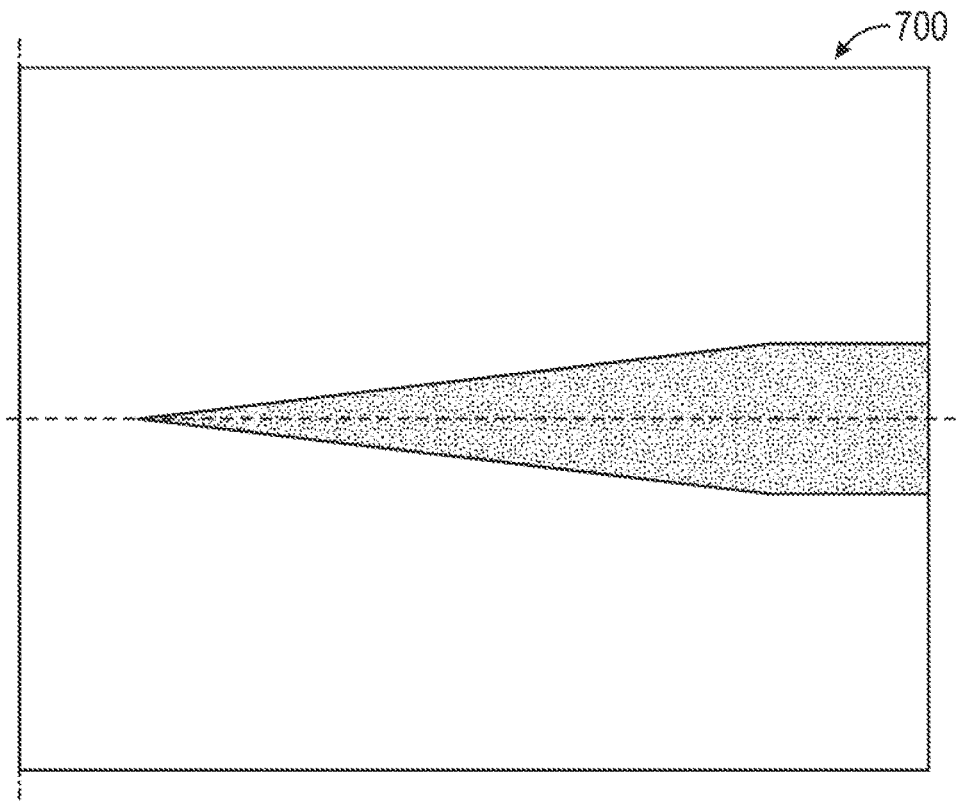
Figure 26E:
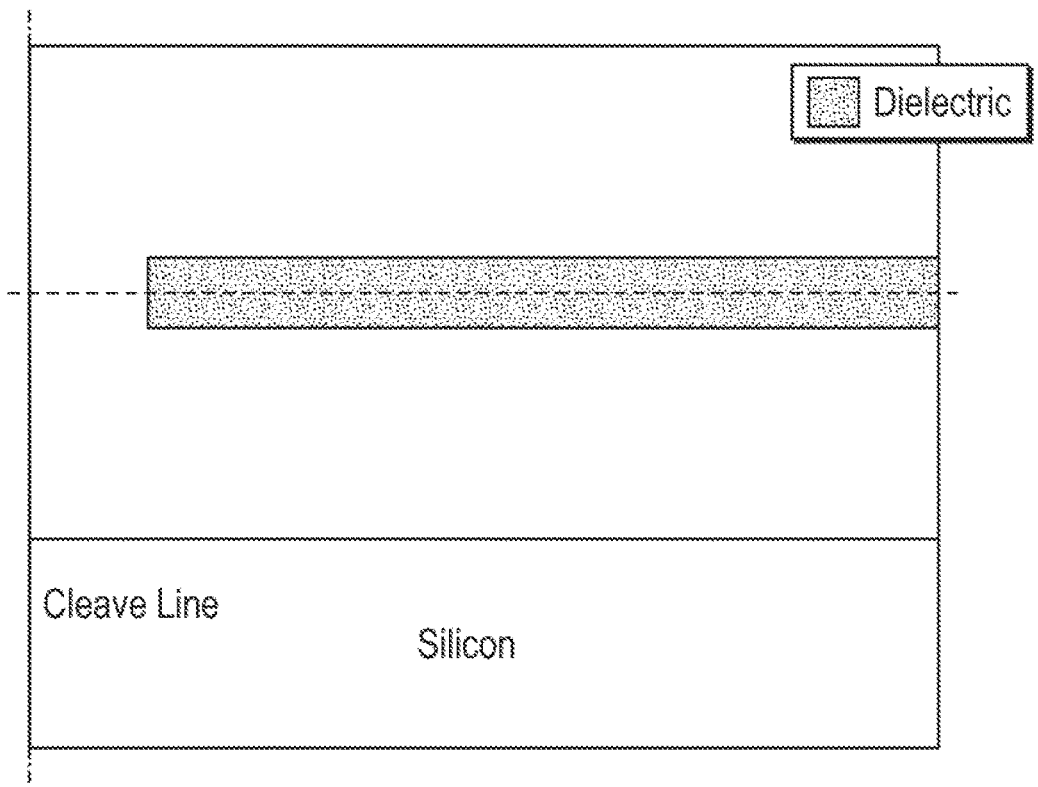

FIG. 26C is a view from the top when edge coupler 700 of FIG. 26B is cut along lines AA'. Tapered waveguide 715 is shown as having been formed in dielectric 710. FIG. 26D shows the edge coupler of FIG. 26C after the dielectric 710 defining the cleave line has been cleaved. FIG. 26E shows the edge coupler of FIG. 26B after the dielectric 710 defining the cleave line has been cleaved.

Figure 27:
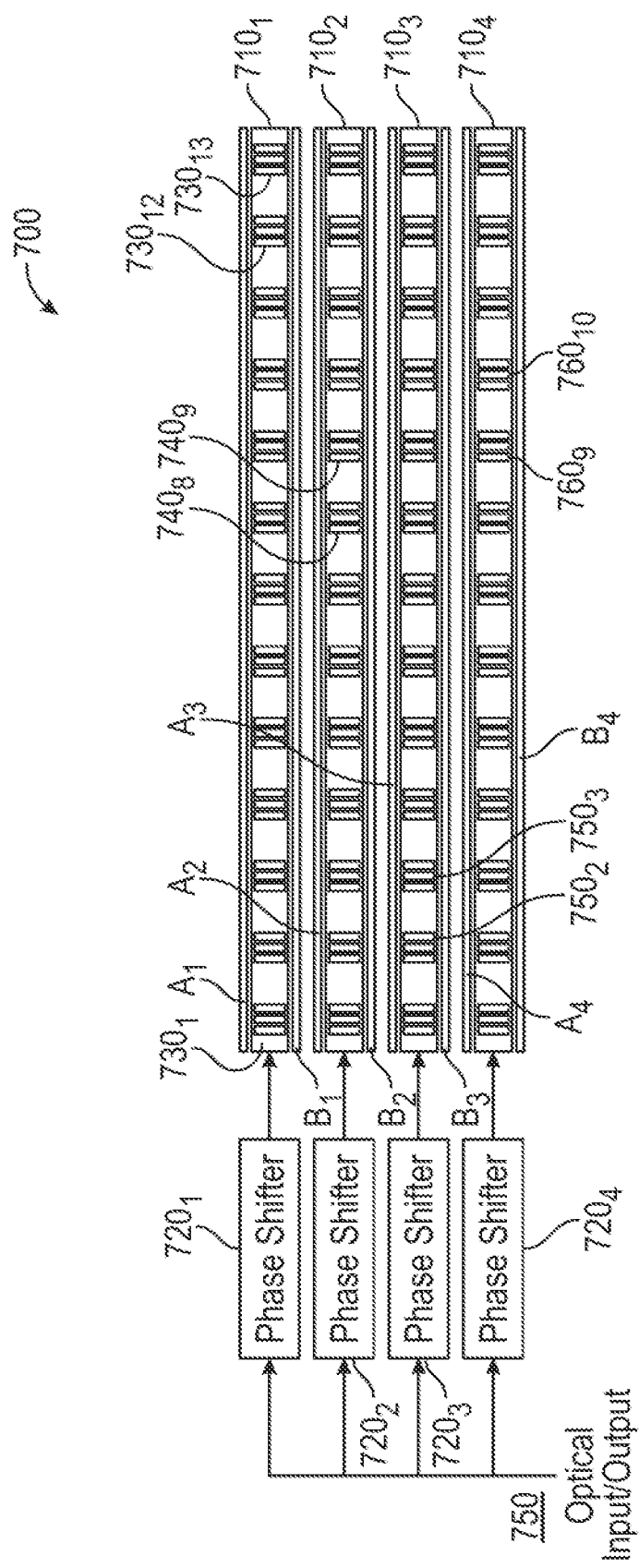
FIG. 27 is a schematic diagram of a phased array formed, in part, using photonic and/or electro-optical devices fabricated in accordance with various embodiments of the present invention.

FIG. 27 is a simplified schematic view of a phased array 700 formed, in part, using photonic devices described herein. Phased array 700 is shown as having four exemplary arrays $710_1$, $710_2$, $710_3$, $710_4$. Each such array is shown as including 13 radiating elements. For example, row $710_1$ is shown as having radiating elements $730_1$, $730_2$ ... $730_{13}$. Similarly, row $710_4$ is shown as having radiating elements $760_1$, $760_2$ ... $760_{13}$. Each radiating element $730_i$, $740_i$, $750_i$, $760_i$, where i is an index ranging from 1 to 13 in this exemplary embodiment may be a grating coupler as described above. Associated with each row is a phase shifter $720_j$ where j is an index ranging from 1 to 4 in this exemplary embodiment. Each phase shifter $720_j$ is adapted to change the phase of the signal received from optical signal carrying medium 750 and deliver the phase shifted signal to the associated radiating elements. For example, phase shifter $720_1$ is adapted to change the phase of the received optical signal and deliver it to the radiating elements $730_i$ disposed in row $710_1$.

Each row of phase shifters includes a pair of electrodes adapted to change the relative phases of the optical signals delivered to the radiating elements disposed in that row. For example, by changing the voltage between electrodes $A_1$ and $B_1$ associated with row $710_1$, the phase difference between each pair of adjacent radiating elements, such as radiating elements $730_{12}$ and $730_{13}$ may be changed. Accordingly by controlling the phases of the phase shifters $720_j$ and further by changing the voltage across electrodes $A_1/B_1$, $A_2/B_2$, $A_3/B_3$, and $A_4/B_4$, the relative phases of the exemplary 52 radiating elements of the phased array 700 may be changed to steer the optical signal in a desired direction. The phase shifters and the radiating elements (e.g., grating couplers) may be formed using the techniques described herein.

Various photonic devices and systems may be fabricated in accordance with embodiments of the present invention and in a manner similar to those described above. Such structures include, but are not limited to waveguides, photonic crystal waveguides, grating couplers, edge couplers, layer-to-layer adiabatic transitions, phased arrays, thermal and electro-optic modulators, ring resonators, meta-surfaces, meta-materials, photonic and electro-photonic sensors, and Mach-Zehnder interferometers. Such structures may be suspended through the use of specially designed supports, which mechanically support the structure by providing a connection to the surrounding dielectric. Additional structures may be fabricated that use metal layers in conjunction with the dielectric layers to guide light, which include, but are not limited to, plasmonic structures and devices.

For example, as described above, a waveguide may be formed on a given layer in the manufacturing process by excluding metal from a particular region on said layer, while surrounding that region with metal for an appropriate distance. The region excluded from metal deposition is the waveguide. On surrounding layers above and below, metal is deposited over the waveguide region, as well as over the metal adjacent to the waveguide in the waveguide layer. In one exemplary embodiment, a rib waveguide is formed by excluding an entire layer from metal deposition, and by excluding a narrow region in the layer above. In one exemplary embodiment, a channel waveguide is formed by excluding only a narrow region on one layer from metal deposition.

Additional regions in the waveguide layer may be excluded from the metal deposition such that the excluded region designated to be the waveguide is connected with regions of dielectric outside the areas of metal deposition. Such additional regions that are excluded from metal deposition are designed to support the structures. Support structures may include, but are not limited to, horizontal supports, vertical supports, or a combination thereof.

In some embodiments, as described above, structures are included along the edges of the waveguide to facilitate the flow of etchants into and out of the metal regions. Such structures, referred to herein as stanchions, are created by forming metal on all the layers, with the metal on each layer being shaped in such a way as to enable the etchant to easily flow from the top of the chip, through the whole stanchion, and into surrounding structures.

As described above, in one embodiment, a grating coupler is formed on one or more layers of the manufacturing process by excluding metal in such a way as to create a specific periodic arrangement of structures designed to couple light onto and off of the grating coupler. Such regions of exclusion may be surrounded by regions of metal of such a width that is suitable for etching the metal and for confining the light inside the grating coupler. On surrounding layers above and below, metal is deposited over the periodic structure and waveguide regions, as well as over the metal adjacent to the periodic structure and waveguide in the waveguide layer. The grating coupler may include an adiabatic transition waveguide structure for guiding the coupled light from the periodic structure and into a waveguide.

In one embodiment, an edge coupler is formed on a particular layer in the manufacturing process by excluding metal in such a way as to create an adiabatic taper of dielectric. The adiabatic taper is surrounded by metal on the same layer such that it is suitable for etching the metal and for confining light inside the dielectric structure. On surrounding layers above and below, metal is deposited over the adiabatic taper, as well as over the metal adjacent to the adiabatic taper. In one embodiment, such a structure couples light from or to the environment outside the chip by matching the mode of a single mode fiber to a waveguide structure inside the chip.

In one embodiment, a layer-to-layer transition is created on two particular layers in the manufacturing process by excluding metal in such a way as to create an adiabatic taper of dielectric on one layer, which is complemented by an adiabatic taper of dielectric on the other layer, such that as one waveguide taper is decreasing in width the other is increasing in width. In such an arrangement the propagating light will couple from the first layer to the second layer through the gradual change in waveguide geometry.

In one embodiment, an optical phased array is formed on one or more layers of a manufacturing process by excluding metal in such a way as to create radiating elements. The radiating elements are surrounded by metal on the same layer in a manner suitable for etching the metal and for confining light inside the radiating elements. On surrounding layers above and below, metal is deposited over the radiating elements, as well as over the metal adjacent to the radiating elements. In one embodiment, light is delivered to the radiating elements through waveguides as described above. In one embodiment, the radiating elements are grating couplers as described above. In one embodiment, the radiating elements are edge couplers as described above. In one embodiment, the radiating elements are nanophotonic antennas designed to convert guided modes to free space modes and vice versa.

In one embodiment, optical phase modulators are formed using metallic lines as resistors adjacent to the optical waveguide, which may be formed by etching the surrounding metal layers that are different from the resistors. In one embodiment, optical phase modulators are formed by depositing an electro-optic material with second or third order nonlinearity, thereby surrounding the optical waveguide with nonlinear material, and subsequently tuning the phase by applying an electric field across the waveguide. In one embodiment, conductive material transparent in the frequency spectrum of operation—such as ITO—may be used for carrier injection based phase and amplitude modulators.

In one embodiment, amplitude modulators are formed by depositing materials with metal-to-insulator (MIT) behavior such as vanadium dioxide.

In one embodiment, a Mach Zehnder modulator is formed on a particular layer in the manufacturing process by excluding metal in such a way as to create a waveguide that splits into two waveguides which recombine into a single waveguide. Assume each of the two waveguides is referred to as the "arms" of the modulator. A phase modulator may be fabricated in one arm or the other or both to form the Mach Zehnder modulator.

In one embodiment, a photodetector is formed using a silicon layer in the process. In one embodiment the silicon layer in the base wafer is used to form a photodetector. In one embodiment the photodetector is formed by doping a silicon layer with a p-doped region, an n-doped region, and/or an intrinsic region between the two doped regions. Metal lines making contact to the doped regions connect an electronic circuit to facilitate the detection of light in the silicon. The electronic circuit may include, but is not limited to, a transimpedance amplifier driving an analog to digital converter, which, in turn, may drive a digital signal processing circuit.

In one embodiment, a plasmonic structure is created through the design process described above. In one embodiment, metal is excluded in such a way as to create an interface between metal and dielectric structures in order to facilitate the propagation of surface plasmon polaritons or the excitation of localized surface plasmons. In one embodiment, meta-materials or meta-surfaces are created on one or more layers in the manufacturing process through the design process described above.

As described above, embodiments of the present invention may be formed using a CMOS process. Using a CMOS process, photonic devices may be powered, controlled, and sensed through analog or digital electronic circuits, resulting in devices such as hybrid electronic-photonic phased arrays, thermal and electro-optic modulators, Mach-Zehnder interferometers, and photodetectors. In addition, digital electronic circuits may be used to process input and output signals and provide general computational power on the same chip as the photonic structures. Moreover, the detected light by photodetectors may be further processed by the electronics.

In one embodiment, optical phase modulators are formed using metallic lines as resistors adjacent to the optical waveguide formed by etching the surrounding metal layers. An electronic digital-to-analog converter circuit may be used to control the current passing through the resistor in order to control how much the waveguide heats up or cools down. In one embodiment, another or the same resistor may be used to sense the temperature. In one embodiment an electronic control circuit is used to regulate the heat of the waveguide. In one embodiment, optical phase modulators are created by depositing electro-optic material with second order nonlinearity surrounding the optical waveguide and tuning the phase by applying an electrical field across the waveguide. An electronic digital to analog-converter-circuit may be used to control the voltage across the waveguide in order to control the amount of the modulation.

In one embodiment, photodetectors are formed in a SiGe semiconductor manufacturing process such that some photodetectors use silicon to detect visible light and other photodetectors use germanium to detect infrared light. In one embodiment, the photodetectors drive the electronic circuits used to amplify and process the received optical signal. Such circuits may include, but are not limited to, a transimpedance amplifier immediately following the photodetector. The photodetector may drive an analog-to-digital converter, which, in turn, may drive a digital signal processing circuit.

The above embodiments of the present invention are illustrative and not limitative. Embodiments of the present invention are not limited by the type of semiconductor substrate, dielectric, metal, and the like. Embodiments of the present invention are not limited by the number of metal layers, vias, or the metal etchant. Embodiments of the present invention are not limited by the geometrical shape of the dielectric following the metal etch, nor are they limited by the position of the metal layer on the exterior surface of the structure that enables the etchant to remove the metal. Other modifications and variations will be apparent to those skilled in the art and are intended to fall within the scope of the appended claims.

What is claimed is:

1. A method of fabricating a photonic device, the method comprising:

forming a plurality of metal layers, and dielectric layers over a semiconductor substrate to form a structure, wherein said plurality of metal layers form a continuous metal trace characterizing an etch channel, wherein at least one of the metal layers extends towards an exterior surface of the structure; and subjecting the structure to a metal etchant thereby enabling the etchant to etch the metal from the exterior surface of the structure and flow through the etch channel to etch the plurality of metal layers, wherein the dielectric remaining after the etch defines the photonic device.

2. The method of claim 1 wherein the dielectric defining the photonic device comprises:

first and second dielectric walls extending along a length of the photonic device; and a plurality of dielectric ribs each having a first width and each connecting the first dielectric wall to the second dielectric wall at a different location along the length of the photonic device, wherein a center region of each rib has a second width that is greater than the first width.

3. The method of claim 1 further comprising:

disposing one or more materials in the openings defined by the etch channel formed as a result of the metal etch.

4. The method of claim 1 wherein the dielectric defining the photonic device comprises a plurality of diffraction grating rulers.

5. The method of claim 4 wherein a width and a height of each ruler is selected in accordance with a wavelength of an optical signal propagating through the photonic device.

6. The method of claim 5 wherein a spacing between each pair of adjacent rulers is selected in accordance with the wavelength of the optical signal.

7. The method of claim 1 wherein the dielectric defining the photonic device comprises:

a first waveguide tapered along a first direction; and a second waveguide tapered along a second direction opposite the first direction, wherein an optical signal propagating through the first waveguide couples to the second waveguide.

8. The method of claim 1 wherein the dielectric defining the photonic device is formed directly above a doped region of the semiconductor substrate, said dielectric further comprising:

a first waveguide; and a second waveguide, wherein an optical signal propagating through the first waveguide is received by the doped region of the semiconductor substrate via the second waveguide.

9. The method of claim 1 further comprising:

forming a first electrode over a first portion of the dielectric; and forming a second electrode over a second portion of the dielectric, wherein by controlling a difference between the voltages of the first and second electrodes a phase of the optical signal propagating through the dielectric is changed.

10. The method of claim 1 wherein the dielectric defining the photonic device comprises a waveguide and a cleave line.

11. The method of claim 1 wherein said exterior surface is an upper surface.

12. The method of claim 1 wherein said exterior surface is a side surface.

13. The method of claim 1 wherein said etchant is a liquid etchant.

14. The method of claim 1 wherein said etchant is a gas etchant.

15. The method of claim 1 wherein said etchant is a plasma etchant.

16. The method of claim 1 wherein said substrate is a silicon substrate.

17. The method of claim 1 wherein said photonic device is disposed in a phased array.

18. The method of claim 1 wherein said photonic device is disposed in a CMOS image sensor.

19. The method of claim 4 wherein a width and a height of each ruler is selected in accordance with a desired angle of free space coupling.

20. The method of claim 19 wherein a spacing between each pair of adjacent rulers is selected in accordance with a desired angle of free space coupling.

* * * * *